United States Patent
Marino et al.

(10) Patent No.: US 9,401,436 B2
(45) Date of Patent: *Jul. 26, 2016

(54) MULTIPLE CONTROL TRANSCAP VARIABLE CAPACITOR

(71) Applicants: Fabio Alessio Marino, Poway, CA (US); Paolo Menegoli, San Jose, CA (US)

(72) Inventors: Fabio Alessio Marino, Poway, CA (US); Paolo Menegoli, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/664,878

(22) Filed: Mar. 22, 2015

(65) Prior Publication Data

US 2015/0194538 A1 Jul. 9, 2015

Related U.S. Application Data

(63) Continuation-in-part of application No. 14/456,184, filed on Aug. 11, 2014, now Pat. No. 9,214,512, which is a continuation-in-part of application No. 13/888,368, filed on May 7, 2013, now Pat. No.

(Continued)

(51) Int. Cl.
*H01L 29/94* (2006.01)
*H01L 27/08* (2006.01)

(Continued)

(52) U.S. Cl.
CPC ............... *H01L 29/94* (2013.01); *H01G 7/06* (2013.01); *H01L 27/0805* (2013.01); *H01L 29/93* (2013.01); *H01L 29/7391* (2013.01)

(58) Field of Classification Search
USPC ........................................................ 257/602
See application file for complete search history.

(56) References Cited

U.S. PATENT DOCUMENTS 3,829,743 A 8/1974 Kohashi
4,663,644 A 5/1987 Shimizu
(Continued)

FOREIGN PATENT DOCUMENTS

| EP | 1553636 A1 | 7/2005 |
| RU | 2117360 C1 | 8/1998 |
| WO | 03096434 A1 | 11/2003 |

OTHER PUBLICATIONS

International Search Report and Written Opinion—PCT/US2014/042663—ISAEPO—Dec. 11, 2014.

(Continued)

*Primary Examiner* — Thao P Le

(57) ABSTRACT

A novel semiconductor variable capacitor is presented. The semiconductor structure is simple and is based on a semiconductor variable MOS capacitor structure suitable for integrated circuits, which has at least three terminals, one of which is used to modulate the equivalent capacitor area of the MOS structure by increasing or decreasing its DC voltage with respect to another terminal of the device, in order to change the capacitance over a wide ranges of values. Furthermore, the present invention decouples the AC signal and the DC control voltage minimizing the distortion and increasing the performance of the device, such as its control characteristic. The present invention is simple and only slightly dependent on the variations due to the fabrication process. It exhibits a high value of capacitance density and, if opportunely implemented, shows a quasi linear dependence of the capacitance value with respect to the voltage of its control terminal.

23 Claims, 32 Drawing Sheets

Related U.S. Application Data 8,803,288, which is a continuation-in-part of application No. 13/068,161, filed on May 5, 2011, now Pat. No. 8,498,094.

(60) Provisional application No. 61/644,070, filed on May 8, 2012, provisional application No. 61/709,907, filed on Oct. 4, 2012, provisional application No. 61/772,461, filed on Mar. 4, 2013, provisional application No. 61/974,951, filed on Apr. 3, 2014.

(51) Int. Cl.
   *H01G 7/06* (2006.01)
   *H01L 29/93* (2006.01)
   *H01L 29/739* (2006.01)

(56) References Cited

U.S. PATENT DOCUMENTS

| | | | |
|---|---|---|---|
| 5,311,050 A | 5/1994 | Nitayama et al. | |
| 5,918,115 A | 6/1999 | Kikuchi et al. | |
| 5,982,608 A * | 11/1999 | Kalnitsky et al. | 361/288 |
| 6,114,725 A | 9/2000 | Furukawa et al. | |
| 6,228,696 B1 | 5/2001 | Nguyen et al. | |
| 6,407,412 B1 * | 6/2002 | Iniewski et al. | 257/107 |
| 6,818,937 B2 | 11/2004 | Noble et al. | |
| 7,183,867 B2 | 2/2007 | Matsuura et al. | |
| 7,247,908 B2 | 7/2007 | Anderson et al. | |
| 7,247,918 B2 * | 7/2007 | Tateyama | 257/401 |
| 7,344,943 B2 | 3/2008 | Herrick et al. | |
| 7,375,948 B2 | 5/2008 | Higgins | |
| 7,403,140 B2 | 7/2008 | Miyagi et al. | |
| 7,439,583 B2 | 10/2008 | Hshieh | |
| 7,440,254 B2 | 10/2008 | Gallant et al. | |
| 7,622,760 B2 | 11/2009 | Ogawa et al. | |
| 7,642,162 B2 | 1/2010 | Matsuo | |
| 7,670,911 B2 | 3/2010 | Oyu | |
| 7,977,736 B2 | 7/2011 | Kim et al. | |
| 8,110,872 B2 | 2/2012 | Fujimoto | |
| 8,234,417 B2 | 7/2012 | Kottomtharayil et al. | |
| 8,310,002 B2 | 11/2012 | Fujimoto | |
| 8,373,208 B2 | 2/2013 | Bobde et al. | |
| 8,497,548 B2 | 7/2013 | Masuoka et al. | |
| 8,498,094 B2 | 7/2013 | Marino et al. | |
| 8,531,010 B2 | 9/2013 | Oyu et al. | |
| 8,803,288 B1 * | 8/2014 | Marino et al. | 257/602 |
| 8,896,056 B2 | 11/2014 | Masuoka et al. | |
| 8,963,289 B2 | 2/2015 | Marino et al. | |
| 9,214,512 B2 | 12/2015 | Marino et al. | |
| 2003/0067026 A1 | 4/2003 | Bulucea | |
| 2004/0046600 A1 | 3/2004 | Fujimoto et al. | |
| 2004/0201045 A1 | 10/2004 | Kurosawa et al. | |
| 2004/0262681 A1 | 12/2004 | Masuoka et al. | |
| 2004/0263269 A1 | 12/2004 | Takamatsu | |
| 2005/0093000 A1 | 5/2005 | Tanimoto et al. | |
| 2007/0120200 A1 | 5/2007 | Yun | |
| 2008/0157159 A1 | 7/2008 | Hook et al. | |
| 2008/0315300 A1 | 12/2008 | Higashino | |
| 2009/0091380 A1 | 4/2009 | Min et al. | |
| 2010/0181614 A1 | 7/2010 | Nojima | |
| 2010/0314671 A1 | 12/2010 | Oyu et al. | |
| 2012/0139020 A1 | 6/2012 | Chen et al. | |
| 2012/0168819 A1 | 7/2012 | Marino et al. | |

OTHER PUBLICATIONS

Shen K., et al., "A Three-Terminal SOI Gated Varactor for RF Applications," IEEE Transactions On Electron Devices, IEEE service center. Pisacataway. NJ. US. vol. 48. No. 2. Feb. 1, 2001. XP011017513. ISSN: 0018-9383.

Wong W., et al., "Wide Tuning Range Inversion-mode Gated Varactor and its Application on a 2-GHz VCO," VLSI Circuits, 1999. Digest of Technical Papers. 1999 Symposium on. IEEE. Jun. 17, 1999. pp. 53-54. XP032396883. DOI: 10.1109/VLSIC.1999.797233 ISBN: 978-4-930813-95-4.

* cited by examiner

US 9,401,436 B2

MULTIPLE CONTROL TRANSCAP VARIABLE CAPACITOR

RELATED APPLICATION DATA

The present application is a continuation in part of the regular patent application U.S. Ser. No. 14/456,184 entitled "Three Terminal Variable Capacitor", filed by the same applicants on Aug. 11, 2014. Furthermore, the present application claims priority also from the U.S. Provisional Patent Application U.S. 61/974,951 entitled "Variable Capacitor Circuit Applications", filed by the same applicants on Apr. 3, 2014. Patent application U.S. Ser. No. 14/456,184 is a continuation in part of the regular patent application U.S. Ser. No. 13/888,368 entitled "Analog Transcap Device" (now patent U.S. Pat. No. 8,803,288), filed by the same applicants on May 7, 2013. Patent application U.S. Ser. No. 13/888,368 is a continuation in part of the regular patent application U.S. Ser. No. 13/068,161 entitled "Semiconductor Variable Capacitor" (now patent U.S. Pat. No. 8,498,094), filed on May 5, 2011. Furthermore, U.S. Ser. No. 13/888,368 claims priority also from the following U.S. Provisional Patent applications: U.S. 61/644,070 for "Semiconductor controllable capacitor" filed on May 8, 2012, U.S. 61/709,907 for "Transcap Semiconductor variable capacitor" filed on Oct. 4, 2012, U.S. 61/772,461 for "Variable Capacitor Circuit Applications" filed on Mar. 4, 2013.

BACKGROUND OF THE INVENTION

1. Field of the Invention

The present invention is in the field of semiconductor structures. The present invention is further in the field of semiconductor structures of variable capacitance devices. Particularly, it relates to a MOS type variable capacitance device for semiconductor circuits. The implementation is not limited to a specific technology, and applies to either the invention as an individual component or to inclusion of the present invention within larger systems which may be combined into larger integrated circuits.

2. Brief Description of Related Art

Semiconductor capacitors are fundamental components for integrated circuits. A variable capacitor is a capacitor whose capacitance may be intentionally and repeatedly changed under the influence of DC bias voltages. Variable capacitors are often used in L-C circuits to set the resonance frequency, e.g. to tune a radio (therefore they are sometimes called tuning capacitors), or as a variable reactance, e.g. for impedance matching in antenna tuners.

A voltage-controlled capacitor is well known in the art as "varactor", in which the thickness of a depletion region formed in a pn-junction diode is varied by changing a reverse bias voltage to alter the junction transition capacitance. Any junction diode exhibits this effect (including pn-junctions in transistors), but devices used as variable capacitance diodes are designed with a large junction area and a doping profile specifically chosen to maximize capacitance.

Their use is limited to low signal amplitudes to avoid obvious distortion as the capacitance would be affected by the change of signal voltage, precluding their use in the input stages of high-quality RF communications receivers, where they would add unacceptable levels of inter-modulation distortion. At VHF/UHF frequencies, e.g. in FM Radio or TV tuners, dynamic range is limited by noise rather than large signal handling requirements, and varcaps are commonly used in the signal path. Furthermore an extremely high value of capacitance cannot be obtained even with a reverse bias because the reverse-biased saturation current is not exactly equal to zero.

Varcaps are used for frequency modulation of oscillators, and as reported in Miyagi et al. (U.S. Pat. No. 7,403,140) to make high-frequency voltage controlled oscillators (VCOs), the core component in phase-locked loop (PLL) frequency synthesizers that are ubiquitous in modern communications equipment. Varacaps (or varactors) are also intended for antenna impedance matching in multi-band GSM/WCDMA cellular handsets and mobile TV receivers that must operate over wide frequency ranges such as the European DVB-H and Japanese ISDB-T mobile TV systems.

Several prior art attempts to improve varactors performance, so as to effectively obtain high capacitance density and a linear dependence of the capacitance value over a wide range of control voltages, have been documented. In particular, an interesting solution is reported in Ogawa et al. (U.S. Pat. No. 7,622,760) where the synthesis of two MOS capacitor is used to obtain a good linearity over a wide range relative to the DC control voltage. However, the prior art described above discloses a varactor that is still a two terminal device, and its capacitance is varied imposing a DC voltage between its two terminals. This leads to the disadvantage that the AC voltage is superimposed upon the DC control value, and therefore the capacitance value is distorted by the AC voltage.

There is therefore a need of a novel variable capacitor with at least three terminals, where at least one control terminal separated from the capacitance terminals is added. The novel structure should allow the control of the capacitance without overlapping the DC control voltage with the AC signal preventing the distortion of the capacitance value during the circuit operation. This device, differently from the prior art described above, should use the voltage of the control terminal to modulate the area of one of the capacitor plates of a MOS capacitance rather than the distance between the two equivalent electrodes of a pn-junction capacitor.

A similar approach, where a three terminal MOS varactor is used, is disclosed in Kohashi (U.S. Pat. No. 3,829,743). In this patent the author describes a variable capacitance device having a thin film of dielectric material and in which the area of an equivalent plate electrode is varied by changing the voltage of the control terminal or under the influence of radiations.

Referring to the drawings in Kohashi and more particularly to FIG. 1 and FIG. 2 of the document, the variable capacitance device comprises a pn-junction diode placed directly above the dielectric film and a source of DC voltage. A lead wire made of gold or aluminum is placed in ohmic contact with an end surface of each of the p and n regions. One lead is connected to the movable contact of a double-throw switch. The double-throw switch has two fixed contacts connected to two batteries, which in turn are connected together to the other lead placed in electrical contact with the n region.

As shown, a thin film of high-insulation, low-dielectric-loss dielectric material is deposited on the side surface of the diode perpendicular to the junction. The described device uses the voltage between the n and the p regions of the pn-junction to modulate the depletion region above the oxide in order to change the overlap surface between the p and n regions with the metal plate under the oxide layer. FIG. 3 of the cited patent shows the structure resulting by the parallel of two structures as presented in FIG. 1.

The described structures can be used only for discrete components. As underlined by the author himself in the patent, they are not suitable for integrated circuits. The integrated version of the structure shown in FIG. 1 is reported in FIG. 4. In this case, as in the previous one, both the depletion regions in the p and n regions are used to modulate the capacitance, which lead to a difficult control of the device performance and capacitance-voltage relation (the process variations of the p-region sum up with the one of the N region and to the variability on the position of the pn-junction).

Furthermore, in all these structures, the DC voltage is applied between one terminal of the capacitance and a region directly in contact with the capacitance dielectric layer overlapping the metal terminal 27 in FIG. 1 (or 45 in FIG. 3), causing a distortion of the capacitance value due to the modulation of the MOS capacitance. Varying the DC voltage between the p and n regions, also the DC voltage drop between one of these two regions and the metal terminal changes, and that causes an enhancement or depletion of the semiconductor surface affecting the capacitance value.

The last structure of interest disclosed in Kohashi is the one illustrated in FIG. 14 of the document. In this case the variable capacitance is the resulting synthesis of the series of the capacitances of the pn-junctions and a MOS structure. The capacitance terminals 190 and 193 are coupled through a p+/n junction and the MOS capacitance. In this case the resulting capacitance and its range of variation are therefore very low. Furthermore, in this configuration the capacitance depends also on the thickness of the depletion regions of the two p+/n junction as in conventional diode based varactors, leading to a high distortion of the capacitance value. Finally, it is important to notice that none of the structures described in Kohashi has a linear relation between the control voltage and the capacitance value.

The present invention is simple and much less sensitive to process variations with respect the structures described above. It is suitable for integrated circuits and presents a high capacitance density value and high linearity. If appropriately designed, the present invention exhibits a quasi-linear dependence of the capacitance over a wide range of control voltage values. All these characteristics are extremely important for the practical implementation of the present invention and clearly distinguish the present invention from the varactors devices used nowadays in the integrated-electronic industry.

It is a purpose of the present invention to describe a novel structure of a semiconductor variable capacitor suitable for integrated circuits with at least three terminals, simple and slightly sensible to process variations, which offers the advantage of much higher capacitance per unit area, wider control ranges, high Q and low distortion of the RF signal applied to the capacitor.

SUMMARY OF THE INVENTION

The present invention describes a MOS based semiconductor variable capacitor structure, named transcap, suitable for integrated circuits, which has at least three terminals, one of which is used to modulate the equivalent capacitor area of the MOS structure by increasing or decreasing its DC voltage with respect to another terminal of the device, in order to change the capacitance over a wide range of values. Furthermore, the present invention decouples the AC signal and the DC control voltage preventing distortion and increasing the performance of the device. The present invention is simple and only slightly dependent on the variations related to the fabrication process.

The main concept of the present invention stems from a three terminals semiconductor variable capacitor as described in the regular patent applications U.S. Ser. No. 14/456,184 entitled "Three Terminal Variable Capacitor", filed by the same applicants on Aug. 11, 2014, U.S. Ser. No. 13/888,368 entitled "Analog Transcap Device", filed on Jul. 5, 2013, and U.S. Ser. No. 13/068,161 entitled "Semiconductor Variable Capacitor", filed on May 5, 2011.

The most important parameters of a variable capacitor are: i) the capacitance density, ii) the linearity of the device, iii) the tuning range, defined as the ratio between the maximum and the minimum capacitance between the main two terminal of the device (C1 and C2), and iv) the quality factor defined as $$Q=1/(2\pi f^*ESR^*C)$$

where "ESR" and "C" are, respectively, the equivalent series resistance and the capacitance seen between C1 and C2, and "f" is the frequency of the RF signal applied to the device.

An analog transcap device is a semiconductor variable capacitor with three or more terminals, where the capacitance between the two main terminals of the device (C1 and C2) can be varied by changing the DC voltage applied between a control terminal CTRL and one of the other two main terminals (C2). This characteristic allows the decoupling of the AC signal from the DC control voltage preventing distortion and increasing the performance of the device. A transcap device can be implemented with several semiconductor structures, each one of them has advantages and disadvantages as discussed in the following.

The simplest structure of an analog transcap device is illustrated in FIG. 1, where the basic operation principle of the device is shown as well. In this case a DC voltage is applied between the control terminal CTRL 4 and the C2 terminal 9 in order to modulate the capacitance between C1 and C2.

As it can be seen in FIG. 1, the structure of a transcap device is very simple and is obtained from the one of a MOS capacitor by adding the following modifications: i) a n+ implantation 8 and a p+ implantation 5 are formed on the two sides of the MOS structure in order to create a pn junction to modulate the surface area of the semiconductor capacitance plate underneath the oxide 3, ii) the capacitor oxide 3 is preferably thicker than what is usually employed in MOS capacitors in order to minimize the modulation of the carrier population at the semiconductor-oxide interface by the RF signal applied between C1 and C2, iii) it is preferable to have the highly doped implantations not auto-aligned with the MOS structure (especially the n+ region 8) in order to minimize the parasitic capacitance associated with the control region 5 and improve the isolation of the n+ region 8 for high control voltages, iv) the work function of region 2 above the oxide 3 is chosen to maximize the device performance (e.g. by utilizing a n-doped poly-silicon material instead of a p-doped one, even if the semiconductor region 10 underneath the oxide is doped with n-type impurities, or by utilizing a metallic material (also doped if desired) with an opportune work-function or a multi-layer stack of different metallic materials so as to obtain the desired work-function)—if desired, it is also possible to divide region 2 in two sub-regions, one n-doped and one p-doped, or to use a different metallic material for each sub-region, v) region 7 is properly chosen in order to maximize the device performance (e.g. this can be an insulator, a semi-insulator or an intrinsic/near-intrinsic semiconductor in order to decrease the parasitic capacitances associated with the substrate or it can be made of n-doped or p-doped semiconductor with an appropriate doping profile in order to maximize the control on the depletion region 6 and/or the device quality factor). Region 7 can be also formed by multiple semiconductor layers or regions doped in different ways (n, p or intrinsic), e.g. obtained with subsequent implantations such as p-well and n-well or it can include buried doped regions (both p- or n-doped, connected to C2 or CTRL) as discussed more in detail in U.S. Ser. No.

14/456,184 and in the following. Furthermore, this region can include semiconductors and/or insulating layers and/or substrates or it can be formed above semiconductors and/or insulating layers or substrates.

In order to better understand the working principle of the device, let's assume that the control terminal 4 is biased with a negative voltage with respect to the C2 terminal 9. Under these bias conditions, the depletion region 6 of the pn junction widens under the dielectric layer 3 reducing the area of the equivalent electrode formed by the n-well, and with it the effective capacitance area and value. Vice-versa, by increasing the control voltage from −5V to zero, as an example, the depletion region 6 of the pn junction is reduced, leading to an increase of the capacitance.

Differently from conventional MOS capacitors and prior art varactors described above, where the capacitance between the two main terminals is defined only by the DC bias applied across the capacitance, in the present invention the capacitance value is determined also by the bias of the third terminal 4 which modulates the depletion region 6 under the dielectric layer 3 increasing or decreasing the equivalent surface of the capacitance between the n region 10 and the C1 terminal 1.

When the control voltage is applied as described in FIG. 1, the capacitance value mainly depends on the depletion region of the n-doped region 10, which is well controllable. This characteristic dramatically reduces the device dependence on the process variations. Furthermore, the variation of the DC voltage of the control terminal 4 does not alter the DC voltage between the two terminals 1 and 9 of the capacitance, allowing for a very good control of the device characteristic.

In general, the heavily doped region n+8 can be partially overlapped with the oxide 3 of the MOS capacitor or it can be formed at a distance $x_{L1}$ from its edge so as to increase the device tuning range and linearity. In the latter case also the voltage withstanding capability of the device is improved since a portion of the RF signal drops between the oxide edge and the n+ region instead of being applied entirely across the oxide layer 3. In high voltage applications for example, the distance between the n+ region 8 and the oxide 3 can be also greater than 1 um. The n-doped region 10 can be formed for example by a drift or dext implantation or it can be realized with an n-well implantation (or any other kind of process technique, including epitaxial growth or deposition techniques). The p+ region 5 can be partially overlapped with the oxide 3 or it can be spaced apart from it by a distance $x_{L2}$ so as to minimize the parasitic capacitance between the C1 and CTRL terminals.

In the structure shown in FIG. 2 several optional regions are present. A drift implantation 11 can be optionally used to regulate the doping concentration between the oxide and the n+ region. Region 11 can be formed directly in the n-doped region 10 or in a p-doped (or intrinsic or n-doped) region 12. An optional p-doped (or intrinsic, or near-intrinsic or n-doped) region 13 can be also added between the p+ region 5 and the n-doped region 10 in order to improve the breakdown voltage of the pn junction, decreasing, at the same time, the parasitic capacitance between the C1 and CTRL terminals. Region 13 can be partially overlapped with the oxide 3 or it can be spaced apart from it so as to maximize the capacitance tuning range.

If realized in SOI technology, it is advisable to choose an active semiconductor layer thickness (and/or manufacturing process) so as the p+ region (or its depletion region for high control voltages) and/or the n+ region is in direct contact with the buried oxide so as to maximize the capacitance characteristic and/or the device performance. However, many configurations are possible including the implementation of the present invention in fully-depleted, partially depleted or high-voltage (where the active semiconductor layer has a thickness usually exceeding 1 um) standard SOI process technologies, where the p+ region and/or the n+ region may or may not be in direct contact with the buried oxide. The p+ and n+ regions can be formed in different ways, including doping implantations (such as source/drain implantations, sink implantations or buried implantations) or directly by growing or depositing a doped material (in a semiconductor trench or on top of a semiconductor layer). FIG. 3 depicts a tridimensional view of a possible implementation of the embodiment of FIG. 2, where two extra optional isolation regions 14 and 15 have also been added on the sides of the device.

In order to increase the isolation of the C2 terminal 9 for high control voltage values, an isolation region (e.g. a Shallow trench isolation or a LOCOS isolation) can be added between the n+ region and the C1 electrode so as to decrease the parasitic coupling between the C1 and C2 terminals. Similarly, an isolation region (e.g. a Shallow trench isolation or a LOCOS isolation) can be added between the p+ control region and the C1 electrode so as to decrease the parasitic coupling between the C1 and CTRL terminals.

For all the embodiments herein described the dual version can also be obtained by reversing all the doping types (p-doped regions are replaced with n-doped ones and vice-versa). However, the dual configurations may exhibit a lower quality factor with respect to the illustrated ones due to the fact that usually p-doped materials exhibit a lower mobility with respect to n-doped semiconductors.

The structures discussed above mainly exploit the horizontal widening of the depletion region to isolate the C2 terminal from C1. Another possibility is to use also the vertical widening of the depletion region as in the structure shown in FIG. 4. In this case, the depletion region of the pn junction in the vertical direction can be used (if desired also in combination with the depletion region of the pn junction in the horizontal direction) to isolate the C2 terminal from C1. FIG. 5 depicts a tridimensional view of a possible implementation of the embodiment of FIG. 4. In the latter two embodiments, the characteristic of the capacitance as a function of the control voltage can be very abrupt (especially if the p+ region is placed further from the C1 oxide). To obtain a more analog behavior of the capacitance variation, the control voltage can be applied to the C2 terminal with respect to both the CTRL and C1 terminals, so as to exploit also the accumulation and/or depletion and/or inversion of the region underneath the oxide to change the capacitance value (if desired, this control configuration can be used for any transcap device). The advantages and disadvantages of this control configuration are discussed more in detail later in this document.

In order to reduce the control voltage required to achieve the maximum tuning range of the device, a second control region can be added to the structure as shown in FIG. 6. It is worth mentioning that the embodiment of FIG. 6 can be also obtained by connecting back-to-back two embodiments resembling the one of FIG. 4. The presence of the second control region allows for the reduction of the voltage required to deplete the semiconductor area under the oxide 32. In this case the n-doped region 37 can be contacted laterally (by placing one or more n+ implantations/regions on at least one side of the illustrated structure, as shown for example in FIG. 7 or 8), or through one or more C2 implantations/regions placed in the third dimension (i.e. in the direction perpendicular to the drawing shown in FIG. 6, as shown for example in FIG. 10 or 11), or directly underneath (by removing region 36 and placing a contact directly on the back of the die where the structure is fabricated). Also in this case (as in all the embodiments herein discussed) each control region can be partially overlapped with the C1 oxide or it can be spaced apart from it so as to maximize the capacitance tuning range. Furthermore, one or more p-doped (or n-doped, or intrinsic or near-intrinsic) regions can be added to the structure so as to increase the breakdown voltage of the pn junctions and/or reduce the parasitic capacitances associated with the control terminals.

If desired, a buried implantation 35 can also be added to the structure in order to further minimize the parasitic resistance associated with the C2 terminal. Also in this case, if desired, the C2 sink implantation/region can be placed laterally (i.e. the n+ sink region is formed on at least one side of the illustrated structure as shown in FIG. 7) or in the third dimension (i.e. in the direction perpendicular to the drawing of FIG. 6). Alternatively, the optional layer 36 can be omitted and the buried n+ layer 35 can be contacted directly at the bottom of the structure (this configuration is very appealing if the transcap device is realized as a discrete component; in this case, the utilized substrate is usually a n-type substrate with a bottom contact placed on the lower side of the wafer).

FIG. 8 shows a tridimensional view of a possible implementation of the embodiment of FIG. 6. In all the herein described embodiments, one or more p+ regions can be replaced with a Schottky contact (formed in a semiconductor trench or directly on top of a semiconductor layer) and/or the n+ region can be replaced with a metal ohmic contact (formed in a semiconductor trench or directly on top of a semiconductor layer). In all the herein described embodiments, p-doped or intrinsic regions or insulating oxide regions can be added to the structure to increase the breakdown voltage of the control terminal and/or to decrease the parasitic capacitance associated with the control region. Similarly, n-doped or intrinsic regions or insulating oxide regions can be added to increase the device tuning range and/or the device withstanding voltage. Furthermore, if desired, the C1 oxide (and the C1 electrode) can be formed in a semiconductor recess.

FIG. 9 shows a variation of the embodiment of FIG. 8, where one of the two control regions has been formed above the semiconductor layer 52 (a similar approach can be used for any of the embodiments herein discussed). The control region 55 can be formed with a metallic material forming a Schottky contact with the n-region underneath or with a doped semiconductor material (with crystalline or poly-crystalline or amorphous structure). Region 51 has been instead extended down to region 53. Alternatively, also region 51 could have been placed above region 52 or it could have been limited to the upper portion of region 52 without being in contact with region 53 (as region 48 in FIG. 8).

The control configuration significantly influences the performance of the Transcap device: the two control regions can be controlled with two different control/bias voltage or through the same voltage; they can be shorted together or they can be biased through two different impedances. Each control region can extend through a portion of the C1 width, or for the entire C1 width as shown in FIG. 8-11, or even further e.g. towards the C2 region as shown in FIG. 12. Many layout variations are also possible for the C2 region. For example the n+ region can extend as shown in FIG. 10 or it can be limited to the C1 length as shown in FIG. 11. Furthermore, two or more isolation regions can be added to the structure for example as shown in FIG. 11.

In general, the C2 region (or regions) and the control region (or regions) can be combined in many other different ways. For example, as shown in FIG. 13, the two control regions may be limited in the region between the C1 terminal and the C2 region. Obviously, also in this embodiment each control region may be partially overlapped with the C1 oxide or it can be spaced apart from it and/or one or more p-doped (or intrinsic or near-intrinsic) regions can be added to the structure. The C1 region may be limited between the two control regions without extending behind the control regions (in this case the C1 width is comparable with the distance between the two control regions, similarly to what shown in FIG. 12), or it may be extended behind the control regions as shown in FIG. 13. In the embodiments of FIG. 10-13 (as in any other embodiment herein described which presents multiple control regions), one of the control regions may be also replaced with an insulator region, so as the depletion region of the pn junction against the insulator can be used to isolate the C2 terminal from the semiconductor interface under the C1 oxide.

If one of the two control region is replaced with an insulating region, such insulating region may be also extended laterally behind the C1 terminal as shown in FIG. 14. Furthermore, as shown in FIG. 14, an optional extra control region 92 extending parallel to the C1 terminal can be also added behind the C1 region. Another possibility is to use the configuration of FIG. 15, where only one of the two control regions extends parallel to the C1 terminal. Another interesting embodiment can be also derived from the one of FIG. 15 by mirroring the structure with respect to the right side, so as the C2 region is formed between two control regions. As shown in FIGS. 16 and 17, also the vertical widening of the depletion region can be exploited by adding a p+ buried region (and/or a buried oxide). In all the previous embodiments, the buried region (when present) can extend partially or entirely underneath the C1 oxide, or it can be limited underneath a control region (e.g. region 110 in FIG. 16 or region 117 in FIG. 17) depending on the required performance.

In general, the presence of a third control region allows for an extra degree of freedom in the design of the Transcap device. FIG. 18 depicts another embodiment of the disclosed invention which exploits three control regions. In this embodiment the main function of the control region 127 is to modulate the capacitance as a function of the control voltage maintaining the analog behavior of the structure: when the depletion region generated from the control region 127 widens underneath the dielectric 124, the capacitance as a function of the control voltage decreases in an analog fashion. The two control regions 123 and 128 are used to increase the tuning range: when the depletion regions generated from the two control regions 123 and 128 touch each other (for a control voltage greater than a threshold value) the C2 region 122 becomes isolated from the interface between the dielectric layer 124 and the semiconductor region 125, which results in a lower minimum capacitance between C1 and C2.

As shown in FIG. 19, the control regions can also be placed in an alternate fashion around the C1 terminal. Many other variants can be obtained as shown for example in FIG. 20-23. As in any other embodiment of the present invention, each control region can be partially overlapped with the C1 oxide or it can be spaced apart from it so as to decrease the parasitic capacitance. Furthermore, if desired, each control region can be formed in a p-doped (or intrinsic or near-intrinsic) region such as a p-well so as to increase the breakdown voltage of the control (as in any other embodiment of the present invention).

As shown in FIG. 24, the control regions can also surround the C1 terminal on three sides so as to increase the control on the depletion region under the oxide. Furthermore, in all the embodiments herein described, multiple n+ doped C2 regions can be added (in one or more sides of the structure) to increase the quality factor of the device. For example, FIG. 25 shows a variant of the implementation of FIG. 19, where a second C2 region has been added behind the third control region 185.

As shown in FIGS. 26 and 27, the number of control regions and/or C2 regions can be also greater than three. It is worth to notice that the embodiment of FIG. 25 can be also obtained by placing side by side two structures resembling the one of FIG. 13 in a mirrored configuration. Many other implementations of the Transcap device can be obtained with a similar technique, by mirroring any of the embodiments herein described with respect to one of their sides.

Layouts similar to the ones of FIG. 1-27 can also be used to manufacture Transcap structures where the C1 oxide is formed over a semiconductor region above the control and/or the C2 implantation as shown for example in FIG. 28-31.

The embodiments illustrated above are based on a MOS structure. This makes the capacitance value dependent on the $V_{C1C2}$ voltage between the C1 and C2 terminals. In order to decrease the capacitance dependence on the $V_{C1C2}$ voltage and, at the same time, increase the specific capacitance per area, the embodiment of FIG. 32 can be utilized. As it can be seen this embodiment is similar to the one shown in FIG. 2, with the exception that a multiplicity of small semiconductor pillars have been formed above the semiconductor layer 259. Above these semiconductor pillars, the capacitance dielectric 260 and the C1 region 251 have been formed. The upper portion or the entire semiconductor pillar can be heavily doped in order to maximize the specific capacitance and make the MOS system almost independent from the $V_{C1C2}$ voltage. In general, the pillars can be formed with n-doped, p-doped or un-doped semiconductor (with crystalline, poly-crystalline or amorphous structure) or with metallic materials, as described more in detail in the patent application U.S. Ser. No. 14/456,184 entitled "Three Terminal Variable Capacitor", filed by the same applicants on Aug. 11, 2014.

The operation principle of this embodiment is similar to the one of the structure illustrated in FIG. 1, with the difference that the capacitance characteristic as a function of the control voltage presents a more quantized behavior: by increasing the voltage of the control terminal 253 toward negative values with respect to the C2 region 257, one or more of the semiconductor pillars are isolated from the n+ region 257, thus decreasing the capacitance of the device. If the device is not optimized, the capacitance characteristic, as a function of the control voltage, assumes therefore a stairs like shape. The more the control voltage increases toward negative values, the more pillars are isolated thus creating a sequence of step transactions for the capacitance value.

By optimizing the height, width and doping profile of the different pillars, the dependence of the device capacitance as a function of the control voltage can be made more linear. For example by lowering the height of the pillars, the step transitions are smoothed out to the point that a linear control range can be identified.

In order to reduce the quantized nature of the structure illustrated in FIG. 32, the dielectric layer 252 can be inserted between the semiconductor pillars and the semiconductor layer 259. In this case the extra dielectric 252 improves the CV characteristic of the device, smoothing out the capacitance variation as a function of the control voltage. If the lower dielectric 252 is present, the upper dielectric layer 260 of FIG. 32 can also be omitted (if desired) and the pillars can be directly connected to the C1 terminal in order to increase the capacitance density and simplify the manufacturing process. If the top portion of the pillars is not highly doped and/or if the dielectric layer 252 is present, a more analog behavior can be also obtained by applying the control voltage to the C2 terminal with respect to both the CTRL and C1 terminals, so as to exploit also the carrier population change at the oxide/semiconductor interface to change the capacitance value.

If desired, the highly conductive portion of the semiconductor pillars, or even the entire pillars, can also be realized using metallic materials. It is important to notice that the semiconductor (or metallic) pillars, which can be formed with semiconductor trench process steps or deposition techniques, can be shaped differently one from each other.

If the highly doped regions (or metallic regions) inside the pillars extend down to the oxide layer 252, the pillar structures can be formed as an array of MOSFET gates, one near the other, by utilizing the polysilicon (o metal) gate regions as pillars. Alternatively, the pillar structures can be formed for example with a deposition or an epitaxial process step followed by an etching step.

In order to reduce the control voltage required to achieve the maximum tuning range of the device, a second control region can be added to the structure as shown in FIG. 33. The presence of the second control region allows the reduction of the voltage required to deplete the semiconductor area under the oxide 262. Also in this case the C2 implantation can be placed laterally to at least one of the control regions 263 and 269, or in the third dimension, i.e. in the direction perpendicular to the cross section shown in FIG. 33.

If desired also a buried implantation 265 can be added to the structure as shown in FIG. 33, in order to minimize the parasitic resistance associated with C2. Also in this case, the C2 sink implantation can be placed laterally to the structure or in the direction perpendicular to the shown cross section. Alternatively, the optional layer 266 can be omitted and the buried n+ layer can be contacted directly on the lower side of the structure (this configuration is very appealing if the transcap device is realized as discrete component; in this case the utilized substrate is usually an n-type substrate with a bottom contact placed at the lower side of the wafer). All the embodiments herein described can be adapted to use a multi-pillar configuration as a capacitance plate.

In general a transcap device can be realized also in process technologies involving a trench MOS configurations, as discussed in detail in the patent application U.S. Ser. No. 14/456, 184 entitled "Three Terminal Variable Capacitor", filed by the same applicants on Aug. 11, 2014. An example of implementation of the current invention in trench MOS process technology is illustrated in FIG. 34. A tridimensional view of a possible implementation of the embodiment of FIG. 34 is shown in FIG. 35.

These two embodiments mainly exploits the vertical extension of the depletion region to control the capacitance value. As discussed for the previous embodiments, also in the case of trench MOS structures, the control regions and/or C2 regions can be placed in many ways in order to optimize the device performance. For example, the embodiment of FIGS. 36 and 37 mainly exploit the depletion region extension in the longitudinal direction (with respect to the C1 terminal) to modulate the capacitance value between C1 and C2.

Other variants based on the trench configurations are shown in FIG. 38-40. In these embodiments the C2 region has been moved away from the C1 oxide so as to maximize the tuning range. If desired, two or more isolation regions can also be added to the structure, as shown for example in FIGS. 39 and 40. Each control region can be formed directly in contact with the trench oxide or it can be spaced apart from it (if desired, the control regions can also be placed farther from the C1 oxide than with respect to the C2 region). With reference to the embodiment of FIG. 40 (however, similar considerations hold true also for any embodiment herein described), the n+ and p+ regions may or may not extend down to region 316, depending on the available process and the required performances. In general, the C1 trench can be formed with any shape.

FIGS. 41 and 42 depict two structures obtained from the embodiment of FIG. 37, by mirroring the structure with respect to the C1 longitudinal axes. As mentioned above, a similar technique can be used to derive new structures from all the embodiments herein discussed by mirroring any of them with respect to one of their sides.

Multiple embodiments as the ones discussed above can be connected in parallel so as to increase the total capacitance of the device. The dimensions and the shape of the trenches cross-sections determine the specific capacitance (capacitance per unit area) improvement with respect to the more planar structures. Each semiconductor trench of the device can have three, four, six or more walls (the cross-section of the semiconductor pillars/trenches can have a triangular, trapezoidal, rectangular, square, octagonal, hexagonal, circular, or oval shape).

In all the embodiments discussed above where at least a portion of the current flows in the vertical direction, the final layout of the device can be oriented in order to maximize the carrier mobility in the semiconductor body of the device in the vertical direction. For example if the device is realized in a silicon wafer (100), since from a crystallographic point of view the plans (010) and (001) are equivalent to the (100), the device layout can be rotated by 45° degrees with respect to the primary flat of the wafer so as to maximize the electron mobility along the vertical dimension.

All the embodiments herein described can be realized in III-V technology with minimal modifications. If the utilized manufacturing process does not allow for low defect dielectric/semiconductor interfaces, as it can be the case in some III-V technology, the performance of the transcap device could be affected. In order to overcome this limitation, the insulating layer of the variable capacitor can be replaced with a (doped or intrinsic) wide bandgap semiconductor layer. In this case, the C1 terminal can be formed directly in contact with the wide bandgap semiconductor layer (so as to form a Schottky or ohmic contact with it) or a narrow bandgap material can be inserted between C1 and the wide semiconductor layer.

Another possibility is to add a dielectric layer between the high bandgap semiconductor layer and the C1 layer, in order to further improve the isolation of the C1 terminal without affecting the device performance. The p+ regions can be formed by growing or depositing directly a p+ doped region/layer (which does not need implantation process steps to be formed) instead of using a p+ implantation process step. Furthermore, the p+ doped region/layer can also be replaced with a metal region/layer so as to form a schottky contact with the n-doped region, eliminating the need for p-dopants (which are usually more difficult to deal with in a III-V process).

The formation of the control or C2 region in the dimension perpendicular to the illustrated cross section (or on any side of the illustrated structures) is a concept that can be utilized for any of the previously described structures in order to increase the control on the device characteristic without degrading the quality factor. Furthermore, extra control regions and/or C2 regions can be formed in the third direction (or on any side of the illustrated structures) or under the structure (the latter case is a very appealing configuration in the case where the device is realized in a process for discrete devices.) Furthermore, super junction configurations can be used to increase the control breakdown voltage and/or the device performance.

In all the herein described embodiments, the p+ region can be replaced with a Schottky contact and/or the n+ region can be replaced with a metal ohmic contact. In the case where a Schottky contact is used in combination with a III-V process technology, an extra wide bandgap layer can be interposed between the metal and the n-doped semiconductor in order to reduce the current leakage associated with the Schottky contact. In all the herein described embodiments, p-doped or intrinsic regions can be added to the structure to increase the breakdown voltage of the control terminal and/or decrease the parasitic capacitance associated with the control. Similarly, n-doped or intrinsic regions can be added to increase the device tuning range and/or the device withstanding voltage.

All the described embodiments can be built in many different technologies, comprising: Bulk CMOS, BCD, BiCMOS, Bipolar, Silicon On Insulator (including Ultra-Thin-Body, Fully Depleted, Partially Depleted, High Voltage and any other Semiconductor On Insulator technology), Silicon On Sapphire, thin-film, trench MOS, JFET, FINFET, Multi-gate FET (including Tri-Gate FET and Gate-All-Around technology), vertical MOS, SiC, Ge, SiGe (any other IV-IV compound semiconductor material), III-V technology (e.g. GaN, AlGaN, AN, InN, InGaN, GaAs, AlGaAs, AlAs, and any other polar and non-polar III-V compound semiconductor material including ternary and quaternary alloys) with or without hetero-junctions, II-VI technology (polar and non-polar II-VI compound semiconductor material including ternary and quaternary alloys) with or without hetero-junctions, or discrete device technologies (e.g. the ones used for discrete silicon or SiC MOS discrete power devices or for III-V discrete devices), including both organic and inorganic technologies. Different doping profiles can be utilized in order to improve the device performance. If desired, high-k dielectric materials can be utilized to form the capacitance dielectric so as to increase as much as possible the capacitance density. The C1 region can be formed with metallic or semiconductor (crystalline, poly-crystalline or amorphous) materials.

All the embodiments herein disclosed can be realized as integrated or discrete components with minimal changes. For each one of them, the dual version can be obtained by simply substituting the n-doped regions with p-type ones and vice-versa. If desired, in the dual version the n+ control regions can be replaced with Schottky contacts and/or the p+C2 regions can be replaced with metal ohmic contacts. Many other configurations can be obtained by combining the different embodiments and their variants.

Most of the structures herein described can be realized with a standard SOI or bulk CMOS process. The distance between the doping implants and the capacitance electrode C1 can be omitted by auto-aligning the implantations with the MOS structure or can be obtained by adding two spacers to the structure during the fabrication process or by misaligning the n+ (or p+) implantation mask with respect to the MOS oxide edge. The latter being the preferred method since it allows the achievement of any desired distance between the highly doped regions and the oxide edge. In some of the embodiments, one or more extra process steps can also be required in order to form the pillars/trenches in the semiconductor substrate (by means of a semiconductor etching or a deposition process steps) and/or to obtain the buried doped regions at the beginning of the manufacturing process.

Many other embodiments can be derived from the ones herein discussed by using one or more of the following principles to control the capacitance value between C1 and C2:
1) Use of a depletion region to modulate the effective area of an equivalent semiconductor capacitance plate (as shown for example in FIG. 1).

2) Use of a depletion region to insert an extra insulating layer (i.e. the depleted region) between C1 and C2. The extra insulating layer can form an extra capacitor (which uses the depletion region as a dielectric) in series to the main MOS capacitor (as for example in FIGS. 4, 28 and 29) or it can increase the thickness of the depletion region between C1 and C2 so as to decrease the minimum capacitance (as it can be the case in FIG. 14, depending from the final layout).
3) Use of a depletion region to control the number of capacitors connected in parallel, as for example in the multi-pillar configuration of FIGS. 32 and 33.
4) A combination of two or more of the previous principles (as it can be the case in FIG. 20, depending from the final layout), or the combination of at least one of the previous principles with at least one of the following two: i) use the modulation of the carrier population at the semiconductor-oxide interface so as to modulate the capacitance between C1 and C2; ii) use the modulation of the depletion region to modulate the capacitance between CTRL and C2.

The parasitic capacitances between the control terminal and the other terminals of the capacitor play a very important role in the overall device performance. In fact, if a DC voltage is applied between the control terminal and the reference terminal C2, the control terminal may be considered AC shorted with the reference terminal. This effect reduces the capacitance seen from C1 to the parallel of the capacitance C1-C2 (between the main two terminals) with the parasitic capacitance C1-CTRL (between the control terminal and the non-reference terminal). The net adverse effect may be a significant reduction of the tuning range.

To reduce this effect it may be convenient to connect an impedance (e.g. a resistor and/or an inductor) of proper value in series to the control terminal to AC de-couple the control terminal from the DC voltage source so that the mentioned parasitic capacitance does not end up being AC-coupled in parallel to the main capacitance. However this control technique may cause the voltage of the control terminal to vary with the RF signal and, as a consequence, the capacitance value of the capacitor to be modulated with the signal itself.

If the capacitance value varies with the control voltage in analog fashion, the consequence can be a non-negligible distortion of the signal. In this case the distortion can be however minimized by increasing the oxide thickness, or by increasing the parasitic capacitance (or adding an external capacitance) between the control terminal and the reference terminal, or by using a pre-distortion signal to control the transcap device.

FIG. 43 illustrates the most conventional control configurations of an analog transcap as discussed also in the patent application U.S. Ser. No. 14/456,184 entitled "Three Terminal Variable Capacitor", filed by the same applicants on Aug. 11, 2014. However, many other configurations are possible. As shown in FIG. 43 (*a*), a high value resistor HR can be placed in series to the Ctrl terminal in order to bias the device control terminal without affecting the RF performance of the device.

FIG. 43 (*b*) shows a possible variant of this configuration, where two anti-parallel diodes have been inserted in series to the high impedance HR in order to increase the AC decoupling between the analog bias and the control terminal of the transcap device. A similar approach can be utilized for all the control configurations herein disclosed. Furthermore, the HR resistor can also be replaced with an inductor as shown in FIG. 43 (*c*), or with a generic impedance Zc (which can be formed of multiple components connected together, and/or it can include a filter or in general any multiple-port network) as shown in FIG. 43 (*d*). It is worth mentioning that the generic impedance shown in FIG. 43 (*d*) can for example be a two-port network which enable a low impedance path for certain frequencies and a high impedance path for other frequencies (e.g., a low impedance path for base band frequencies, and a high impedance path for a fundamental of interest and its higher order harmonics).

As it can be seen, the conventional control configurations have several drawbacks: i) it is preferable to have the C2 terminal of the transcap connected to ground to avoid complicated control configurations, ii) the control voltage is negative (when an n-region is used under the capacitance oxide), iii) the RF signal drops entirely across C1 and C2 limiting the linearity of the system, iv) the RF signal can partially propagate through the control terminal leading to distortion.

Some of these problems can be solved by adding a series capacitor Cseries (or a variable capacitor, such as a varactor) between the transcap device and one of the RF terminals. FIG. 44, shows an example of implementation of this control configuration. In the illustrated case, the control terminal of the transcap device can be coupled through a high impedance to ground (or to a bias DC source), and the middle node (obtained by coupling the C2 terminal to the series capacitor) can be used to modulate the total capacitance seen by the RF signal, by applying a positive DC bias. This configuration is suitable for both shunt and series tuning capacitor configurations.

It is important to notice that, by utilizing the latter described control configuration, the tuning range of the transcap device significantly increases. The DC control voltage not only modulates the depletion region of the pn junction between CTRL and C2, but also the carrier population at the oxide/semiconductor interface under the C1 terminal. A DC voltage is present also across the oxide layer allowing a higher control on the overall capacitance between C1 and C2.

In all the previous configurations the C1 terminal of the transcap device can be also biased through a third high impedance (not shown in FIG. 43, and represented by the RF bias Ctrl pad in FIG. 44) in order to guarantee the correct operation of the structure and/or improve its performance. Indeed, as shown in FIG. 44, since a transcap device is a three-terminal device, it is possible to apply one or more control voltages and/or apply a control voltage between any of the terminals (e.g. between CTRL and C1 and/or C2, or between C1 and C2 and/or CTRL, and between C2 and C1 and/or CTRL). Furthermore, one or more of the illustrated HR resistors can be replaced with a generic impedance $Z_C$ (as in any control configuration described in this document). The performance of the transcap device can be dramatically influenced by the used control configuration.

Another interesting approach is shown FIG. 45 (*a*), where two transcap devices TC 1 and TC2 are connected back-to-back and the control terminals Ctrl1 and Ctrl2 are biased through two high impedance paths. The middle node obtained by coupling the two C2 terminals becomes therefore a third control terminal, which can also be used to modulate the capacitance seen by the RF signal. Also in this case, the RF terminals of the transcap device can be biased through high impedances in order to guarantee the correct operation (and/or improve the performance) of the transcap devices. It is worth noticing that, if desired, two transcap devices can also be connected in a series approach where the middle node is the C1 electrode of both capacitors.

In all the embodiments herein described (in any of the control configurations of FIG. 43-45), if multiple control regions are present, each one of them can be controlled with a different control/bias voltage or through the same voltage.

They can all be shorted together or each one of them can be biased through a different impedance. Furthermore, some control terminal may be coupled (directly or through an impedance) to the C1 terminal of the transcap device and some may be coupled (directly or through an impedance) to ground or to a control/bias voltage. The approach used to bias the control terminals significantly influences the transcap performance.

As shown in FIG. 45 (b) the differential series resulting from the connection back-to-back of two transcap devices can be seen as a single device with 5 terminals (RF+, RF−, C2, Ctrl1, Ctrl2), where two of them (RF+ and RF−) are dedicated to the RF signal and three (C2, Ctrl1, and Ctrl2) are used to control the capacitance value seen between RF+ and RF−. However, also in this configuration the two RF terminals can be biased (and/or used as control terminals) so as to improve the device performance. Hereafter, when possible, the symbol shown in FIG. 45 (b) will be utilized to represent the described 5 terminal differential series transcap device (DS Transcap) in order to simplify the circuit schematic.

All the embodiments discussed above can be connected in differential series configuration so as to form a single device with 5 terminals. For example, FIGS. 46 and 47 show two examples of implementation of the described series approach obtained by connecting back-to-back in series two transcap structures resembling the ones of FIGS. 25 and 18, respectively, so as to form a 5 terminal device. FIGS. 48 and 49 show other two example of implementation of the described differential series approach derived from the embodiment of FIG. 47, indicating that many possible configurations can be derived from each structure.

As discussed above, all the transcap device structures herein described can be realized in many different manufacturing-processes/technologies. FIG. 50-55 depict just few examples of embodiments to show how a DS transcap can be obtained by combining the different approaches previously described with some process technologies.

In particular, FIG. 50 shows an example of DS Transcap device in SOI process according to a possible implementation of the embodiment of FIG. 2. In this example, the highly doped regions are formed in direct contact with the buried insulator. It is important to notice that depending on the utilized manufacturing process and/or the thickness of the active semiconductor layer, the control and/or C2 regions can be formed in different ways, including sink implantations and other techniques to extend them to the buried oxide if desired.

FIG. 51 shows an example of DS transcap device realized in CMOS/BiCMOS bulk technology according to a possible implementation of the embodiment of FIG. 2. This embodiments presents a set of optional regions that can be added or omitted from the structure based on the characteristics of the utilized process, the characteristics of the application, and if the transcap device is utilized as a discrete device or if multiple components must be integrated in the same die. Each of these layers/regions can be shorted directly or through a high impedance path (e.g. through a high value resistor) to ground, or to a supply, or to a control voltage, or to a voltage greater or equal to the maximum RF signal value, or lower or equal the minimum RF signal value, or any other semiconductor region or terminal of the device depending from the chosen implementation and the type of substrate (n-doped, p-doped or intrinsic and/or epitaxial). In general, if desired, others n-doped or p-doped or intrinsic layers/regions (including heavily doped buried layers/regions) can be also added to the structures. Any doping profile or concentration can be utilized for the different semiconductor regions/layers composing the device.

FIG. 52 illustrates an example of implementation of a DS transcap device in SOI technology according to a possible implementation of the embodiment of FIG. 28. FIG. 53 illustrates an example of a DS transcap device in CMOS/BiCMOS bulk technology according to a possible implementation of the embodiment of FIG. 29 (also in this case similar observations to the ones made for the embodiment of FIG. 51 remain valid).

FIG. 54 illustrates a possible implementation in discrete process technology of the series approach by using the building block of FIG. 32 (also in this case hold valid the observations made for the embodiment of FIG. 51). FIG. 55 illustrates another possible implementation of the series approach by using building blocks resembling the one of FIG. 34 in trench technology. FIG. 56 depicts a tridimensional view of a possible implementation in FINFET/Tri-Gate process technology of the series approach by using two transcap structures resembling the one of FIG. 1.

It is important to notice that the differential-series configuration can be utilized with all the transcap structures herein described and their variants, by connecting two of them back-to-back in series. In general, the ratio of the capacitance values between the two transcap structures composing the differential-series configuration can be made equal to or different from the unity.

For all the embodiments herein discussed, each semiconductor layer/region can be biased in many different ways in order to guarantee the correct operation of the device. In particular, if n-well, and/or deep n-well, and/or p-well, and/or deep p-well, and/or buried implants are used to isolate the transcap device from other devices, a possible bias configuration is to connect the p-well (and/or deep p-well and/or p+ buried) through an high impedance path (e.g. a high value resistor) to ground and the n-well (and/or deep n-well and/or n+ buried) to the supply voltage, once again through an high impedance path (e.g. a high value resistor). If desired, in order to improve the device isolation, a diode can be placed in parallel to the resistor HRN biasing the n-well (and/or deep n-well and/or n+ buried) or the HRN resistor itself can be replaced with a diode, so as to limit the minimum voltage of the n-well (and/or deep n-well and/or n+ buried) to the supply voltage. Another possibility is to add a diode in parallel to the HRP resistor biasing the p-well (and/or deep p-well and/or p+ buried) instead of adding it in parallel to HRN (or use two diodes, one to bias the n-doped isolation region and one to bias the p-doped isolation region), by connecting the anode of the diode to the p-well (and/or deep p-well and/or p+ buried) and the cathode to ground. An optional capacitor can also be added between the n-well (and/or deep n-well and/or n+ buried) and the p-well (and/or deep p-well and/or p+ buried) if needed, so as to guarantee that the n-well potential follows the potential of the p-well (or vice-versa).

Independently from the technology or embodiment used to implement the differential transcap device, many possible configurations can be derived from each structure by rearranging the different regions forming the device. For example, in FIG. 57 is reported a possible variant of the embodiment of FIG. 50, obtained by placing the C2 region in the direction perpendicular to the cross section of FIG. 50 instead of between the two RF terminals.

Multiple structures as the one discussed above, can be connected in parallel so as to increase the capacitance of the device. An example of structure resulting by connecting in parallel three structures as the one shown in FIGS. 46 and 47 is reported in FIGS. 58 and 59, respectively.

FIG. 60 (a) and FIG. 60 (b) show two possible control configurations that can be used to bias the different terminals of a 5 terminals DS transcap device. As it can be seen, in both configurations, the Ctrl1 and Ctrl2 terminals have been coupled to ground through two impedances $Z_{CTRL1}$ and $Z_{CTRL2}$ (e.g. two high value resistors or more complicated networks), and the central control terminal C2 has been used to modulate the device capacitance between RF+ and RF− terminals. Optionally, also the RF terminals can be connected through two impedances $Z_{RF+}$ and $Z_{RF-}$ (e.g. two high value resistors or more complicated networks) to ground or to a control voltage or to a voltage source so as to optimize the device performance. FIG. 60 (c) shows a possible example of implementation of the control configuration of FIG. 60 (a). For each device terminal, a FET transistor can also be connected in parallel to the impedances used to control the transcap devices in order to speed up the tuning speed of the transcap device (i.e., for example, the FET device is always off except during the transitions of the control voltage). As discussed above, many others configurations can be used to bias the terminals of the device.

Due to the differential nature of a differential-series configuration, the distortion induced by the presence of the parasitic capacitances between the Ctrl1 and Ctrl2 terminals and the RF terminals, is minimized. The RF signal propagates both in the C2 terminal and in the Ctrl1 and Ctrl2 terminals, such as its net effect on "$V_{CTRL}$-$V_{C2}$" is minimized for both transcaps composing the differential-series. In principle, the Ctrl1 and Ctrl2 terminals can also be shorted together before the high impedance, however this approach can significantly degrade the device tuning range, especially in the case where the capacitance between Ctrl1 and C2 (and/or between Ctrl2 and C2) is comparable to the one between C2 and RF+(and/or between C2 and RF−) as in the case of an SOI process with a thin silicon active layer (in this case, the shortening of the two controls terminals Ctrl1 and Ctrl2 can decrease the tuning range by a factor greater than 2).

As shown in FIG. 61, by using the control configurations of FIG. 60, more structures can be placed in series (by short-circuiting the resistors coupled to the C2 terminals) in order to withstand higher RF voltages. If desired, the RF+ CTRL and RF− CTRL terminals (if present) can be all shorted together after the high impedance paths and connected to ground or to a control voltage or to a fixed voltage source (or to a control voltage). If required, equalizing resistors can also be used between the different transcap structures in order to equalize the RF voltage drop on the different structures. Also here, as in any other control configuration herein discussed, one or more of the illustrated HR resistors can be replaced with a generic impedance Zc.

As shown in FIG. 62, multiple differential-series devices can also be placed in parallel (or anti-parallel). In this case, the dimensions of the 4 transcaps can be optimized in order to optimize the linearity of the system, for example by sizing the $1^{st}$ transcap in order to match the dimensions of the $4^{th}$ one, and by sizing the $2^{nd}$ to match the $3^{rd}$ one so as to obtain an anti-parallel configuration. If desired, the two analog controls can be coupled together in order to simplify the driving circuitry. Furthermore, if desired, it is also possible to connect in parallel two transcap (or DS transcap) devices of opposite polarity, i.e. a transcap (or DS transcap) device and its dual version obtained by reversing all the doping types (p-doped regions are replaced with n-doped ones and vice-versa), or to connect in parallel a differential transcap device with C2 as middle node with a differential transcap device with C1 as middle node. To improve the linearity of the resulting circuit, a capacitors can also be added to couple the two central nodes A1 and A2 (the capacitor is connected on one side to A1 and on the other side to A2) or one or multiple capacitors can be added to couple any combination of the points B1, B2, B3, B4, especially when connecting in parallel a DS transcap and its dual version, or a DS transcap with C2 as middle node with a DS transcap with C1 as middle node.

FIG. 63 illustrates another interesting control configuration, where a hybrid approach between analog and digital/discrete solution is presented as a switch is placed in series to the described variable capacitor. In this configuration, the size of the transistor M1 must be opportunely chosen in order to maximize the tuning range, maintaining, at the same time, the possibility of choosing, in a continuous fashion, all the possible capacitance values in the selected tuning range.

The modus operandi of this configuration is quite simple. Referring to FIG. 63 (a), the minimum capacitance value (seen from the RF signal) is obtained when the transistor M1 is turned off, and the analog control terminal of the transcap device is biased at high negative voltages so as to minimize the capacitance value between C1 and C2. The maximum capacitance value, instead, is obtained when M1 is turned-on and the analog control voltage is set to zero. The intermediate capacitance values can be obtained by turning-on or off M1, and by varying the analog control voltage fed to the analog control terminal. Similar considerations hold true also for the configuration of FIG. 63 (b), where a DS transcap has been placed in series to a MOS device.

The transistor M1 can also be replaced with a multiplicity of transistors (connected in series or in parallel to each other). In this case, by properly choosing the ratio between the different components of the network, it is possible to increase the tuning range of the network. If desired, M1 may be replaced with a p-channel transistor.

FIG. 64 illustrates another interesting configuration, where two of the previous networks have been connected in parallel. In this configuration, the devices belonging to the second branch of the parallel (DS transcap 2 and M2) must be opportunely sized in order to increase as much as possible the capacitance tuning range, maintaining at the same time the possibility of choosing in analog fashion all the possible capacitance values in the selected tuning range.

The operation of this configuration is similar to the one of the network shown in FIG. 63. The minimum capacitance value (seen from the RF signal) is obtained when both transistors M1 and M2 are turned off, and the analog control terminals of the two DS transcap devices (which are short-circuited through two high impedances in order to simplify the overall control circuitry) are biased at high positive voltages so as to minimize the capacitance values of DS Transcap 1 and DS Transcap 2. The maximum capacitance value, instead, is obtained when both transistor M1 and M2 are turned-on and the analog control voltage is set to zero. The intermediate capacitance values can be obtained tuning-on only M1, only M2, both or none of them, and varying the analog control voltage.

If the dimensions of the two transistors M1 and M2 and the size of DS Transcap 1 and DS Transcap 2 are opportunely chosen, for example such as M2 and DS Transcap 2 are both r times bigger than M1 and DS Transcap 1, respectively, all the intermediate capacitance values can be chosen in an analog fashion way.

It is important to notice that, if desired, the two analog controls of the two transcap devices can be separated and driven independently. Furthermore, more capacitive branches can be coupled in parallel using a similar configuration. In FIG. 62-64, the body of the transistor M1 (and/or M2) if present, can be connected directly or through a high impedance path to a control voltage or to ground (if M1 and/or M2 are n-channel transistors), or to a supply voltage (if a p-channel transistor, instead of a n-channel one, is used in series to the transcap device). In FIGS. 63 and 64, each transistor terminal can be coupled directly or through a high impedance path to ground, to a supply voltage or to a control voltage depending to the final application.

In all the configurations described above, the capacitance between the control terminal of each transcap device and the C2 terminal can be increased in order to improve the linearity of the overall network. Alternatively, external or integrated capacitors can also be added in order to increase the C2-CTRL capacitances. In particular with the differential series approach, external or integrated capacitors can be added between the two control terminals or between each control terminal and the central node of the series, in order to improve the linearity of the system. Furthermore, all these configurations are suitable for both shunt and series tuning capacitor configurations, with minimal modifications (if any).

In wireless power transfer systems, whether they be by means of electromagnetic waves, ultrasonic waves or others, and in particular for the case of resonant systems, the use of the transcap device, according to the any of the embodiments of the subject invention, allows the tuning of important parameters like the impedance of a network or the resonant frequency. The tuning within the receiver and the transmitter offers great advantages like the centering of the resonant frequency of the antenna, the adaptive impedance matching following the load variations or the power transfer conditions (coupling coefficient varying with respective locations of transmitter and receiver) and so on. These advantages ultimately reflect in higher efficiency of the system, lower cost of the components, lower required range of operating voltages, higher immunity to parasitic effects and others.

Similar advantages can be obtained by the use of the transcap device in any application comprising a resonant network such as tuning impedance matching circuits for cell-phone front-end, wireless circuits and so on. Obviously, the transcap technology can be used also in non-resonant circuit applications. The transcap technology can be also used in 3-dimensional (3D) packaging technologies (with or without Through-Silicon Via) to exploit the height dimension to provide higher integration and performance, e.g. in electronic applications requiring high capacitance density and high capacitance values. The stacking of several integrated variable capacitors according to the embodiments herein described offers the advantages of obtaining variable capacitors with overall capacitance values comparable to the ones of the discrete capacitors used in conventional electronic applications.

As it is clear to those skilled in the art, the basic system of the present invention can be implemented in many specific ways, and the above descriptions are not meant to designate a specific implementation.

BRIEF DESCRIPTIONS OF THE DRAWINGS

The features, objects, and advantages of the present invention will become apparent upon consideration of the following detailed description of the invention when read in conjunction with the drawings in which.

DETAILED DESCRIPTION OF SPECIFIC EMBODIMENTS

A FIG. 1

Figure 1:
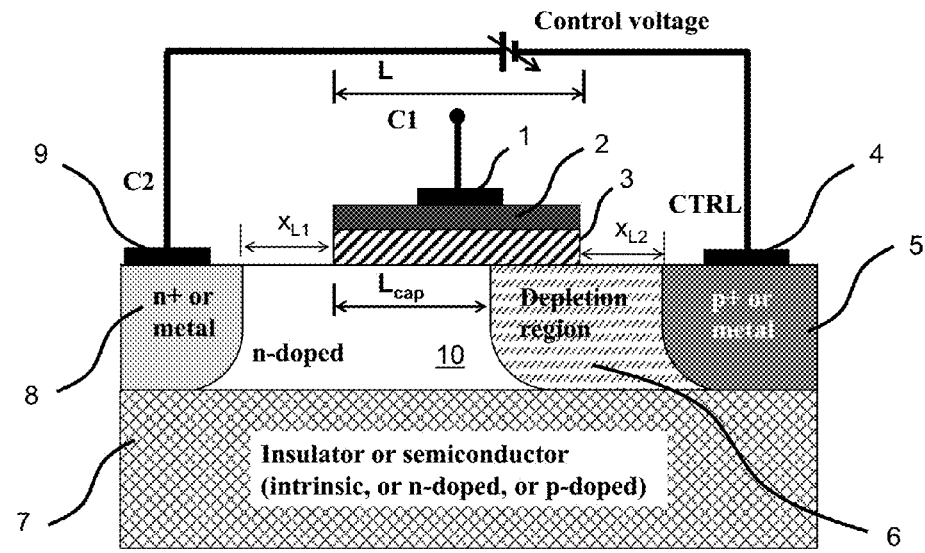
FIG. 1 shows a cross section view of a semiconductor variable capacitor according to a first embodiment of the invention.

FIG. 1 is showing the simplest structure of a transcap device as described in the regular patent application U.S. Ser. No. 14/456,184 entitled "Three Terminal Variable Capacitor", filed by the same applicants on Aug. 11, 2014. The p+-type region 5 defines the control terminal of the device whereas region 2 and the n+ region 8 are the two terminals of the capacitor. Region 3 corresponds to the capacitor dielectric layer, whereas region 10 is a n-type semiconductor layer. $x_{L1}$ is the distance between the capacitance plate 2 and the n+ region 8, $x_{L2}$ is the distance between the capacitance plate 2 and the p+ control region 5, L is the length of the upper capacitance plate 2, whereas $L_{CAP}$ is the effective length of the lower equivalent capacitance plate. The lower capacitance plate is constituted by the neutral region of the semiconductor layer 10, and is connected to the C2 terminal 9 through the n+ region 8.

The C1 region 2 may be built in semiconductor (with crystalline, poly-crystalline or amorphous structure, e.g. poly-silicon) or metal. Independently from the doping type used for the semiconductor region 10 underneath the oxide, the work-function of region 2 can be smaller, equal or greater than the sum of the electron affinity and half bandgap of the semiconductor material forming region 10. It is advisable to choose the work function of region 2 so as to maximize the device performance (e.g. by utilizing a n-doped poly-silicon material instead of a p-doped one, even if the semiconductor region 10 underneath the oxide is doped with n-type impurities, or by utilizing a metallic material (also doped if desired) with an opportune work-function or a multi-layer stack of different metallic materials so as to obtain the desired work-function). If desired, it is also possible to divide region 2 in two sub-regions, one n-doped and one p-doped, or to use a different metallic material for each sub-region. Region 7 is properly chosen in order to maximize the device performance (e.g. this can be an insulator, a semi-insulator or an intrinsic/near-intrinsic semiconductor in order to decrease the parasitic capacitances associated with the substrate or it can be made of n-doped or p-doped semiconductor with an appropriate doping profile in order to maximize the control on the depletion region 6 and/or the device quality factor). Region 7 can be also formed by multiple semiconductor layers or regions doped in different ways (n, p or intrinsic), e.g. obtained with subsequent implantations such as p-well and n-well and/or it can include buried doped regions (both p- or n-doped, connected for example to C2 or CTRL) as discussed more in detail in the following. Furthermore, this region can include semiconductors and/or insulating layers and/or substrates or it can be formed above semiconductors and/or insulating layers and/or substrates.

In general, the heavily doped region n+8 can be partially overlapped with the oxide 3 of the MOS capacitor or it can be formed at a distance $x_{L1}$ from its edge so as to increase the device tuning range and linearity. In the latter case also the voltage withstanding capability of the device is improved since a portion of the RF signal drops between the oxide edge and the n+ region instead of being applied entirely across the oxide layer 3. In high voltage applications for example, the distance between the n+ region 8 and the oxide 3 can be also greater than 1um. The n-doped region 10 can be formed for example by a drift or dext implantation or it can be realized with an n-well implantation (or with multiple implantations, or directly by growing or depositing doped semiconductor material). The p+ region 5 can be partially overlapped with the oxide 3 or it can be spaced apart from it by a distance $x_{L2}$ so as to minimize the parasitic capacitance between the C1 and CTRL terminals (or shift the C-V characteristic of the device).

B FIG. 2

Figure 2:
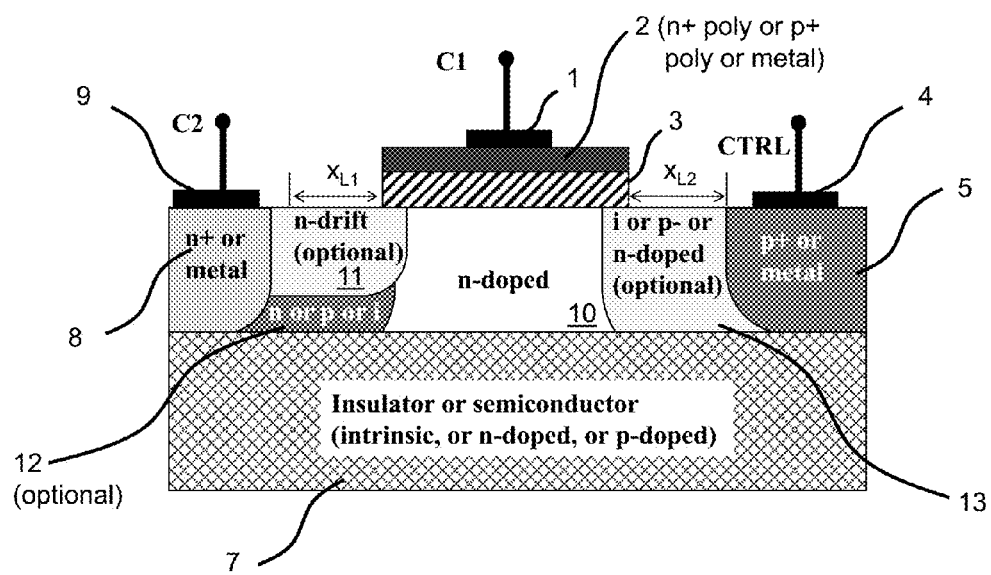
FIG. 2 shows a cross section view of a semiconductor variable capacitor according to the preferred embodiment of the invention, where multiple optional regions are present.

In the structure shown in FIG. 2 several optional regions are present. A drift implantation 11 can be optionally used to regulate the doping concentration between the oxide and the n+ region. Region 11 can be formed directly in the n-doped region 10 or in a p-doped (or intrinsic or n-doped) region 12. An optional p-doped or intrinsic, or near-intrinsic, or n-doped (with a doping concentration higher, lower or equal with respect to region 10) region 13 can be also added between the p+ region 5 and the n-doped region 10 in order to improve the breakdown voltage of the pn junction, decreasing, at the same time, the parasitic capacitance between the C1 and CTRL terminals (or in general to improve the device performance or alter the CV characteristic of the device). Region 13 can be partially overlapped with the oxide 3 or it can be spaced apart from it so as to maximize the capacitance tuning range.

If realized in SOI technology, it is advisable to choose an active semiconductor layer thickness (and/or manufacturing process) so as the p+ region (or its depletion region for high control voltages) and/or the n+ region is in direct contact with the buried oxide so as to maximize the capacitance characteristic and/or the device performance. However, many configurations are possible including the implementation of the present invention in fully-depleted, partially depleted or high-voltage (where the active semiconductor layer has a thickness usually exceeding 1um) standard SOI process technologies, where the p+ region and/or the n+ region may or may not be in direct contact with the buried oxide. Furthermore, if the control region does not touch the buried oxide layer, also the vertical extension of the depletion region can be used to modulate the capacitance between C1 and C2 as will be discussed more in detail later on in this document. The p+ and n+ regions can be formed in different ways, including doping implantations (such as source/drain implantations, sink implantations or buried implantations) or directly by growing or depositing a doped material (in a semiconductor trench or on top of a semiconductor layer).

C FIG. 3

Figure 3:
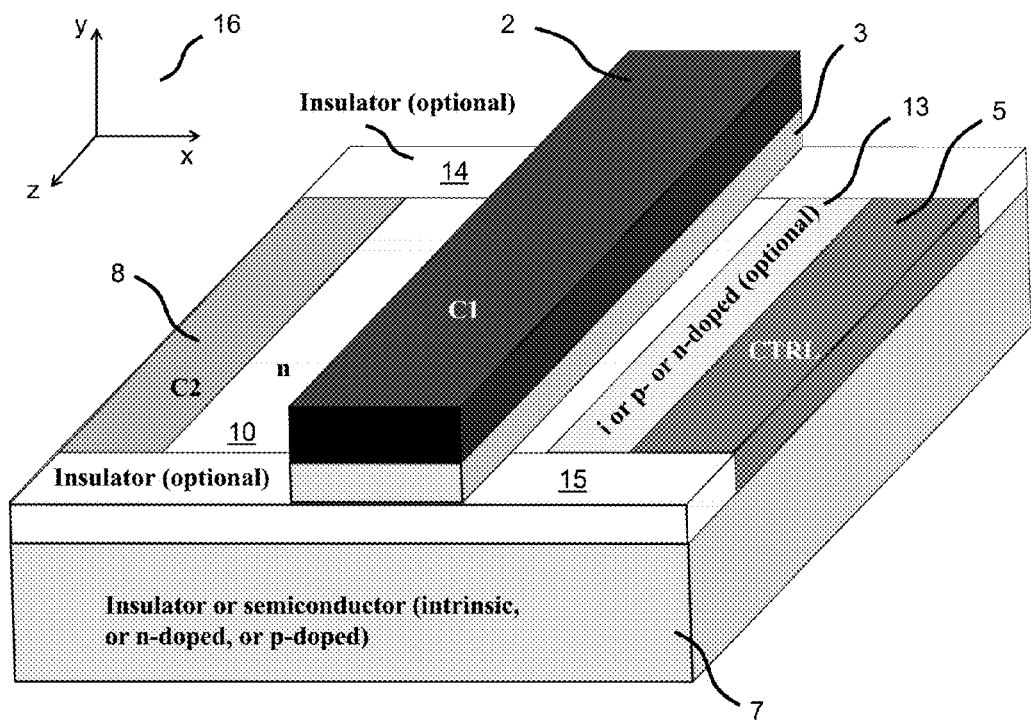
FIG. 3 shows a tridimensional view of a possible implementation of the embodiment of FIG. 2, where two extra optional isolation regions have also been added laterally to the device.

FIG. 3 depicts a tridimensional view of a possible implementation of the embodiment of FIG. 2. This embodiment has been obtained from the cross section of FIG. 2 by simply extending the cross-section along the direction perpendicular to the cross-section itself (z-direction). However, as it will be discussed more in detail in the following, many other possible implementations exist where for example, the cross section of FIG. 2 is used only for certain portion of the device along the z-direction. In FIG. 3, also two extra optional isolation regions 14 and 15 have been added on the sides of the device to increase the isolation of the device and to allow for a better control of the capacitance of the device.

In order to increase the isolation of the C2 terminal 9 for high control voltage values, an isolation region (e.g. a Shallow trench isolation or a LOCOS isolation) can be added between the n+ region and the C1 electrode so as to decrease the parasitic coupling between the C1 and C2 terminals. Similarly, an isolation region (e.g. a Shallow trench isolation or a LOCOS isolation) can be added between the p+ control region and the C1 electrode so as to decrease the parasitic coupling between the C1 and CTRL terminals. Similar considerations hold true for any transcap embodiment.

For all the embodiments herein described the dual version can also be obtained by reversing all the doping types (p-doped regions are replaced with n-doped ones and vice-versa). However, the dual configuration may exhibit a lower quality factor with respect to the illustrated ones due to the fact that usually p-doped materials exhibit a lower mobility with respect to n-doped semiconductors.

D FIG. 4

The structures discussed above mainly exploit the horizontal widening of the depletion region to isolate the C2 terminal from C1. Another possibility is to use also the vertical widening as in the structure shown in FIG. 4. In this case, the depletion region of the pn junction in the vertical direction can be used (also in combination with the depletion region of the pn junction in the horizontal direction) to isolate the C2 terminal from the semiconductor interface under the C1 oxide. Depending on the distance between the control region 19 and the oxide 17, also the horizontal extension of the depletion region can however be used to modulate the capacitance between C1 and C2.

E FIG. 5

Figure 4:
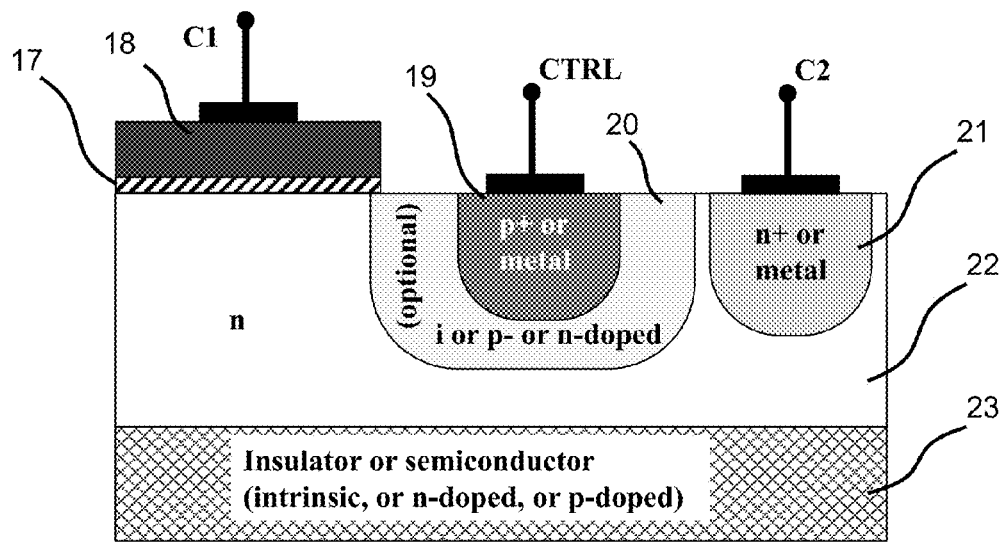
FIG. 4 shows a cross section view of a semiconductor variable capacitor according to a further embodiment of the invention, where also the vertical extension of the depletion region can be used to modulate the capacitance between C1 and C2.
Figure 5:
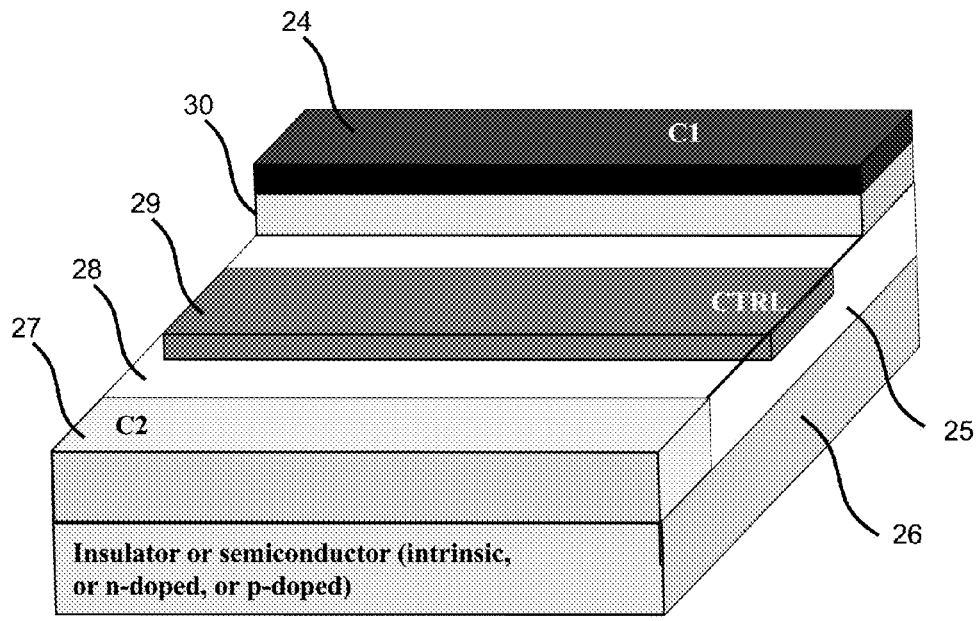
FIG. 5 shows a tridimensional view of a possible implementation of the embodiment of FIG. 4.

FIG. 5 depicts a tridimensional view of a possible implementation of the embodiment of FIG. 4. In the latter two embodiments, the characteristic of the capacitance as a function of the control voltage can be very abrupt (especially if the p+ region is placed further from the C1 oxide). To obtain a more analog behavior of the capacitance variation, the control voltage can be applied to the C2 terminal with respect to both the CTRL and C1 terminals, so as to exploit also the accumulation and/or depletion and/or inversion of the region underneath the oxide to change the capacitance value (if desired, this control configuration can be used for any transcap device). The advantages and disadvantages of this control configuration are discussed more in detail later in this document.

F FIG. 6

Figure 6:
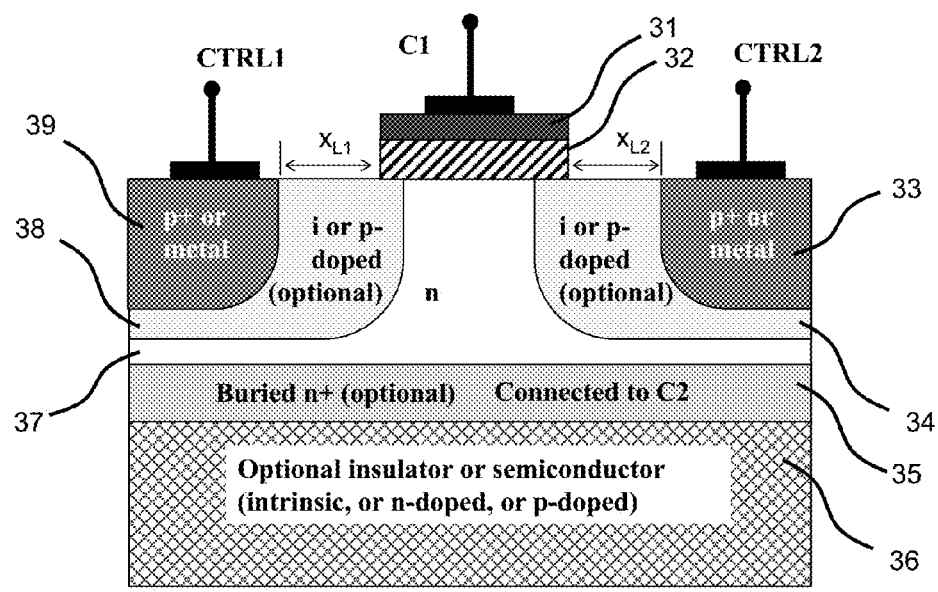
FIG. 6 shows a cross section view of a semiconductor variable capacitor according to a further embodiment of the invention, where an extra control region has been added to the structure.

In order to reduce the control voltage required to achieve the maximum tuning range of the device, a second control region can be added to the structure as shown in FIG. 6. The presence of the second control region allows for the reduction of the voltage required to deplete the semiconductor area under the oxide 32. In this case the n-doped region 37 can be contacted laterally (by placing one or more n+ implantations/regions on at least one side of the illustrated structure, as shown for example in FIG. 7 or 8), or through one or more C2 implantations/regions placed in the third dimension (i.e. in the direction perpendicular to the drawing shown in FIG. 6, as shown for example in FIG. 10 or 11), or directly underneath (by removing region 36 and placing a contact directly on the back of the die where the structure is fabricated). Also in this case (as in all the embodiments herein discussed) each control region can be partially overlapped with the C1 oxide or it can be spaced apart from it so as to maximize the capacitance tuning range. Furthermore, one or more p-doped (or n-doped, or intrinsic or near-intrinsic) regions can be added to the structure so as to increase the breakdown voltage of the pn junctions and/or reduce the parasitic capacitances associated with the control terminals.

G FIG. 7

Figure 7:
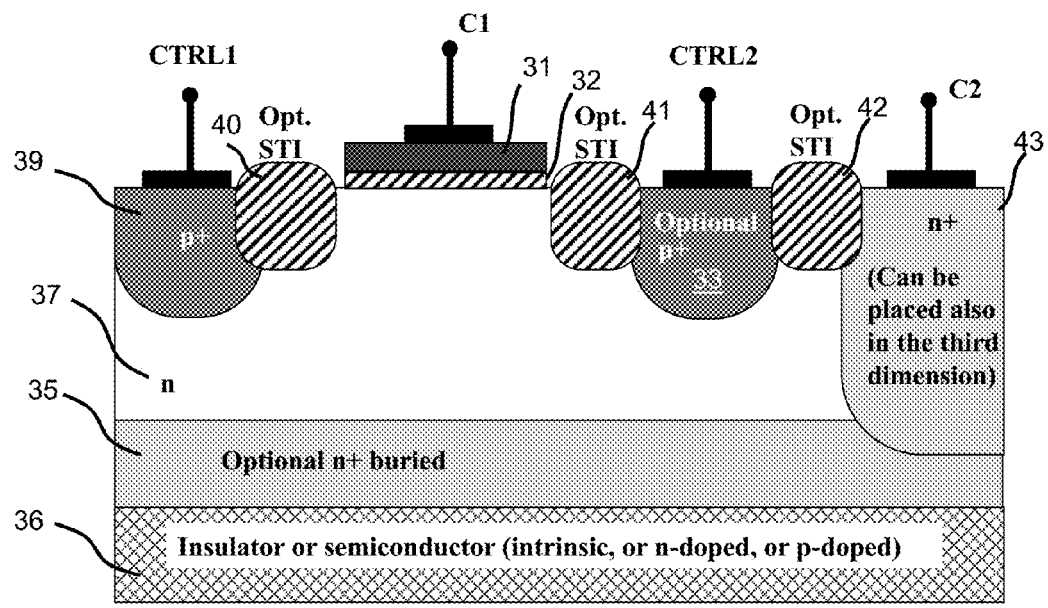
FIG. 7 shows a possible implementation of the embodiment of FIG. 6, where the C2 region has been formed laterally with respect to one control region.

To further minimize the parasitic resistance associated with the C2 terminal, a buried implantation 35 can also be added to the structure. Also in this case, if desired, the C2 sink implantation/region can be placed laterally, i.e. the n+ sink region is formed on at least one side of the illustrated structure as shown in FIG. 7 or in the third dimension, i.e. in the direction perpendicular to the drawing of FIG. 6. Alternatively, the optional layer 36 can be omitted and the buried n+ layer 35 can be contacted directly at the bottom of the structure (this configuration is very appealing if the transcap device is realized as a discrete component; in this case, the utilized substrate is usually a n-type substrate with a bottom contact placed on the lower side of the wafer).

H FIG. 8

Figure 8:
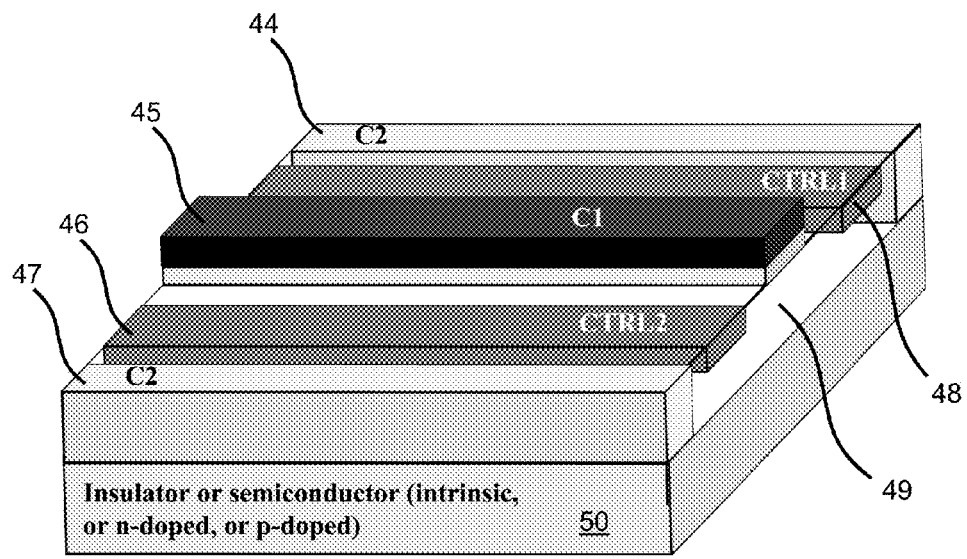
FIG. 8 shows a tridimensional view of a possible implementation of the embodiment of FIG. 6.

FIG. 8 shows a tridimensional view of another possible implementation of the embodiment of FIG. 6. In all the herein described embodiments, one or more p+ regions can be replaced with a Schottky contact (formed in a semiconductor trench or directly on top of a semiconductor layer) and/or the n+ region can be replaced with a metal ohmic contact (formed in a semiconductor trench or directly on top of a semiconductor layer). In all the herein described embodiments, p-doped or intrinsic regions or insulating oxide regions can be added to the structure to increase the breakdown voltage of the control terminal and/or to decrease the parasitic capacitance associated with the control region. Similarly, n-doped or intrinsic regions or insulating oxide regions can be added to increase the device tuning range and/or the device withstanding voltage. Furthermore, if desired, the C1 oxide (and the C1 electrode) can be formed in a semiconductor recess.

I FIG. 9

Figure 9:
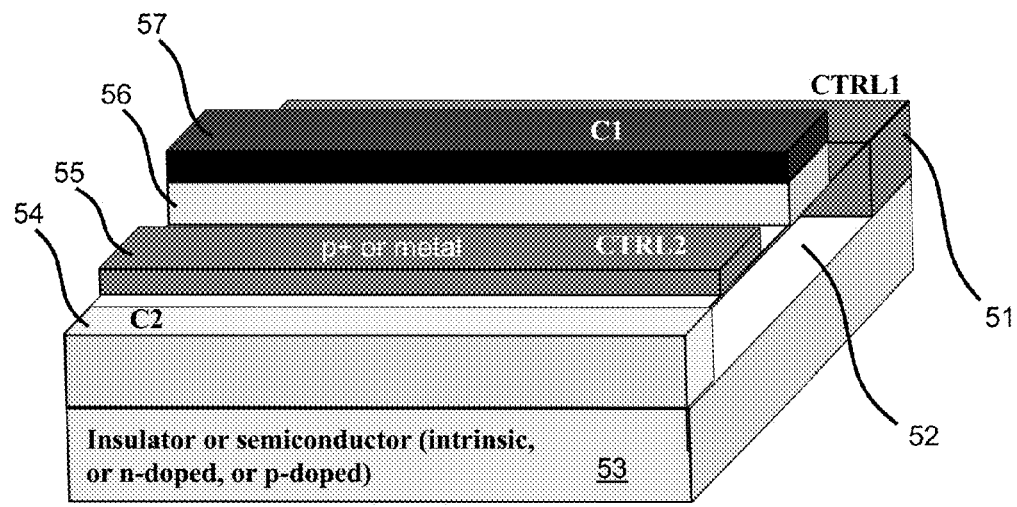
FIG. 9 shows a tridimensional view of a further embodiment of the present invention, where one of the two control regions has been formed above a semiconductor layer.

In FIG. 9 is shown a variation of the embodiment of FIG. 8, where one of the two control regions has been formed above a semiconductor layer 52 (a similar approach can be used for any of the embodiments herein discussed). The control region 55 can be formed with a metallic material so as to form a Schottky contact with the n-region underneath or with a doped semiconductor material (with crystalline or poly-crystalline or amorphous structure). Region 51 has been instead extended down to region 53. Alternatively, also region 51 could have been placed above region 52 or it could have been limited to the upper portion of region 52 without being in contact with region 53 (as region 48 in FIG. 8).

J FIG. 10

Figure 10:
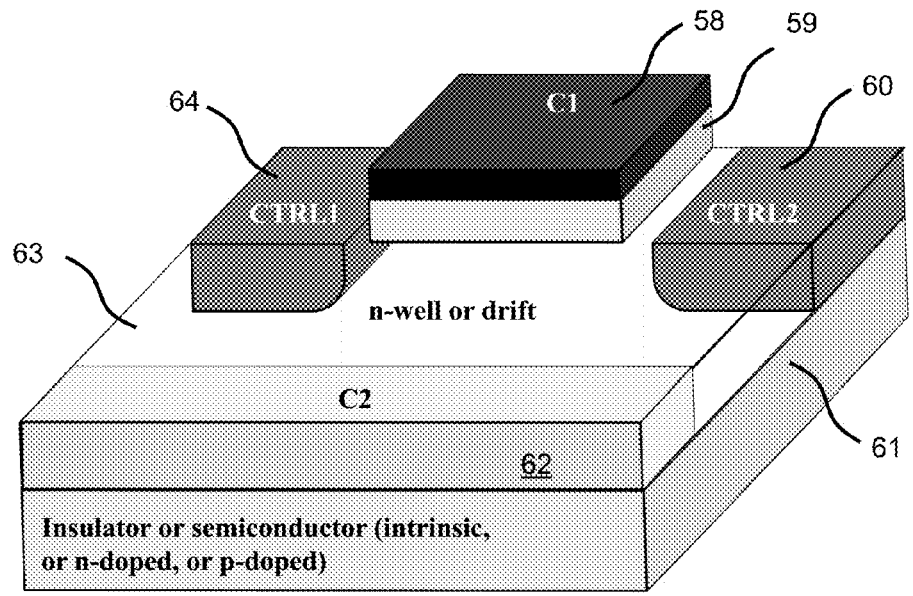
FIG. 10 shows a tridimensional view of another possible implementation of the embodiment of FIG. 6, wherein the C2 region has been placed in the direction perpendicular to the cross-section of FIG. 6.

FIG. 10 shows a tridimensional view of another possible implementation of the embodiment of FIG. 6, wherein the C2 region has been placed in the direction perpendicular to the cross-section of FIG. 6. In all the embodiment herein described, the control configuration significantly influences the performance of the Transcap device: the different control regions can be controlled with different control/bias voltages or through the same voltage; they can be shorted together or they can be biased through different impedance paths.

K FIG. 11

Figure 11:
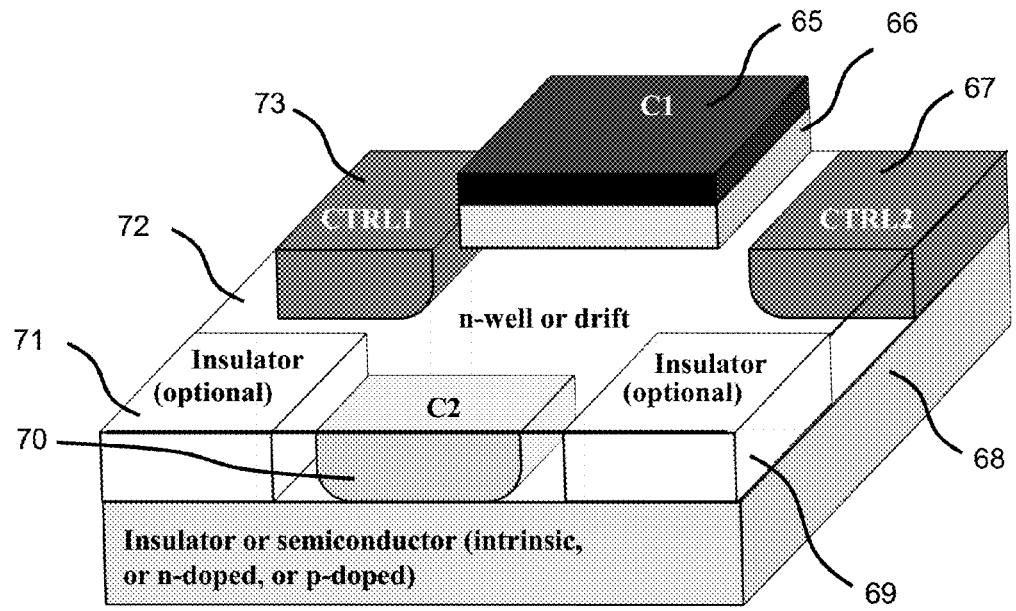
FIG. 11 shows a tridimensional view of a further embodiment of the present invention obtained from the one of FIG. 10 by limiting the extension of the C2 region to the length of the C1 electrode.

Many layout variants are also possible for the C2 region. For example the n+ region can extend as shown in FIG. 10 or it can be limited to the C1 length as shown in FIG. 11 (obviously, also intermediate dimensions or dimensions smaller than the C1 length are possible). Furthermore, as shown in FIG. 11, two or more isolation regions can be added to the structure.

L FIG. 12

Figure 12:
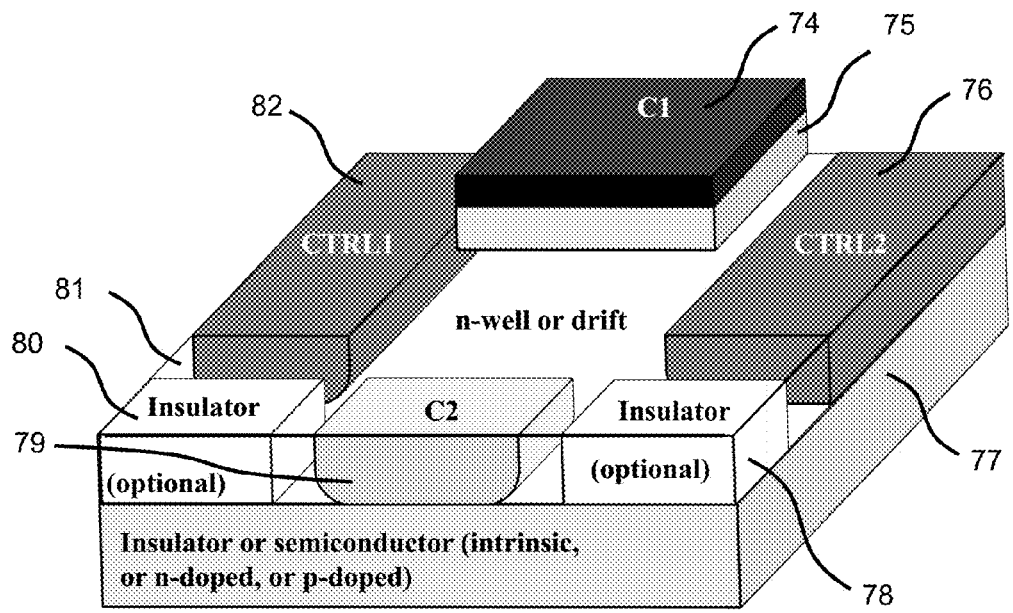
FIG. 12 shows a tridimensional view of a further embodiment of the present invention, wherein the control regions have been extended further in the direction towards the C2 region.

Each control region can be extended through a portion of the C1 width, or for the entire C1 width as shown in FIG. 8-11, or even further e.g. towards the C2 region as shown in FIG. 12. In the embodiment of FIG. 12 the portion of the control region between C1 and C2 is mainly used to extend the depletion region towards the C2 terminal so as to maximize the tuning range.

M FIG. 13

Figure 13:
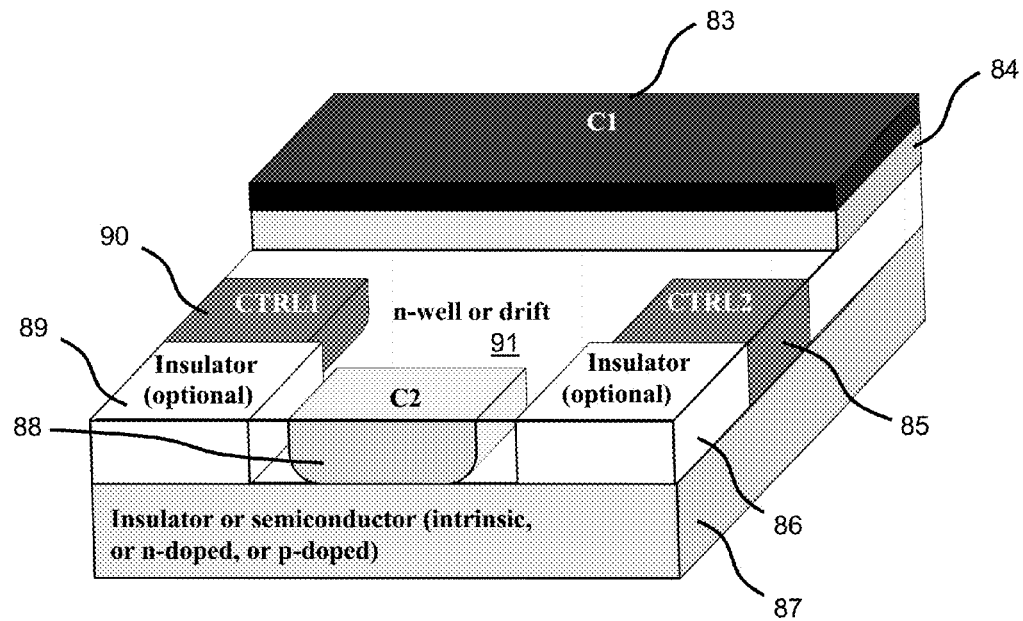
FIG. 13 shows a tridimensional view of a further embodiment of the present invention, wherein the control regions have been limited in the region between C2 and C1.

In general, the C2 region (or regions) and the control region (or regions) can be combined in many other different ways. For example, as shown in FIG. 13, the two control regions may be limited in the region between the C1 terminal and the C2 region. Obviously, also in this embodiment each control region may be partially overlapped with the C1 oxide or it can be spaced apart from it and/or one or more p-doped (or intrinsic or near-intrinsic) regions can be added to the structure. The C1 region may be limited between the two control regions without extending behind the control regions (in this case the C1 width is comparable with the distance between the two control regions similarly to what shown in FIG. 12), or it may be extended behind the control regions as shown in FIG. 13. If desired, the C1 region may be also T-shaped so as to extend the C1 region 83 (and oxide 84) between the two control regions 90 and 85 and at the same time behind them (a similar approach can be used in many other embodiments; in general in any embodiment the C1 region and oxide can be formed with any shape, such as for example triangular, trapezoidal, rectangular, square, octagonal, hexagonal, circular, "T", cross, or oval shape). Furthermore, in any embodiment herein described, the C1 oxide can be formed thicker in certain regions and thinner in others, or it can be formed with a non-planar periodic pattern (e.g. so as its interface with the semiconductor underneath resembles a square wave) as described more in detail in the regular patent application U.S. Ser. No. 13/068,161 entitled "Semiconductor Variable Capacitor", filed by the same applicants on May 5, 2011.

N FIG. 14

Figure 14:
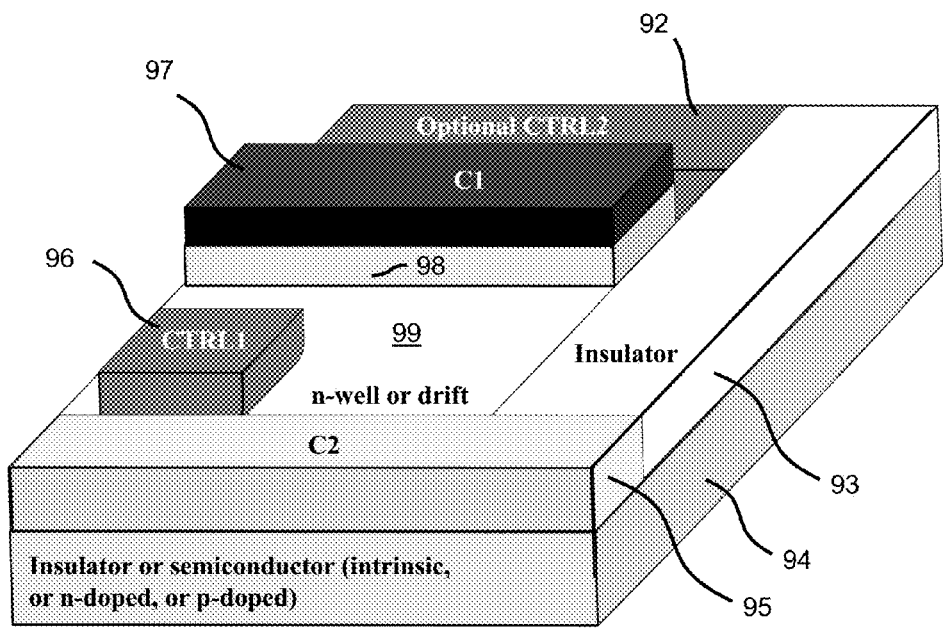
FIG. 14 shows a variation of the embodiment of FIG. 13, where one of the two control regions has been replaced with an insulating region extending laterally behind the C1 region.

In the embodiments of FIG. 10-13 (as in any other embodiment herein described which presents multiple control regions), one of the control regions may be also replaced with an insulator region, so as the depletion region of the pn junction against the insulator can be used to isolate the C2 terminal from the semiconductor interface under the C1 oxide. If one of the two control regions is replaced with an insulating region, such insulating region may be also extended laterally (or underneath C1) behind the C1 terminal as shown in FIG. 14. Furthermore, as shown in FIG. 14, an optional extra control region 92 extending parallel to the C1 terminal can be also added behind the C1 region.

O FIG. 15

Figure 15:
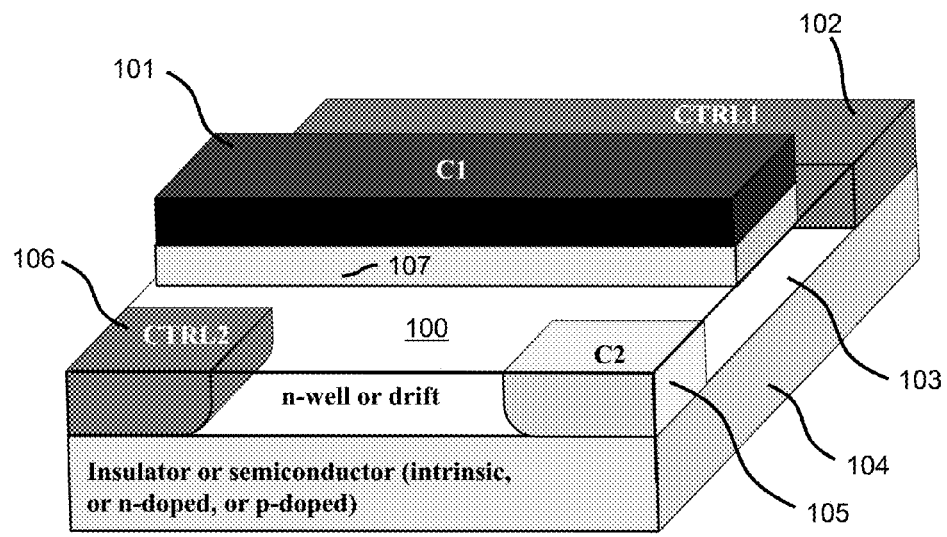
FIG. 15 shows a tridimensional view of a further embodiment of the present invention, wherein only one control region extends along the longitudinal direction of the C1 terminal.

Another possibility is to use the configuration of FIG. 15, where only one of the two control regions extends parallel to the C1 terminal. Another interesting embodiment can be also derived from the one of FIG. 15 by mirroring the structure with respect to the right side, so as the C2 region is formed between two control regions.

P FIG. 16

Figure 16:
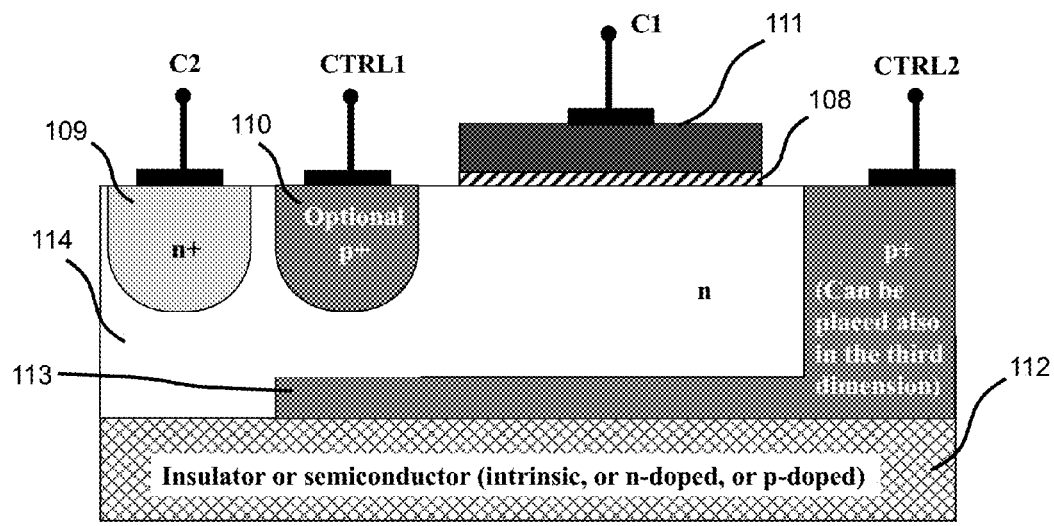
FIG. 16 shows a cross section view of a semiconductor variable capacitor according to a further embodiment of the invention, where a p+ buried region has been added to increase the control on the depletion region.

As shown in FIG. 16, also the vertical widens of the depletion region can be exploited by adding a p+ buried region (and/or a buried oxide). In this embodiment region 110 is optional and can be used both to modulate the depletion region underneath the C1 oxide and to pinch off the conductive path underneath itself. In all the previous embodiments, the buried region (when present) can extend partially or entirely underneath the C1 oxide, or it can be limited underneath a control region (e.g. region 110 in FIG. 16) depending on the required performance.

R FIG. 17

Figure 17:
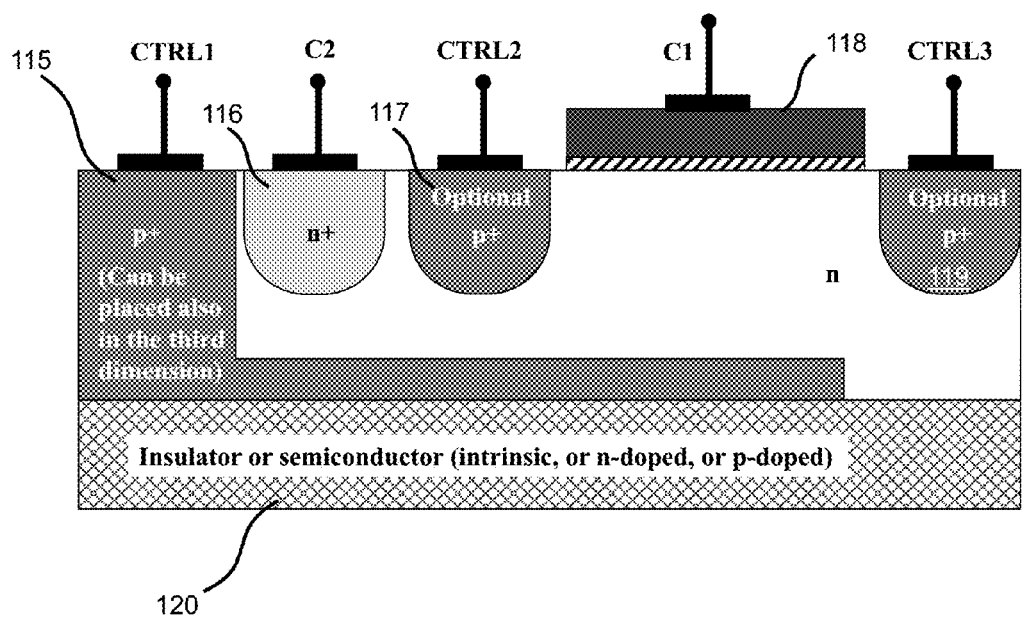
FIG. 17 shows a variation of the embodiment of FIG. 16, obtained by adding a third control region.

FIG. 17 shows a variation of the embodiment of FIG. 16, obtained by adding a third control region. Also in this case, optional regions (region 117 and/or region 119) are present. By adding region 117, the control voltage required to isolate the C2 terminal from the C1 oxide decreases. Furthermore, region 117 and region 119 can contributes to modulate the depletion region underneath the oxide from the left and right side of the C1 oxide, respectively.

S FIG. 18

Figure 18:
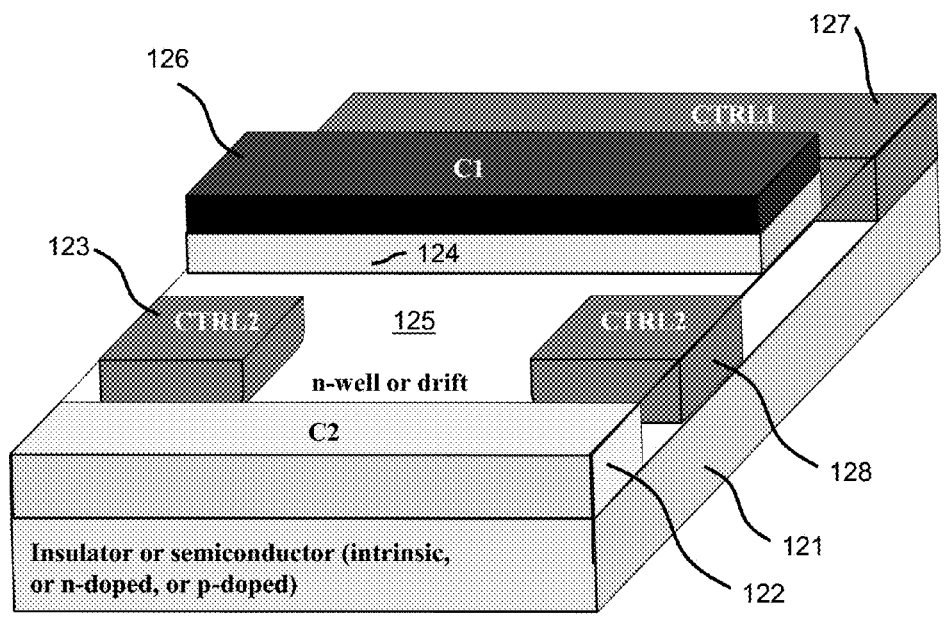
FIG. 18 shows tridimensional view of a further embodiment of the present invention, wherein three control regions have been used to control the capacitance between C1 and C2.

In general, the presence of a third control region allows for an extra degree of freedom in the design of the Transcap device. FIG. 18 depicts another embodiment of the disclosed invention which exploits three control regions. In this embodiment the main function of the control region 127 is to modulate the capacitance as a function of the control voltage maintaining the analog behavior of the structure: when the depletion region generated from the control region 127 widens underneath the dielectric 124, the capacitance as a function of the control voltage decreases in an analog fashion. The two control regions 123 and 128 are used to increase the tuning range: when the depletion regions generated from the two control regions 123 and 128 get in contact (for a control voltage greater than a threshold value) the C2 region 122 is isolated from the interface between the dielectric layer 124 and the semiconductor region 125, which results in a lower minimum capacitance between C1 and C2. In this embodiment, as in any other embodiment herein described, a buried region (obtained through implantation or epitaxial growth) connected to C2 or to a CTRL terminal can be added under the structure to increase the quality factor or the control on the device characteristic. As in any other embodiment herein described, an extra n-doped region (doped with a higher impurity concentration with respect to the n-well) can be added between the C2 region and the C1 oxide (e.g. limited between the two control regions 123 and 128) so as to improve the device performance.

T FIG. 19

Figure 19:
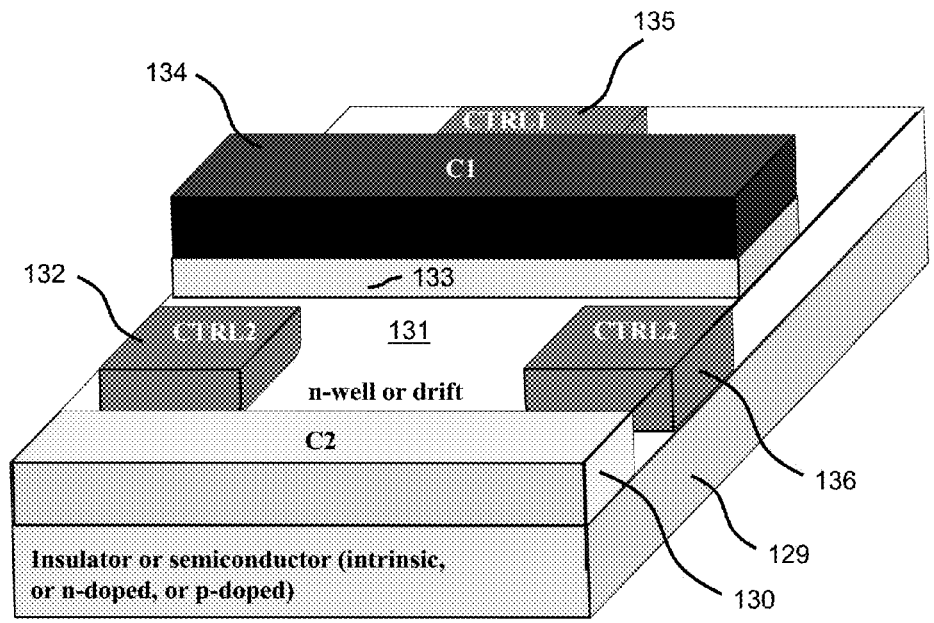
FIG. 19 shows a variant of the embodiment of FIG. 18, where the control regions have been placed in an alternated fashion around the C1 terminal.

As shown in FIG. 19, the control regions can also be placed in an alternate fashion around the C1 terminal. Many other variants can be obtained as shown for example in FIG. 20-23. As in any other embodiment of the present invention, each control region can be partially overlapped with the C1 oxide or it can be spaced apart from it so as to decrease the parasitic capacitance. Furthermore, if desired, each control region can be formed in a p-doped (or intrinsic or near-intrinsic) region such as a p-well so as to increase the breakdown voltage of the control (as in any other embodiment of the present invention).

U FIG. 20

Figure 20:
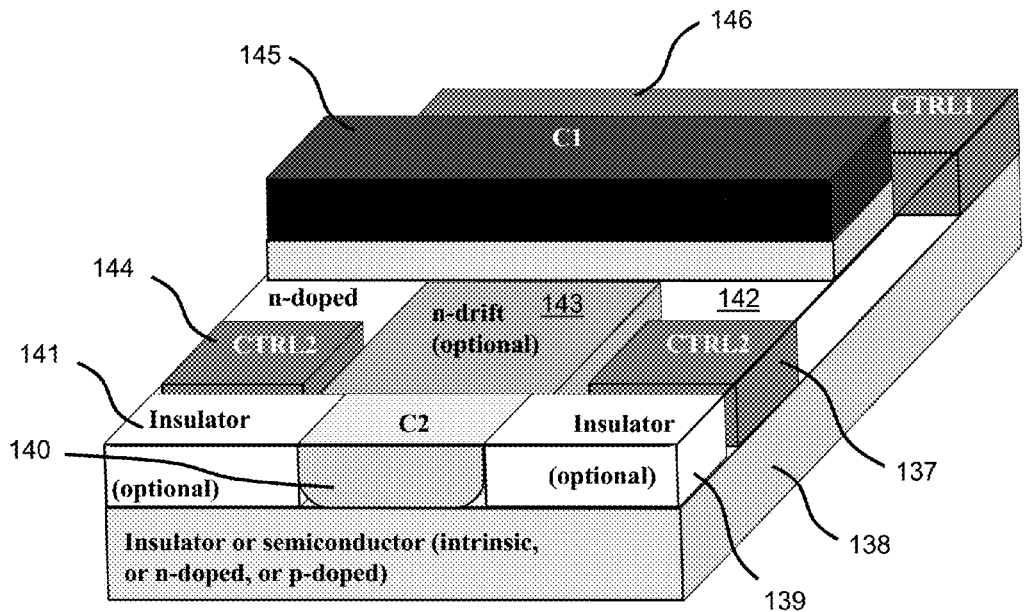
FIG. 20 shows a variant of the embodiment of FIG. 18, where the extension of the C2 region has been limited with respect to the C1 width and an optional n-doped region 143 has been placed between the C2 region and the C1 oxide.

FIG. 20 shows a variant of the embodiment of FIG. 18, where the extension of the C2 region has been limited with respect to the C1 width. In this structure, two insulating regions can be added on the sides of the C2 region so as to decrease the parasitic capacitance associated to the control regions. Furthermore an optional n-doped region 143 (doped with a higher impurity concentration with respect to the n-well) has been placed between the C2 region and the C1 oxide so as to improve the device performance (the optional n-doped region 143 may be limited between the two control regions 137 and 144 as shown in FIG. 20 or it may be extended for the entire C1 width so as to overlap the control regions). As previously discussed, an extra n-doped region (doped with a higher impurity concentration with respect to the n-well) may be added between the C2 region and the C1 oxide in any other embodiment herein discussed.

V FIG. 21

Figure 21:
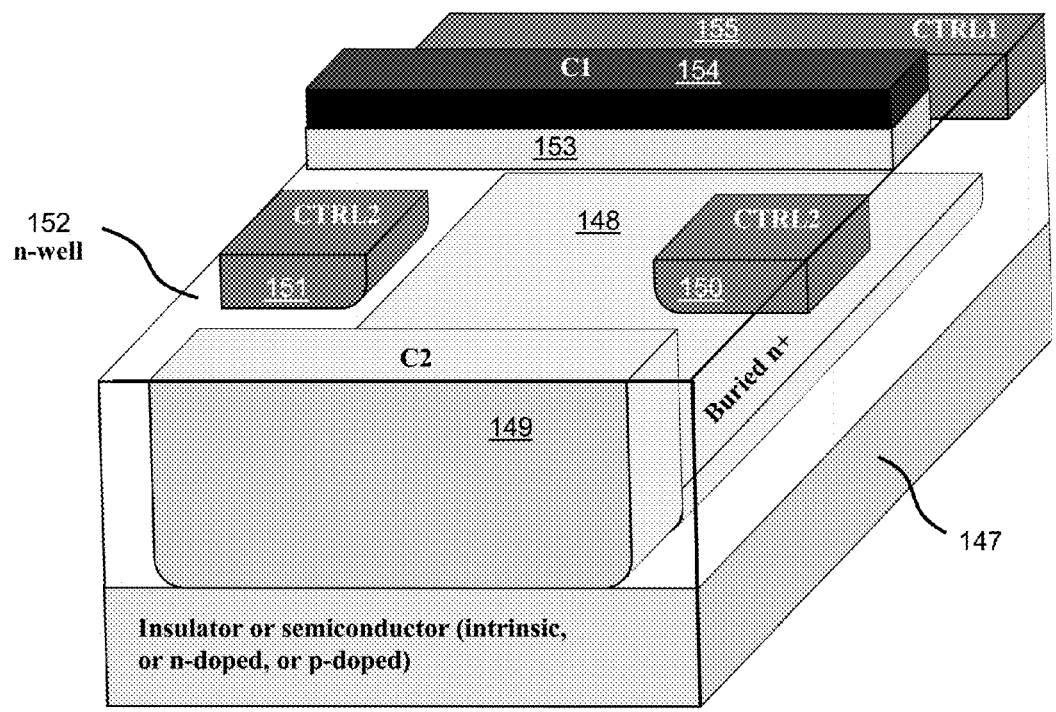
FIG. 21 shows a further variant of the embodiment of FIG. 18, where a n+ buried region has been added under the structure to increase the quality factor of the device.

FIG. 21 shows a further variant of the embodiment of FIG. 18, where an n+ buried region has been added under the structure so as to increase the quality factor of the device. Also in this structure, if desired, the n+C2 region 149 and/or the buried region 148 can be limited between the two p+ regions (or they may extend for the entire width of the C1 region) and/or two optional insulating regions can be added on the sides of the C2 region so as to decrease the parasitic capacitance associated to the control regions.

W FIG. 22

Figure 22:
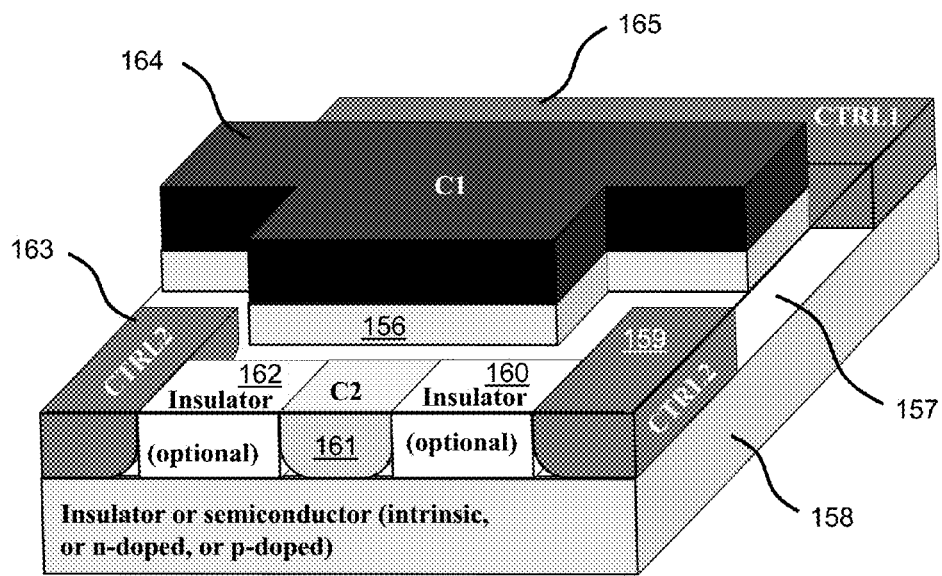
FIG. 22 shows a variant of the embodiment of FIG. 21.

If desired, the C2 region may be formed between the two control regions as shown in FIG. 22. Also in this case, two optional insulating regions can be added on the sides of the C2 region so as to decrease the parasitic capacitance associated to the control regions. Furthermore, in any embodiment herein described, the C1 region can be shaped in many ways. For example, in the embodiment of FIG. 22 the C1 region has been formed with a T-shape so as to extend the C1 region (and oxide) between the two control regions 159 and 163 and at the same time behind them.

X FIG. 23

Figure 23:
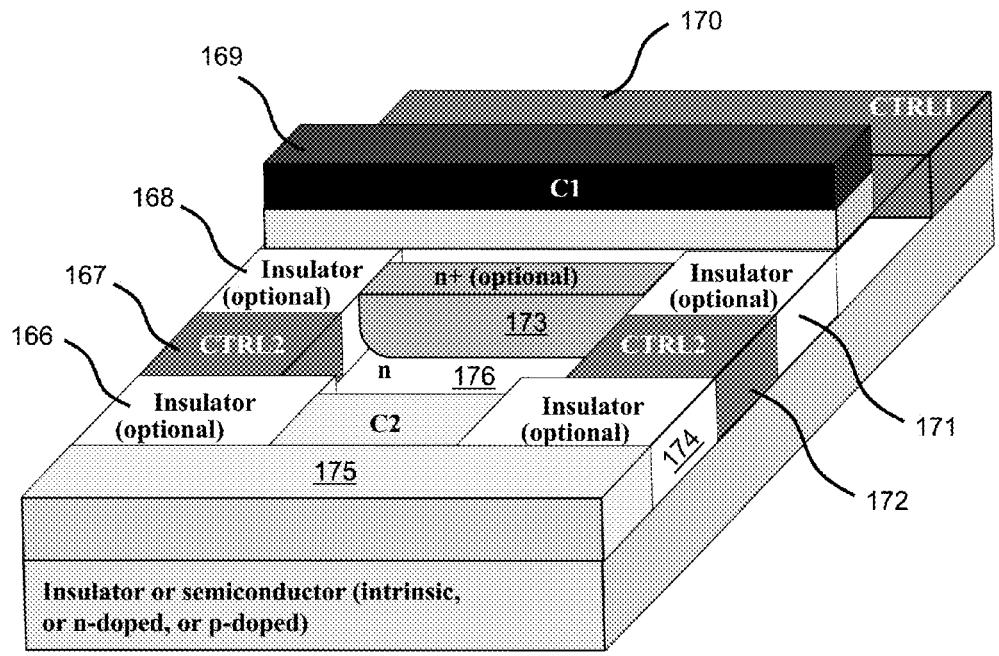
FIG. 23 shows a variant of the embodiment of FIG. 20, where extra insulating regions have been added to the structure so as to decrease the parasitic capacitance associated with the control regions.

FIG. 23 shows a variant of the embodiment of FIG. 20, where extra insulating regions have been added to the structure so as to decrease the parasitic capacitance associated with the control regions. If desired, a highly n-doped region 173 may be interposed between the control regions "167 and 172" and the C1 oxide (extending behind the two control regions 167 and 172 in the case where the two insulating regions 168 and 171 are not present), so as to prevent the depletion region generated from the control region 170 from getting in contact with the depletion region of the two control regions 167 and 172 (the resulting structure can be viewed as a JFET device in series to an embodiment resembling the one of FIG. 1); a similar approach may be used for many other embodiments herein described (such as the ones of FIG. 18-20).

Y FIG. 24

Figure 24:
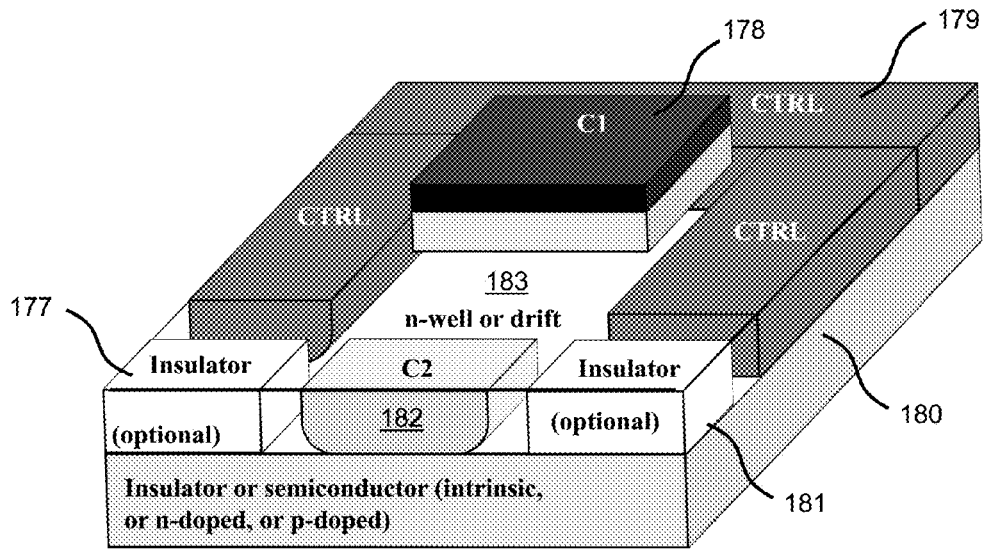
FIG. 24 shows a further embodiment of the present invention, where the control regions surround the C1 terminal on three sides.

As shown in FIG. 24, the control regions can also surround the C1 terminal on three sides so as to increase the control on the depletion region under the oxide. It however important to keep in mind that the greater is the pn junction area and the higher is the parasitic capacitance associated with the control region, which can negatively influence the tuning range of the device.

Z FIG. 25

Figure 25:
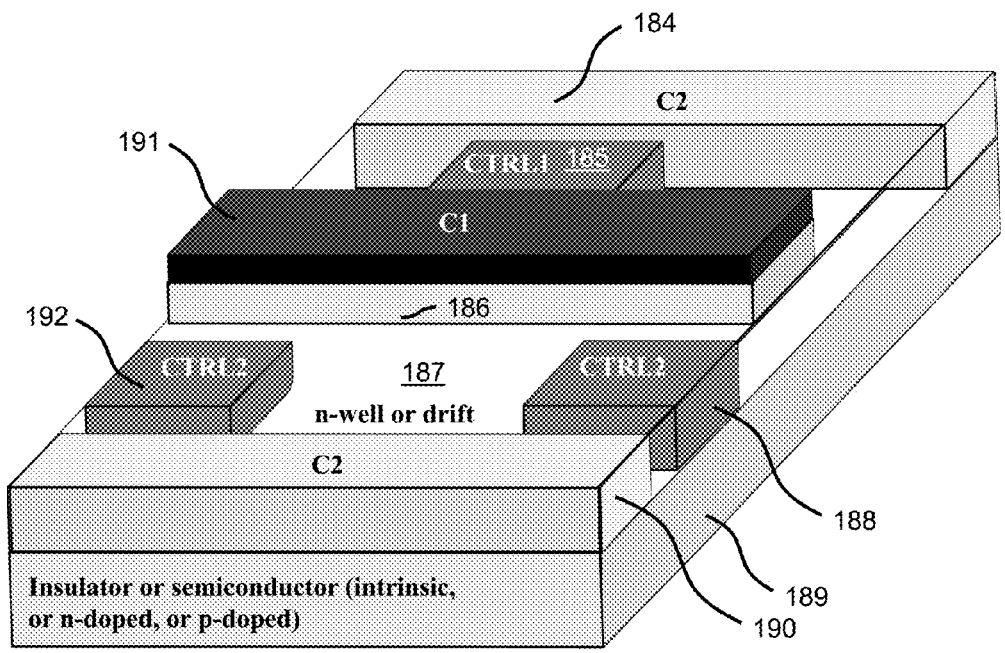
FIG. 25 shows a variation of the embodiment of FIG. 19, where an extra C2 region has been added to the structure, so as to increase the quality factor of the structure.

In all the embodiments herein described, multiple n+ doped C2 regions can be added (in one or more sides of the structure) to increase the quality factor of the device. For example, FIG. 25 shows a variant of the implementation of FIG. 19, where a second C2 region has been added behind the third control region 185.

AA FIG. 26

Figure 26:
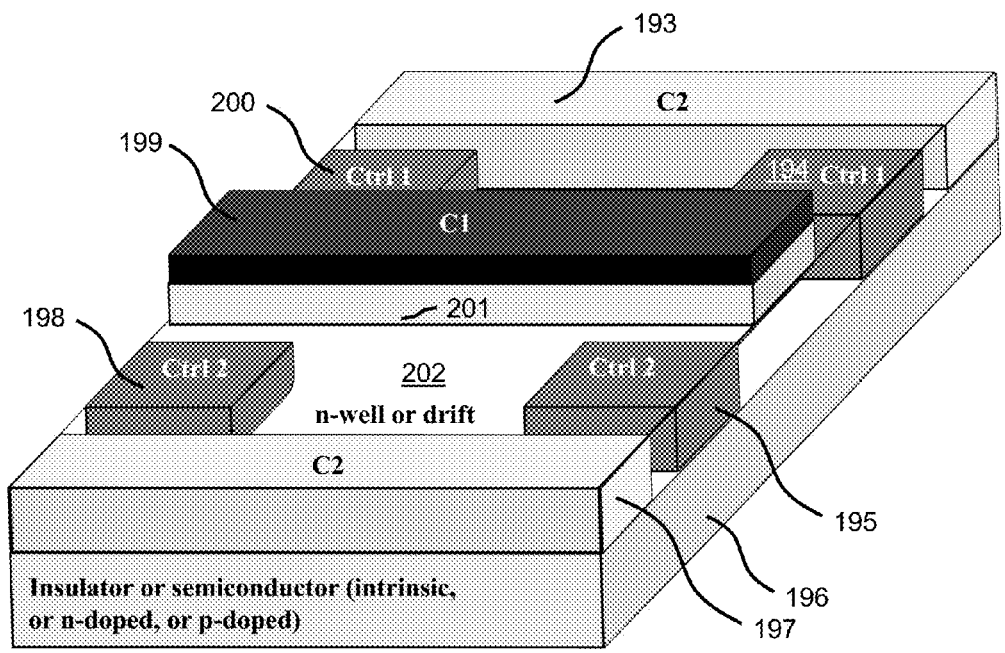
FIG. 26 shows a further embodiment of the present invention, where four control regions are present.

As shown in FIG. 26, the number of control regions can be also greater than three. It is worth to notice that the embodiment of FIG. 25 can be also obtained by placing side by side two structures resembling the one of FIG. 13 in a mirrored configuration. Many other implementations of the Transcap device can be obtained with a similar technique, by mirroring any of the embodiments herein described with respect to one of their sides. In this embodiment, as in any other embodiment herein described, a buried region (obtained through implantation or epitaxial growth) connected to C2 or to a CTRL terminal can be added under the structure to increase the quality factor or the control on the device characteristic.

AB FIG. 27

Figure 27:
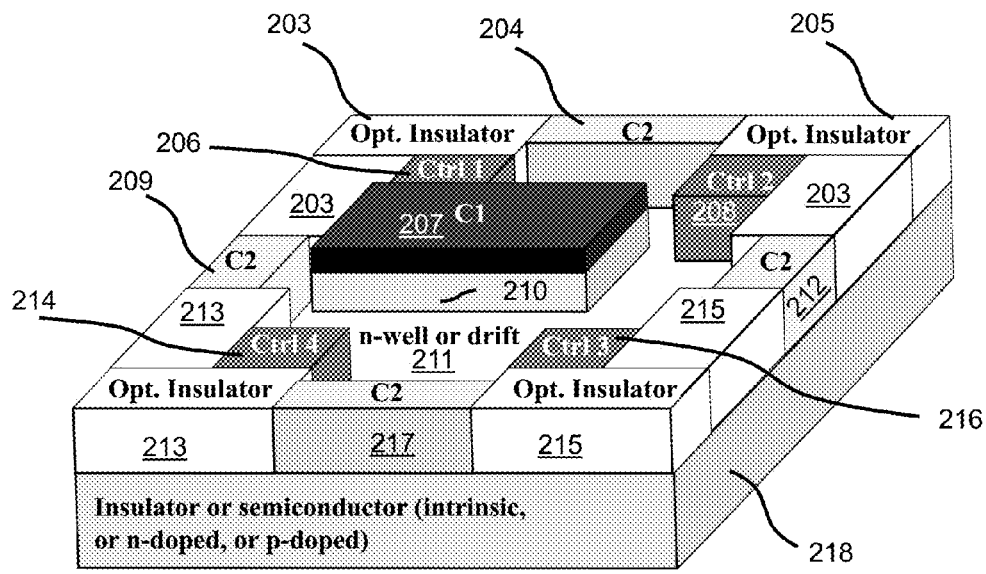
FIG. 27 shows a variation of the embodiment of FIG. 26, where four n+ regions are present.

As shown in FIG. 27, also the number of C2 regions can be also greater than three. Also this embodiment can be derived by placing side by side two structures resembling the one of FIG. 14 in a mirrored configuration.

AC FIG. 28

Figure 28:
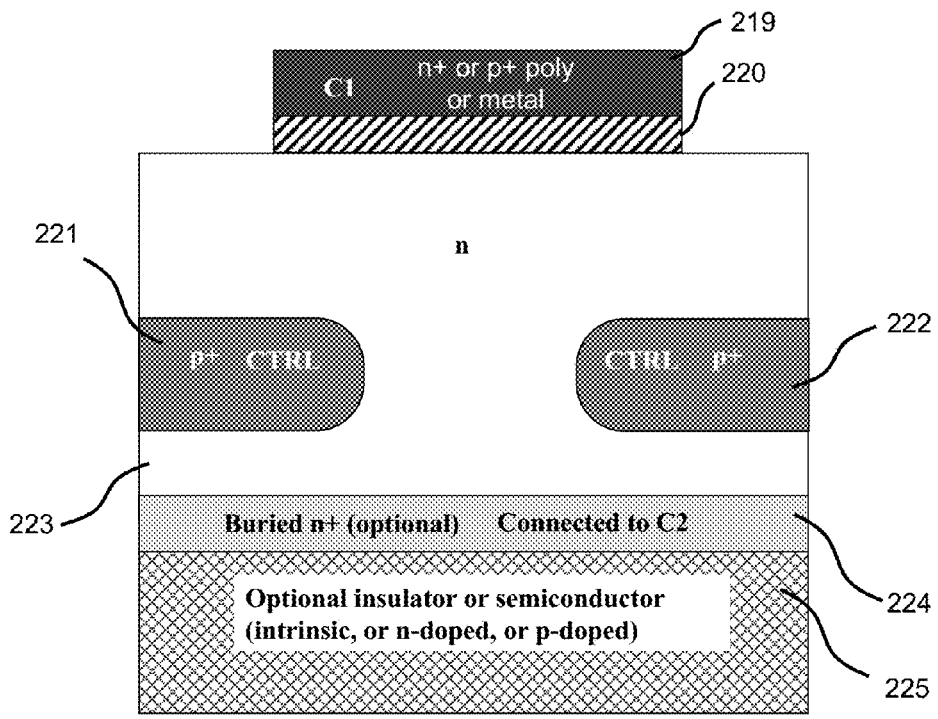
FIG. 28 shows a further embodiment of the present invention, where the C1 oxide has been formed on top of a semiconductor region above the control regions.

Layouts similar to the ones of FIG. 1-27 can also be used to manufacture Transcap structures where the C1 oxide is formed on top of a semiconductor region above the control and/or the C2 implantation as shown for example in FIG. 28, which has been derived from the embodiment of FIG. 6.

AD FIG. 29

Figure 29:
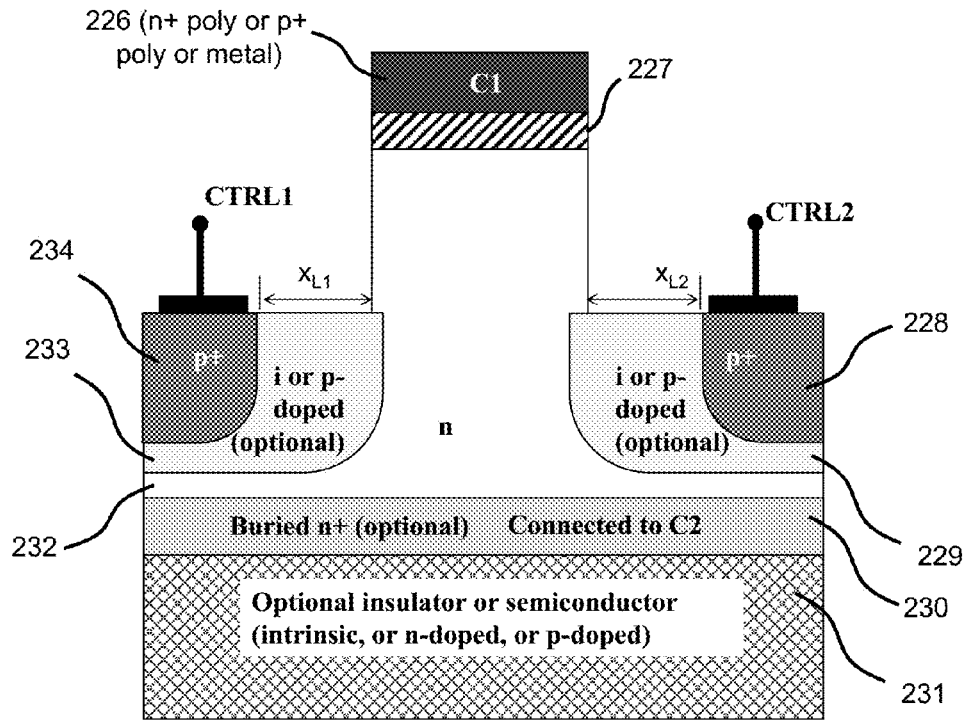
FIG. 29 shows a further embodiment of the present invention resembling the one of FIG. 6, where the C1 oxide has been formed on top of a semiconductor region above the control regions.

FIG. 29 shows a further embodiment of the present invention resembling the one of FIG. 6, where the C1 oxide has been formed on top of a semiconductor region above the control regions. Differently from the embodiment of FIG. 28, an etch process step has been used to delimitate the semiconductor region underneath the C1 terminal. This extra process step allows for the use of superficial implantations instead of buried ones to form the control and/or C2 regions.

AE FIG. 30

Figure 30:
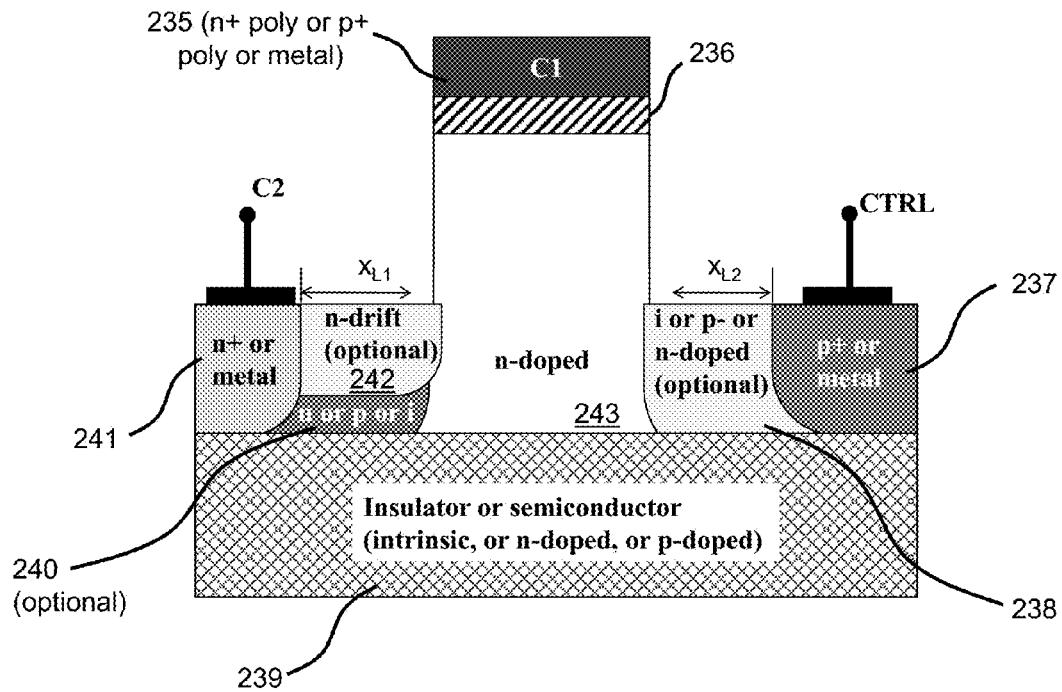
FIG. 30 shows a further embodiment of the present invention resembling the one of FIG. 2, where the C1oxide has been formed on top of a semiconductor region above the control regions.

FIG. 30 shows a further embodiment of the present invention where the C1 oxide has been formed on top of a semiconductor region above the control and C2 regions derived from the layout of FIG. 2.

AF FIG. 31

Figure 31:
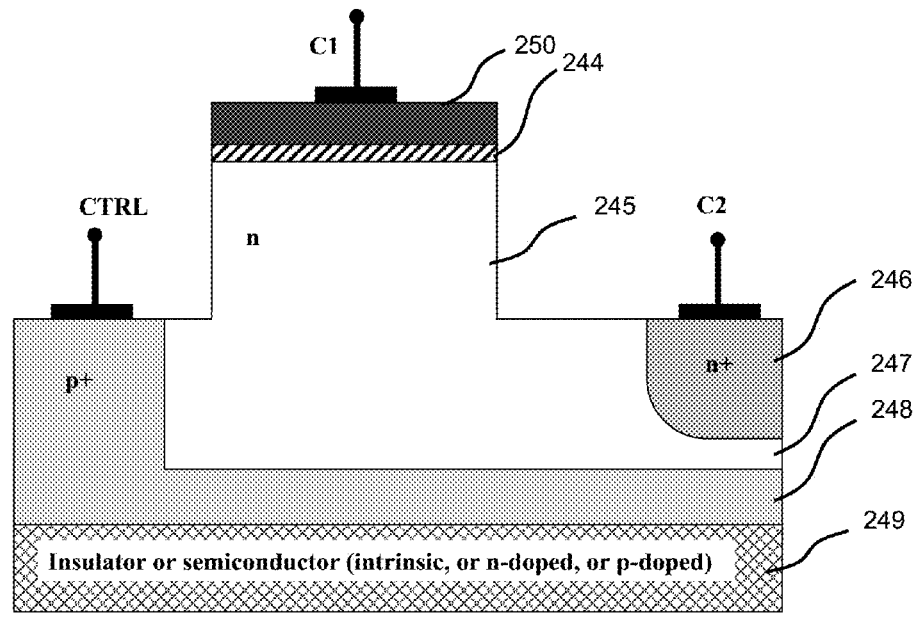
FIG. 31 shows a further embodiment of the present invention obtained from a possible implementation of the embodiment of FIG. 2, where, however, the C1 oxide has been formed on top of a semiconductor region above the control regions.

FIG. 31 shows a further example of how to modify another possible implementation of the structure of FIG. 2, so as to the C1 oxide is formed on top of a semiconductor region above the control and C2 regions.

AG FIG. 32

The embodiments illustrated above are based on a MOS structure. This makes the capacitance value dependent on the $V_{C1C2}$ voltage between the C1 and C2 terminals. In order to decrease the capacitance dependence on the $V_{C1C2}$ voltage and, at the same time, increase the specific capacitance per area, the embodiment of FIG. 32 can be utilized. As it can be seen this embodiment is similar to the one shown in FIG. 2, with the exception that a multiplicity of small semiconductor pillars have been formed above the semiconductor layer 259. Above these semiconductor pillars, the capacitance dielectric 260 and the C1 region 251 have been formed. The upper portion or the entire semiconductor pillar can be heavily doped in order to maximize the specific capacitance and make the MOS system almost independent from the $V_{C1C2}$ voltage. In general, the pillars can be formed with n-doped, p-doped or un-doped semiconductor (with crystalline, poly-crystalline or amorphous structure) or with metallic materials.

The operation principle of this embodiment is similar to the one of the structure illustrated in FIG. 1, with the difference that the capacitance characteristic as a function of the control voltage presents a more quantized behavior: by increasing the voltage of the control terminal 253 toward negative values with respect to the C2 region 257, one or more of the semiconductor pillars are isolated from the n+ region 257, thus decreasing the capacitance of the device. If the device is not optimized, the capacitance characteristic, as a function of the control voltage, assumes therefore a stairs like shape. The more the control voltage increases toward negative values, the more pillars are isolated thus creating a sequence of step transactions for the capacitance value.

By optimizing the height, width and doping profile of the different pillars, the dependence of the device capacitance as a function of the control voltage can be made more linear. For example by lowering the height of the pillars, the step transitions are smoothed out to the point that a linear control range can be identified.

Figure 32:
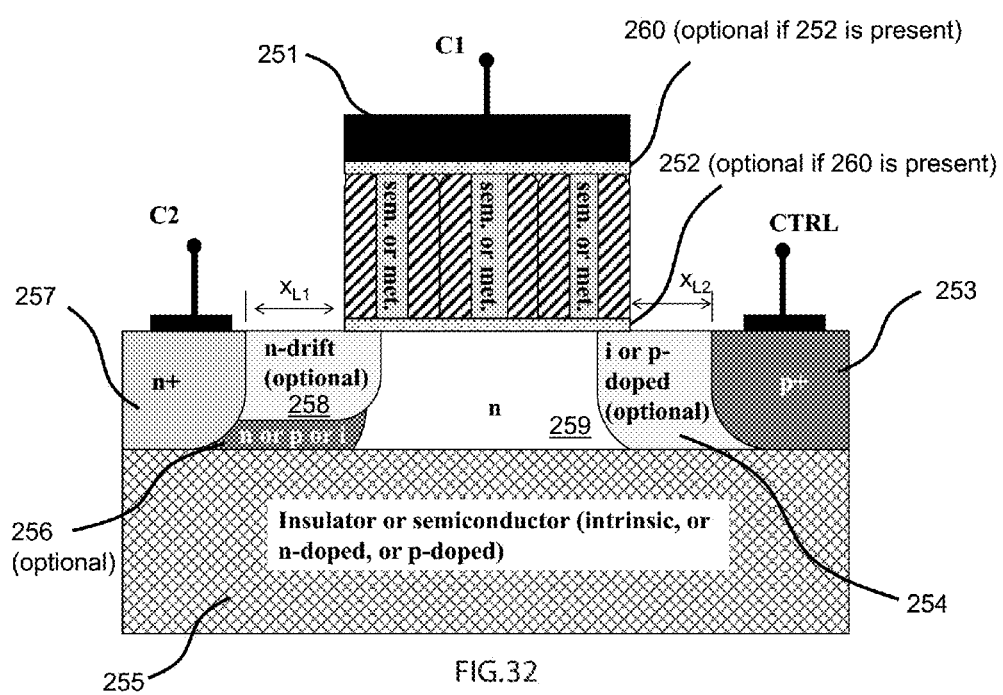
FIG. 32 shows an example of implementation of a transcap device of FIG. 2 in multi-pillar configuration.

In order to reduce the quantized nature of the structure illustrated in FIG. 32, the dielectric layer 252 can be inserted between the semiconductor pillars and the semiconductor layer 259. In this case the extra dielectric 252 improves the CV characteristic of the device, smoothing out the capacitance variation as a function of the control voltage. If the lower dielectric 252 is present, the upper dielectric layer 260 of FIG. 32 can also be omitted (if desired) and the pillars can be directly connected to the C1 terminal in order to increase the capacitance density and simplify the manufacturing process. If the top portion of the pillars is not highly doped and/or if the dielectric layer 252 is present, a more analog behavior can be also obtained by applying the control voltage to the C2 terminal with respect to both the CTRL and C1 terminals, so as to exploit also the carrier population change at the oxide/semiconductor interface to change the capacitance value.

If desired, the highly conductive portion of the semiconductor pillars, or even the entire pillars, can also be realized using metallic materials. It is important to notice that the semiconductor (or metallic) pillars, which can be formed with semiconductor trench process steps or deposition techniques, can be shaped differently one from each other.

If the highly doped regions (or metallic regions) inside the pillars extend down to the oxide layer 252, the pillar structures can be formed as an array of MOSFET gates, one near the other, by utilizing the polysilicon (o metal) gate regions as pillars. Alternatively, the pillar structures can be formed for example with a deposition or an epitaxial process step followed by an etching step.

AH FIG. 33

Figure 33:
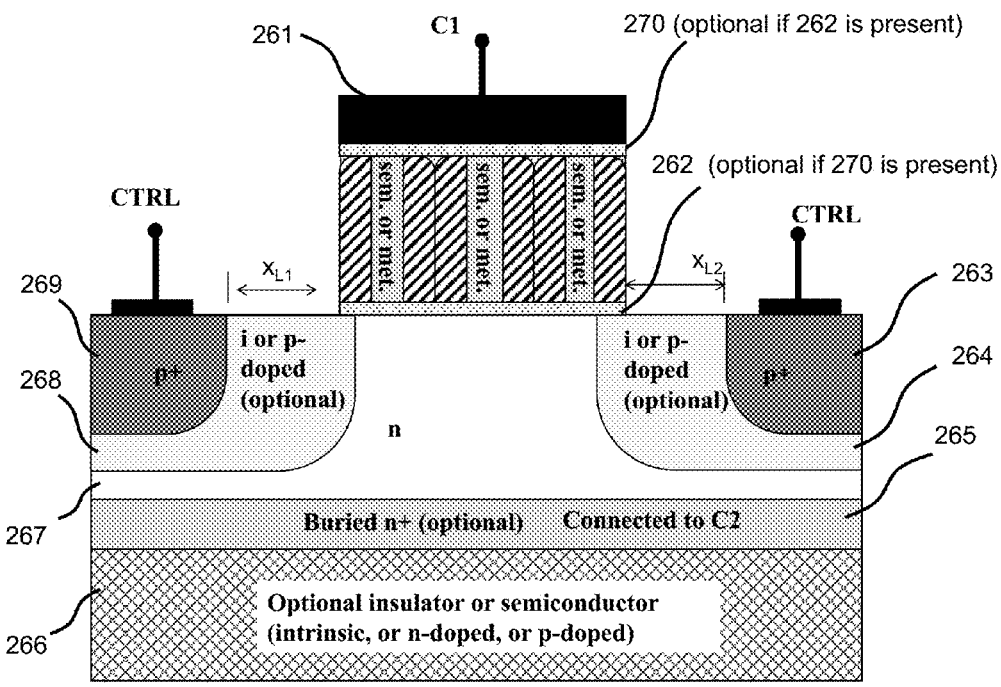
FIG. 33 shows an example of implementation of a transcap device of FIG. 6 in multi-pillar configuration.

In order to reduce the control voltage required to achieve the maximum tuning range of the device, a second control region can be added to the structure as shown in FIG. 33. The presence of the second control region allows the reduction of the voltage required to deplete the semiconductor area under the oxide 262. Also in this case the C2 implantation can be placed laterally to at least one of the control regions 263 and 269, or in the third dimension, i.e. in the direction perpendicular to the cross section shown in FIG. 33.

If desired also a buried implantation 265 can be added to the structure as shown in FIG. 33, in order to minimize the parasitic resistance associated with C2. Also in this case, the C2 sink implantation can be placed laterally to the structure or in the direction perpendicular to the shown cross section. Alternatively, the optional layer 266 can be omitted and the buried n+ layer can be contacted directly on the lower side of the structure (this configuration is very appealing if the transcap device is realized as discrete component; in this case the utilized substrate is usually an n-type substrate with a bottom contact placed at the lower side of the wafer). All the embodiments herein described can be adapted to use a multi-pillar configuration as a capacitance plate, by using a similar method to the one used to modify the structures of FIGS. 2 and 6 to obtain the embodiments of FIGS. 32 and 33, respectively.

AI FIG. 34

In general a transcap device can be realized also in process technologies involving a trench MOS configurations. An example of implementation of the current invention in trench MOS process technology is illustrated in FIG. 34.

AJ FIG. 35

Figure 34:
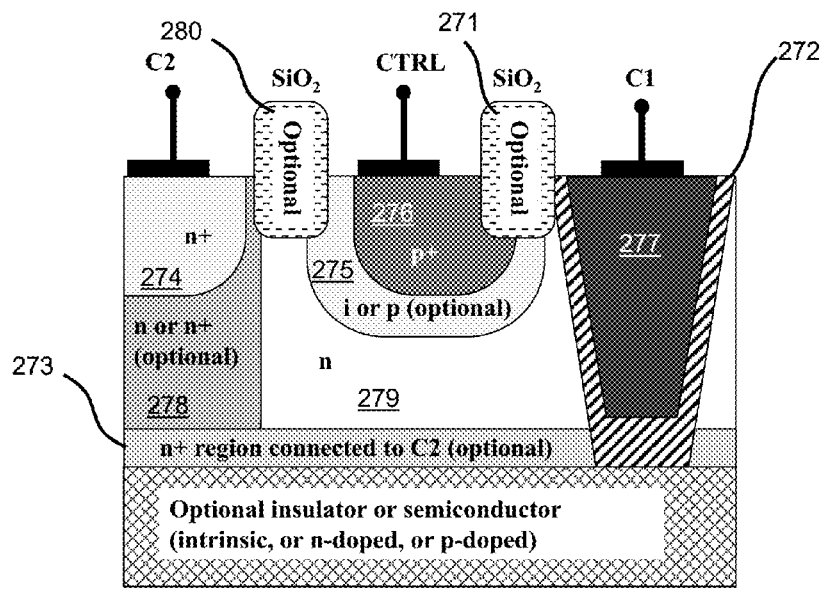
FIG. 34 shows an example of implementation of a transcap device in trench MOS technology.
Figure 35:
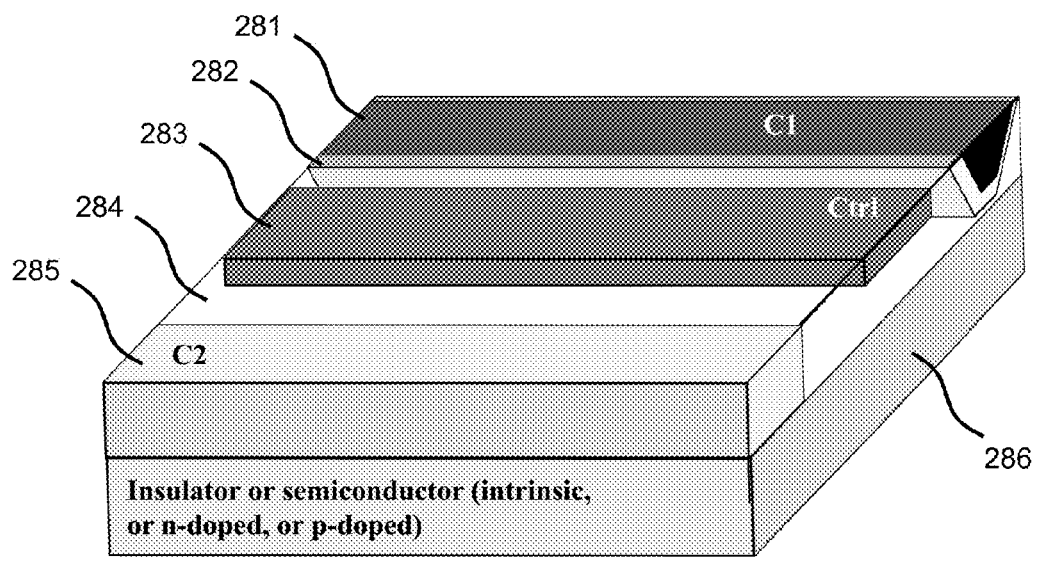
FIG. 35 shows a tridimensional view of a possible implementation of the embodiment of FIG. 34.

FIG. 35 depicts a tridimensional view of a possible implementation of the embodiment of FIG. 34.

AK FIG. 36

Figure 36:
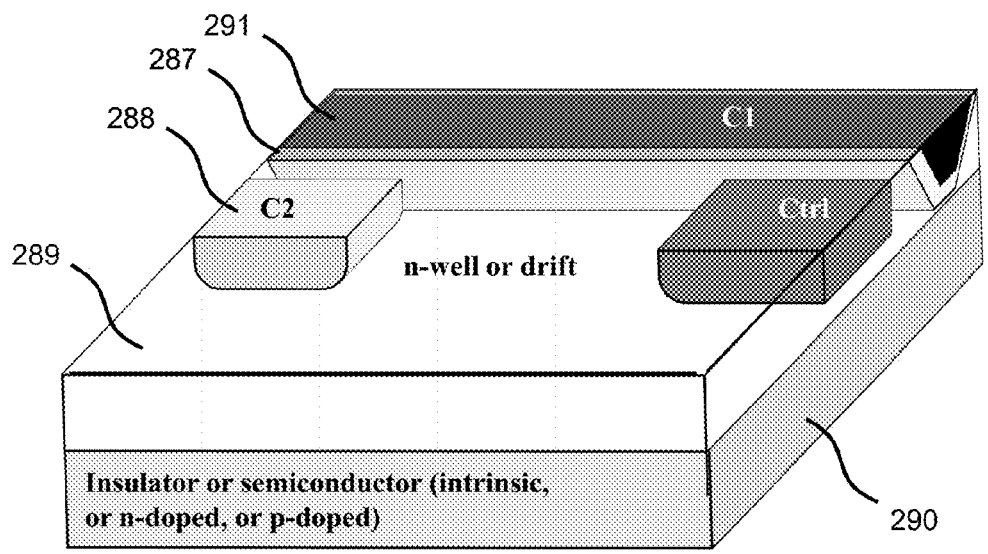
FIG. 36 shows a variant of the embodiment of FIG. 34, where also the extension of the depletion region in the direction longitudinal to the C1 terminal is used to modulate the capacitance between C1 and C2.

The embodiments of FIGS. 34 and 35 mainly exploits the vertical extension of the depletion region to control the capacitance value. As discussed for the previous embodiments, also in the case of trench MOS structures, the control regions and/or C2 regions can be placed in many ways in order to optimize the device performance. For example, the embodiment of FIG. 36 mainly exploit the depletion region extension in the longitudinal direction (with respect to the C1 terminal) to modulate the capacitance value between C1 and C2.

AL FIG. 37

Figure 37:
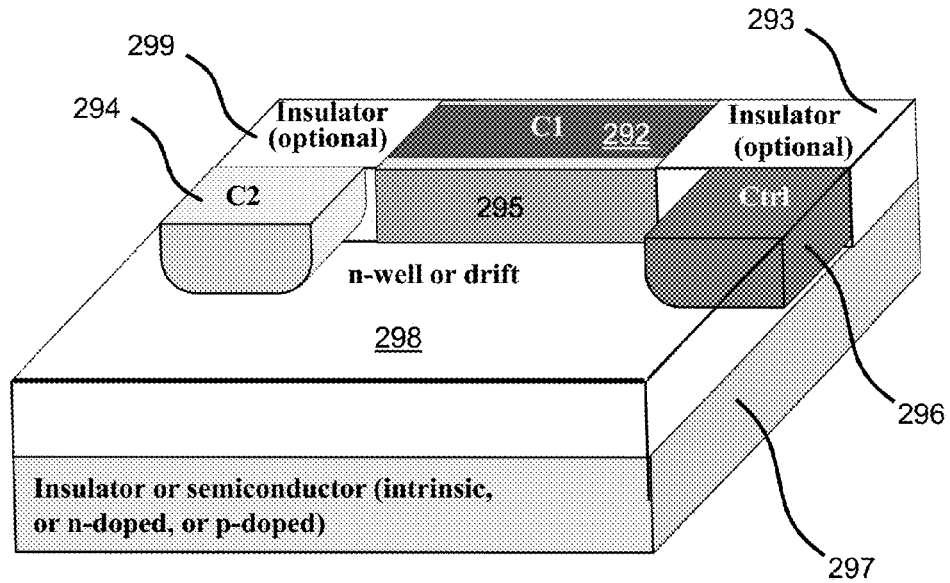
FIG. 37 shows a variant of the embodiment of FIG. 36, where also two optional insulating regions have been added so as to decrease the tuning range of the device and the heavily doped regions have been formed adjacent to the C1 oxide.

In any embodiment herein described involving a trench MOS configuration, each control region can be formed directly in contact with the trench oxide or it can be spaced apart from it. FIG. 37 depicts a variant of the embodiment of FIG. 36 where two insulating regions have been added to the structure so as to maximize the tuning range of the device. This embodiment is particularly favorable to the formation of the highly doped region directly in line with the C1 oxide.

AM FIG. 38

Figure 38:
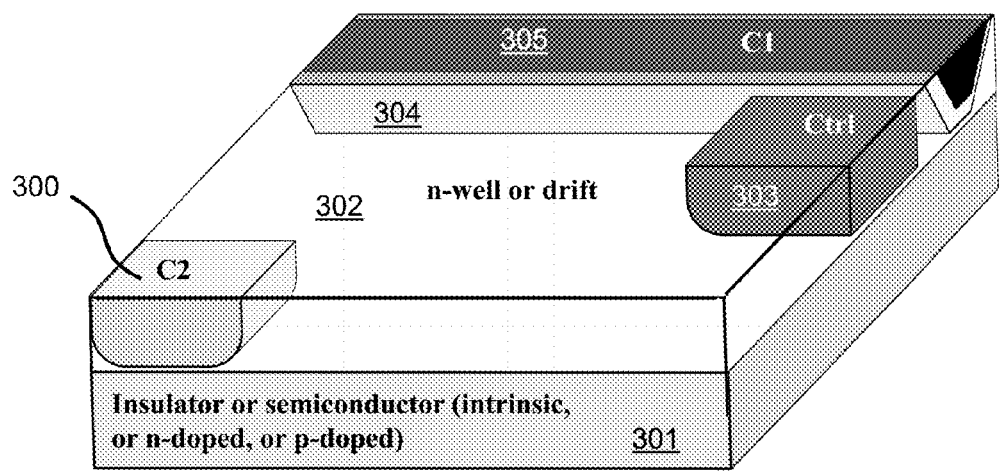
FIG. 38 shows a variant of the embodiment of FIGS. 36 and 37, where the C2 region has been moved away from the C1 oxide.

Another variant based on the trench configurations is shown in FIG. 38. In this embodiment the C2 region has been moved away from the C1 oxide so as to maximize the tuning range.

AN FIG. 39

Figure 39:
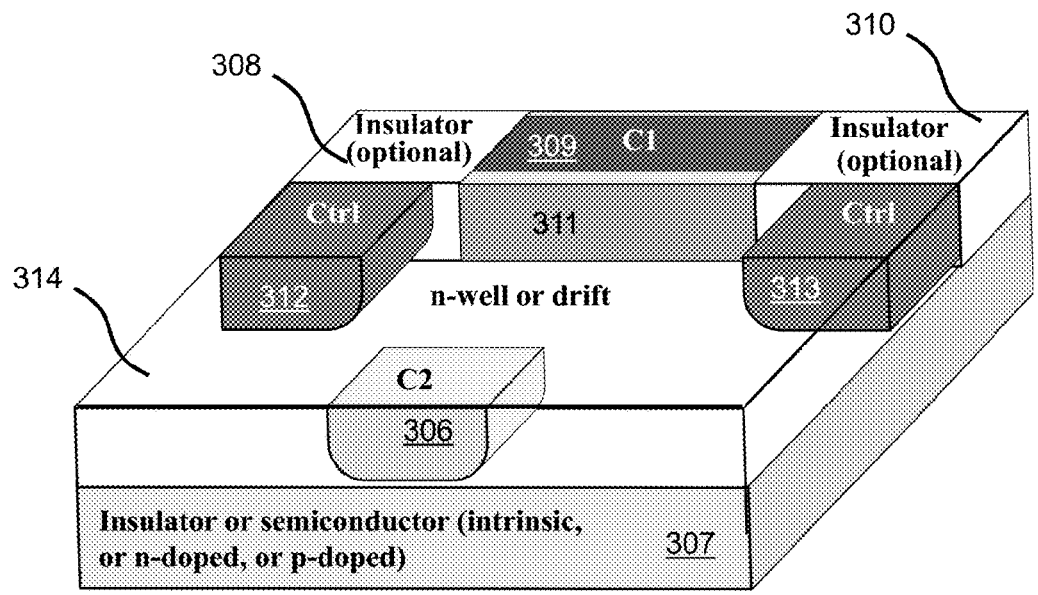
FIG. 39 shows a further embodiment of the present invention, obtained by placing side to side two structures as the one of FIG. 38. In this embodiments also two optional insulating regions have been also added so as to increase the device tuning range.

If desired, two or more isolation regions can also be added to the structure, as shown for example in FIG. 39. Also in the last two embodiments, each control region can be formed directly in contact with the trench oxide or it can be spaced apart from it (if desired, the control regions can also be placed farther from the C1 oxide than with respect to the C2 region).

AO FIG. 40

Figure 40:
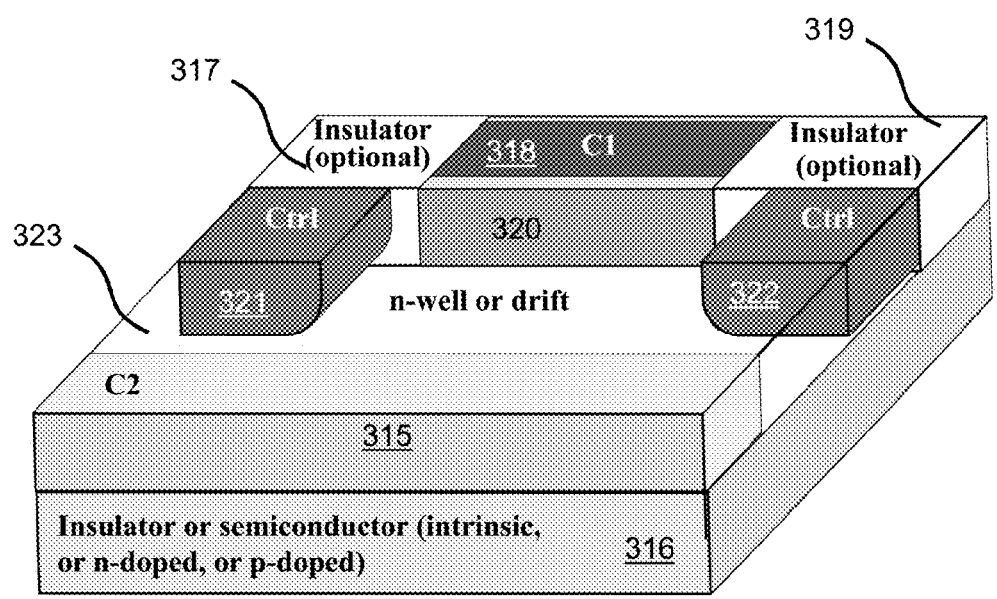
FIG. 40 shows a variant of the embodiment of FIG. 39, where the C2 region has been extended parallel to the C1 oxide.

FIG. 40 shows a variant of the embodiment of FIG. 39, where the C2 region has been extended parallel to the C1 terminal. With reference to the embodiment of FIG. 40 (however, similar considerations hold true also for any embodiment herein described), the n+ and p+ regions may or may not extend down to region 316, depending on the available process and the required performances. In general, the C1 trench can be formed with any shape.

AP FIG. 41

Figure 41:
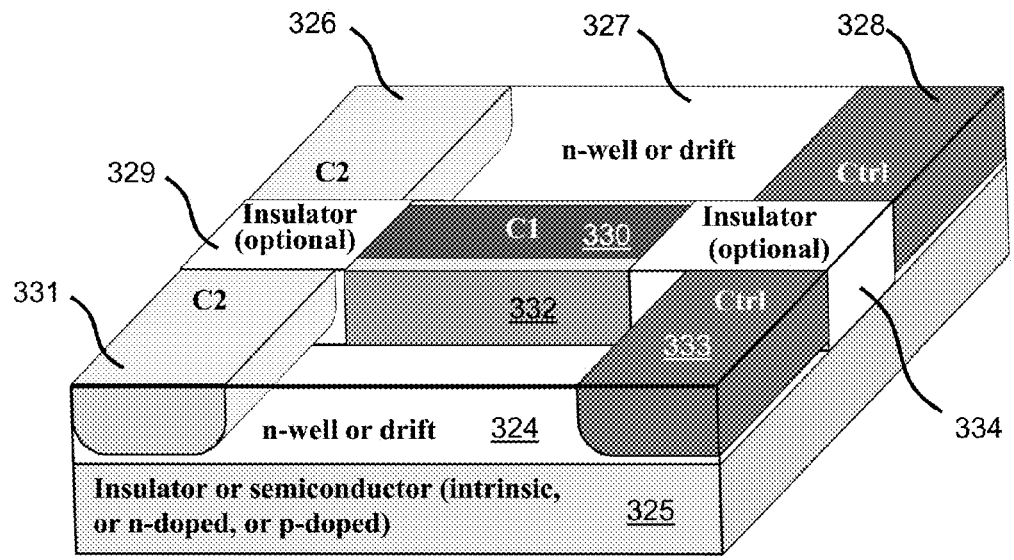
FIG. 41 shows an example of how to combine two transcap structures in a mirrored configuration.

FIG. 41 depicts a further embodiment of the present invention obtained from the one of FIG. 37, by mirroring the structure with respect to the C1 longitudinal axes. As mentioned above, a similar technique can be used to derive new structures from all the embodiments herein discussed by mirroring any of them with respect to any of their sides.

AQ FIG. 42

Figure 42:
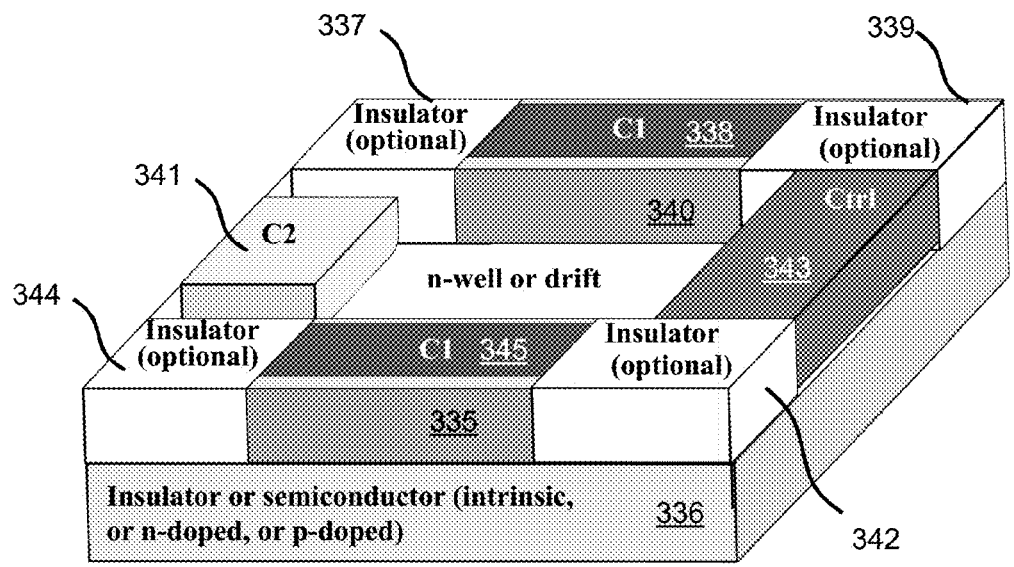
FIG. 42 shows further example of how to combine two transcap structures in a mirrored configuration.

FIG. 42, for example, depicts another embodiment of the present invention obtained from the one of FIG. 37, by mirroring the structure always with respect to the C1 longitudinal axes but on the opposite side with respect to what used for FIG. 41.

Multiple embodiments as the ones discussed above can be connected in parallel so as to increase the total capacitance of the device. The dimensions and the shape of the trenches cross-sections determine the specific capacitance (capacitance per unit area) improvement with respect to the more planar structures. Each semiconductor trench of the device can have three, four, six or more walls (the cross-section of the semiconductor pillars/trenches can have a triangular, trapezoidal, rectangular, square, octagonal, hexagonal, circular, or oval shape).

In all the embodiments discussed above where at least a portion of the current flows along the vertical direction, the final layout of the device can be oriented in order to maximize the carrier mobility in the semiconductor body of the device in the vertical direction. For example if the device is realized in a silicon wafer (100), since from a crystallographic point of view the plans (010) and (001) are equivalent to the (100), the device layout can be rotated by 45° degrees with respect to the primary flat of the wafer so as to maximize the electron mobility along the vertical dimension.

All the embodiments herein described can be realized in III-V technology with minimal modifications. If the utilized manufacturing process does not allow for low defect dielectric/semiconductor interfaces, as it can be the case in some III-V technology, the performance of the transcap device could be affected. In order to overcome this limitation, the insulating layer of the variable capacitor can be replaced with a (n or p doped, or intrinsic) wide bandgap semiconductor layer. In this case, the C1 terminal can be formed directly in contact with the wide bandgap semiconductor layer (so as to form a Schottky or ohmic contact with it) or a narrow bandgap (n or p doped, or intrinsic) region can be inserted between C1 and the wide bandgap semiconductor layer.

Another possibility is to add a dielectric layer between the high bandgap semiconductor layer and the C1 layer, in order to further improve the isolation of the C1 terminal without affecting the device performance. The p+ regions can be formed by growing or depositing directly a p+ doped region/layer (which does not need implantation process steps to be formed) instead of using a p+ implantation process step. Furthermore, the p+ doped region/layer can also be replaced with a metal region/layer so as to form a Schottky contact with the n-doped region, eliminating the need for p-dopants (which are usually more difficult to deal with in a III-V manufacturing process).

The formation of the control or C2 region in the dimension perpendicular to the illustrated cross section (or on any side of the illustrated structures) is a concept that can be utilized for any of the previously described structures in order to increase the control on the device characteristic without degrading the quality factor. Furthermore, extra control regions and/or C2 regions can be formed in the direction perpendicular to the illustrated cross section (or on any side of the illustrated structures) or under the structure (the latter case is a very appealing configuration in the case where the device is realized in a process for discrete devices.) Furthermore, superjunction configurations can be used to increase the control breakdown voltage and/or the device performance.

In all the herein described embodiments, the p+ region can be replaced with a Schottky contact and/or the n+ region can be replaced with a metal ohmic contact. In the case where a Schottky contact is used in combination with a III-V process technology, an extra wide bandgap layer can be interposed between the metal and the n-doped semiconductor in order to reduce the current leakage associated with the Schottky contact. In all the herein described embodiments, p-doped or intrinsic regions can be added to the structure to increase the breakdown voltage of the control terminal and/or decrease the parasitic capacitance associated with the control. Similarly, n-doped or intrinsic regions can be added to increase the device tuning range and/or the device withstanding voltage.

All the described embodiments can be built in many different technologies, comprising: Bulk CMOS, BCD, BiCMOS, Bipolar, Silicon On Insulator (including Ultra-Thin-Body, Fully Depleted, Partially Depleted, High Voltage and any other Semiconductor On Insulator technology), Silicon On Sapphire, thin-film, trench MOS, JFET, FINFET, Multi-gate FET (including Tri-Gate FET and Gate-All-Around technology), vertical MOS, SiC, Ge, SiGe (any other IV-IV compound semiconductor material), III-V technology (e.g. GaN, AlGaN, AN, InN, InGaN, GaAs, AlGaAs, AlAs, and any other polar and non-polar III-V compound semiconductor material including ternary and quaternary alloys) with or without hetero-junctions, II-VI technology (polar and non-polar II-VI compound semiconductor material including ternary and quaternary alloys) with or without hetero-junctions, or discrete device technologies (e.g. the ones used for discrete silicon or SiC MOS discrete power devices or for III-V discrete devices), including both organic and inorganic technologies. Different doping profiles can be utilized in order to improve the device performance. If desired, high-k dielectric materials can be utilized to form the capacitance dielectric so as to increase as much as possible the capacitance density. The C1 region can be formed with metallic or semiconductor (crystalline, poly-crystalline or amorphous) materials.

All the embodiments herein disclosed can be realized as integrated or discrete components with minimal changes. For each one of them, the dual version can be obtained by simply substituting the n-doped regions with p-type ones and vice-versa. If desired, in the dual version the n+ control regions can be replaced with Schottky contacts and/or the p+C2 regions can be replaced with metal ohmic contacts. Many other configurations can be obtained by combining the different embodiments herein discussed and their variants.

Most of the structures herein described can be realized with a standard SOI or bulk CMOS process. The distance between the doping implants and the capacitance electrode C1 can be omitted by auto-aligning the implantations with the MOS structure or can be obtained by adding two spacers to the structure during the fabrication process or by misaligning the n+(or p+) implantation mask with respect to the MOS oxide edge. The latter being the preferred method since it allows the achievement of any desired distance between the highly doped regions and the oxide edge. In some of the embodiments, one or more extra process steps can also be required in order to form the pillars/trenches in the semiconductor substrate (by means of a semiconductor etching or a deposition process steps) and/or to obtain the buried doped regions at the beginning of the manufacturing process.

Many other embodiments can be derived from the ones herein discussed by using one or more of the following principles to control the capacitance value between C1 and C2:

1) Use of a depletion region to modulate the effective area of an equivalent semiconductor capacitance plate (as shown for example in FIG. 1).
2) Use of a depletion region to insert an extra insulating layer (i.e. the depleted region) between C1 and C2. The extra insulating layer can form an extra capacitor (which uses the depletion region as a dielectric) in series to the main MOS capacitor (as for example in FIGS. 4, 28 and 29) or it can increase the thickness of the depletion region between C1 and C2 so as to decrease the minimum capacitance (as it can be the case in FIG. 14, depending from the final layout).
3) Use of a depletion region to control the number of capacitors connected in parallel, as for example in the multi-pillar configuration of FIGS. 32 and 33.
4) A combination of two or more of the previous principles (as it can be the case in FIG. 20, depending from the final layout), or the combination of at least one of the previous principles with at least one of the following two: i) use the modulation of the carrier population at the semiconductor-oxide interface so as to modulate the capacitance between C1 and C2; ii) use the modulation of the depletion region to modulate the capacitance between CTRL and C2.

AR FIG. 43

The parasitic capacitances between the control terminal and the other terminals of the capacitor play a very important role in the overall device performance. In fact, if a DC voltage is applied between the control terminal and the reference terminal C2, the control terminal may be considered AC shorted with the reference terminal. This effect reduces the capacitance seen from C1 to the parallel of the capacitance C1-C2(between the main two terminals) with the parasitic capacitance C1-CTRL (between the control terminal and the non-reference terminal). The net adverse effect may be a significant reduction of the tuning range.

To reduce this effect it may be convenient to connect an impedance (e.g. a resistor and/or an inductor) of proper value in series to the control terminal to AC de-couple the control terminal from the DC voltage source so that the mentioned parasitic capacitance does not end up being AC-coupled in parallel to the main capacitance. However this control technique may cause the voltage of the control terminal to vary with the RF signal and, as a consequence, the capacitance value of the capacitor to be modulated with the signal itself.

If the capacitance value varies with the control voltage in analog fashion, the consequence can be a non-negligible distortion of the signal. In this case the distortion can be however minimized by increasing the oxide thickness, or by increasing the parasitic capacitance (or adding an external capacitance) between the control terminal and the reference terminal, or by using a pre-distortion signal to control the transcap device.

Figure 43:
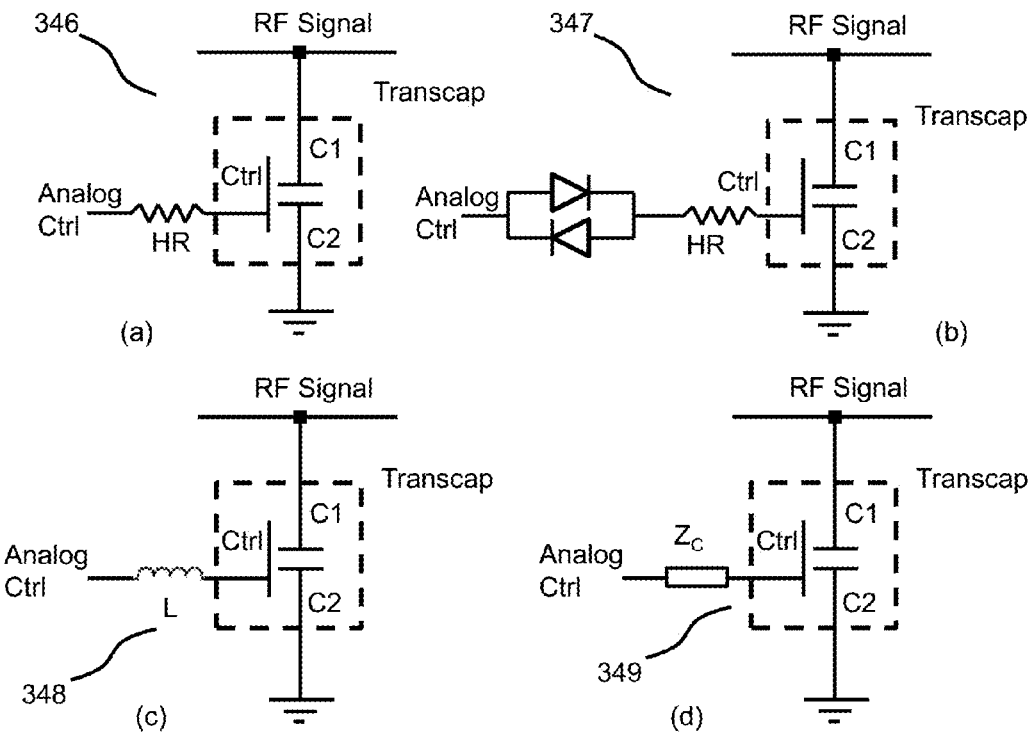
FIG. 43 shows three examples of control configuration for the transcap device.

FIG. 43 illustrates the most conventional control configurations of an analog transcap device. However, many other configurations are possible. As shown in FIG. 43 (*a*), a high value resistor HR can be placed in series to the Ctrl terminal in order to bias the device control terminal without affecting the RF performance of the device.

FIG. 43 (b) shows a possible variant of this configuration, where two anti-parallel diodes have been inserted in series to the high impedance HR in order to increase the AC decoupling between the analog bias and the control terminal of the transcap device. A similar approach can be utilized for all the control configurations herein disclosed. Furthermore, the HR resistor can also be replaced with an inductor as shown in FIG. 43 (c), or with a generic impedance Zc (which can be formed of multiple components connected together, and/or it can include a filter or in general any multiple-port network) as shown in FIG. 43 (d). It is worth mentioning that the generic impedance shown in FIG. 43 (d) can for example be a two-port network which enable a low impedance path for certain frequencies and a high impedance path for other frequencies (e.g., a low impedance path for base band frequencies, and a high impedance path for a fundamental of interest and its higher order harmonics).

AS FIG. 44

As it can be seen, the conventional control configurations have several drawbacks: i) it is preferable to have the C2 terminal of the transcap connected to ground to avoid complicated control configurations, ii) the control voltage is negative (when an n-region is used under the capacitance oxide), iii) the RF signal drops entirely across C1 and C2 limiting the linearity of the system, iv) the RF signal can partially propagate through the control terminal leading to distortion.

Figure 44:
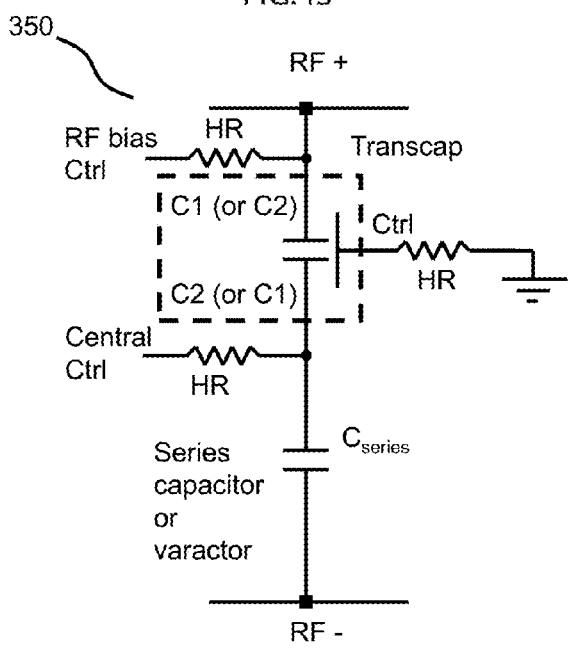
FIG. 44 shows a further example of control configuration for the transcap device.

Some of these problems can be solved by adding a series capacitor Cseries (or a variable capacitor, such as a varactor) between the transcap device and one of the RF terminals. In FIG. 44, is shown an example of implementation of this control configuration. In the illustrated case, the control terminal of the transcap device can be coupled through a high impedance to ground (or to a bias DC source), and the middle node (obtained by coupling the C2 terminal to the series capacitor) can be used to modulate the total capacitance seen by the RF signal, by applying a positive DC bias. This configuration is suitable for both shunt and series tuning capacitor configurations.

It is important to notice that, by utilizing the latter described control configuration, the tuning range of the transcap device can be significantly increased. The DC control voltage not only modulates the depletion region of the pn junction between CTRL and C2, but also the carrier population at the oxide/semiconductor interface under the C1 terminal. A DC voltage is present also across the oxide layer allowing a higher control on the overall capacitance between C1 and C2.

In all the previous configurations the C1 terminal of the transcap device can be also biased through a third high impedance (not shown in FIG. 43, and represented by the RF bias Ctrl pad in FIG. 44) in order to guarantee the correct operation of the structure and/or improve its performance. Indeed, as shown in FIG. 44, since a transcap device is a three-terminal device, it is possible to apply one or more control voltages and/or apply a control voltage between any of the terminals (e.g. between CTRL and C1 and/or C2, or between C1 and C2 and/or CTRL, and between C2 and C1 and/or CTRL). Furthermore, one or more of the illustrated HR resistors can be replaced with a generic impedance $Z_C$ (as in any control configuration described in this document), which can be for example a two-port network which enable a low impedance path for certain frequencies and a high impedance path for other frequencies (e.g., a low impedance path for base band frequencies, and a high impedance path for a fundamental of interest and its higher order harmonics). The performance of the transcap device can be dramatically influenced by the used control configuration.

AT FIG. 45

Figure 45:
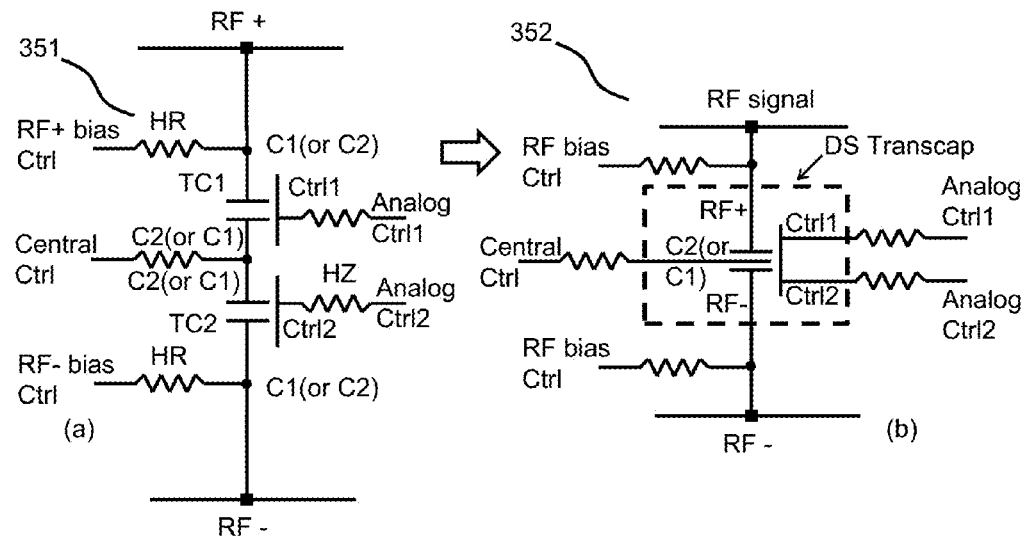
FIG. 45 shows a differential control configuration for the transcap device and the circuital symbol used to identify this particular configuration.

Another interesting approach is shown FIG. 45 (a), where two transcap devices TC1 and TC2 are connected back-to-back and the control terminals Ctrl1 and Ctrl2 are biased through two high impedance paths. The middle node obtained by coupling the two C2 terminals becomes therefore a third control terminal, which can also be used to modulate the capacitance seen by the RF signal. Also in this case, the RF terminals of the transcap device can be biased through high impedances in order to guarantee the correct operation (and/or improve the performance) of the transcap devices. It is worth noticing that, if desired, two transcap devices can also be connected in a series approach where the middle node is the C1 electrode of both capacitors.

In all the embodiments herein described (in any of the control configurations of FIG. 43-45), if multiple control regions are present, each one of them can be controlled with a different control/bias voltage or through the same voltage. They can all be shorted together or each one of them can be biased through a different impedance. The approach used to bias the control terminals significantly influences the transcap performance.

As shown in FIG. 45 (b) the differential series resulting from the connection back-to-back of two transcap devices can be seen as a single device with 5 terminals (RF+, RF−, C2, Ctrl1, Ctrl2), where two of them (RF+ and RF−) are dedicated to the RF signal and three (C2, Ctrl1, and Ctrl2) are used to control the capacitance value seen between RF+ and RF−. However, also in this configuration the two RF terminals can be biased (and/or used as control terminals) so as to improve the device performance. Hereafter, when possible, the symbol shown in FIG. 45 (b) will be utilized to represent the described 5 terminal differential series transcap device (DS Transcap) in order to simplify the circuit schematic.

AU FIG. 46

Figure 46:
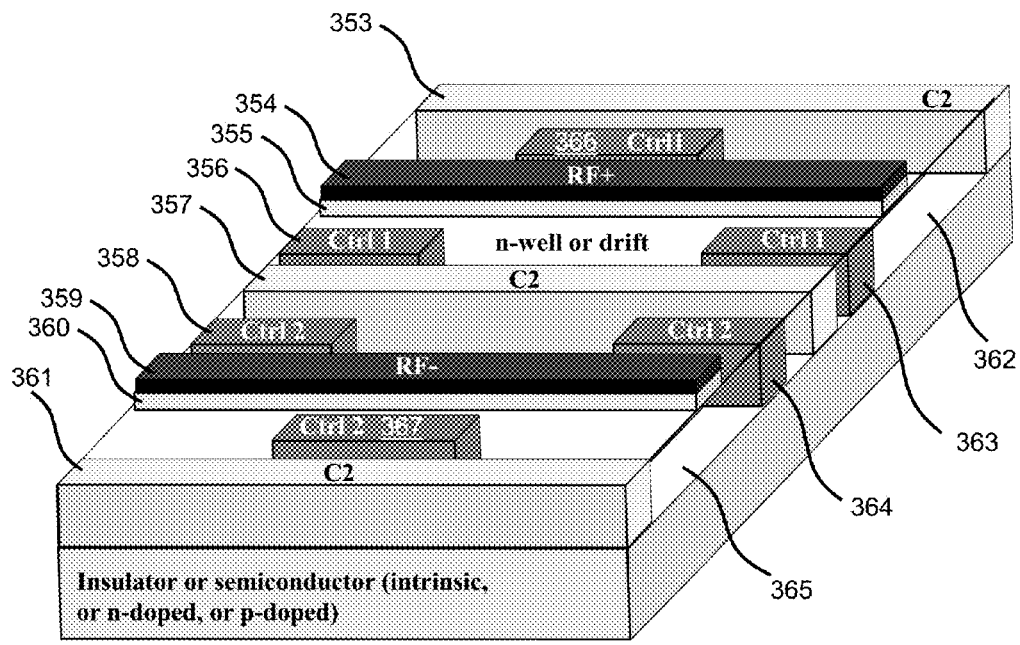
FIG. 46 shows an example of implementation of a 5 terminal differential-series transcap device realized using the device structure of FIG. 25.

All the embodiments discussed above can be connected in differential series configuration so as to form a single device with 5 terminals. For example, FIG. 46 shows an example of implementation of the described series approach obtained by connecting back-to-back in series two transcap structures resembling the ones of FIG. 25 so as to form a 5 terminal device.

AV FIG. 47

Figure 47:
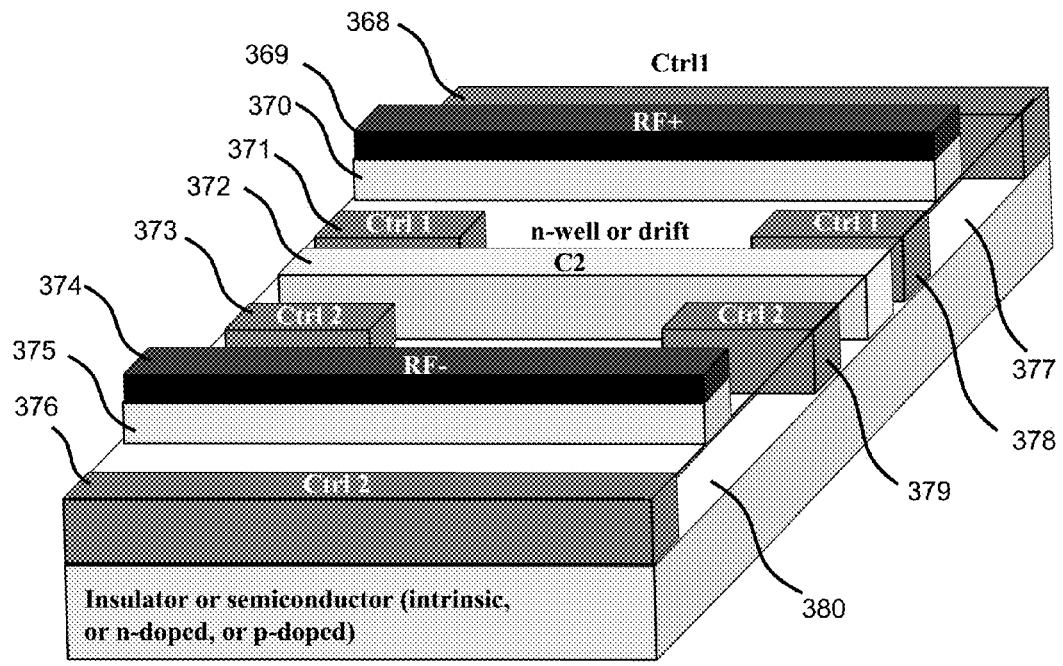
FIG. 47 shows an example of implementation of a 5 terminal differential-series transcap device realized using the device structure of FIG. 18.

FIG. 47 depicts a further example on how to implement the described series approach by connecting back-to-back in series two transcap structures resembling the ones of FIG. 18 so as to form a 5 terminal device.

AW FIG. 48

Figure 48:
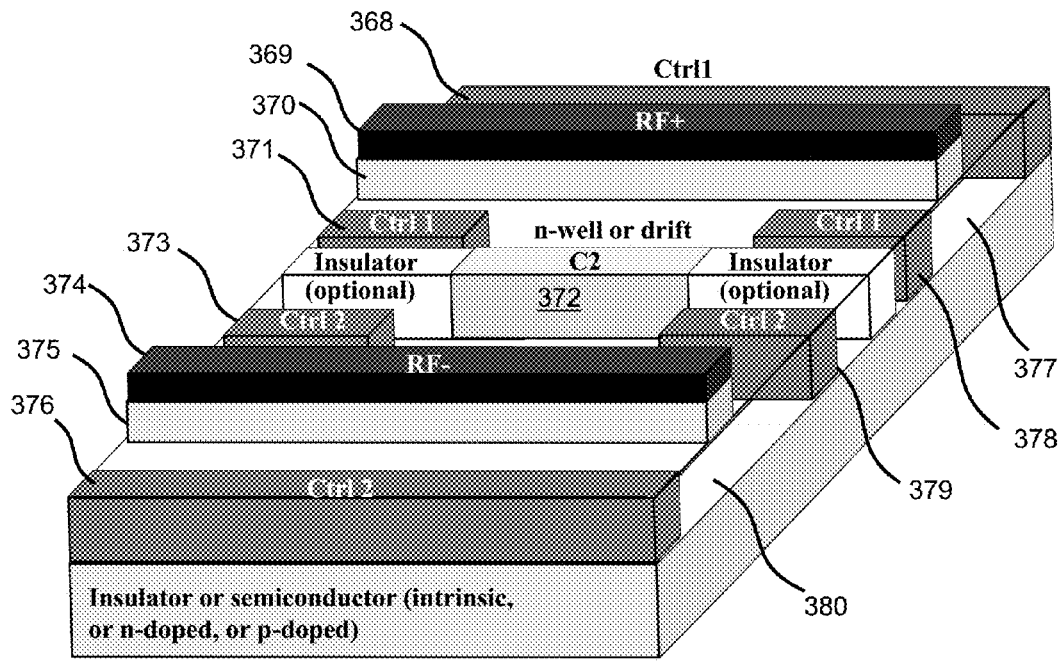
FIG. 48 shows an example of variation of the embodiment of FIG. 47.

FIG. 48 show another example of implementation of the described differential series approach derived from the embodiment of FIG. 47, indicating that many possible configurations can be derived from each structure.

AX FIG. 49

Figure 49:
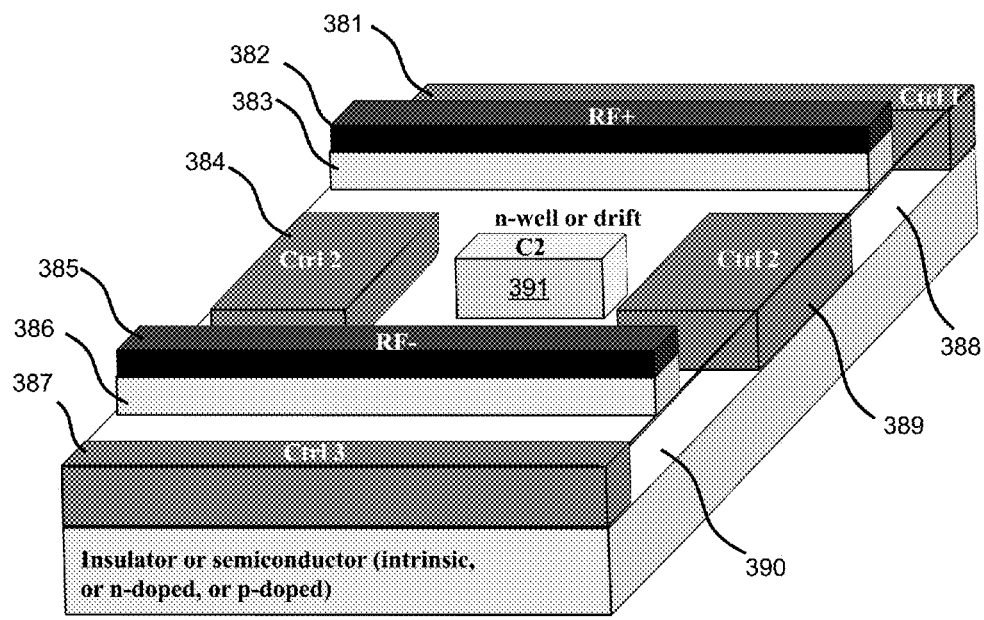
FIG. 49 shows a further example of variation of the embodiment of FIG. 47.

FIG. 49 depicts a variant of the embodiment of FIG. 48, where two control regions of one transcap device have been merged with two control region of the other transcap device.

AY FIG. 50

As discussed above, all the transcap device structures herein described can be realized in many different manufacturing-processes/technologies. FIG. 50-55 depict just few examples of embodiments to show how a DS transcap can be obtained by combining the different approaches previously described with some process technologies.

Figure 50:
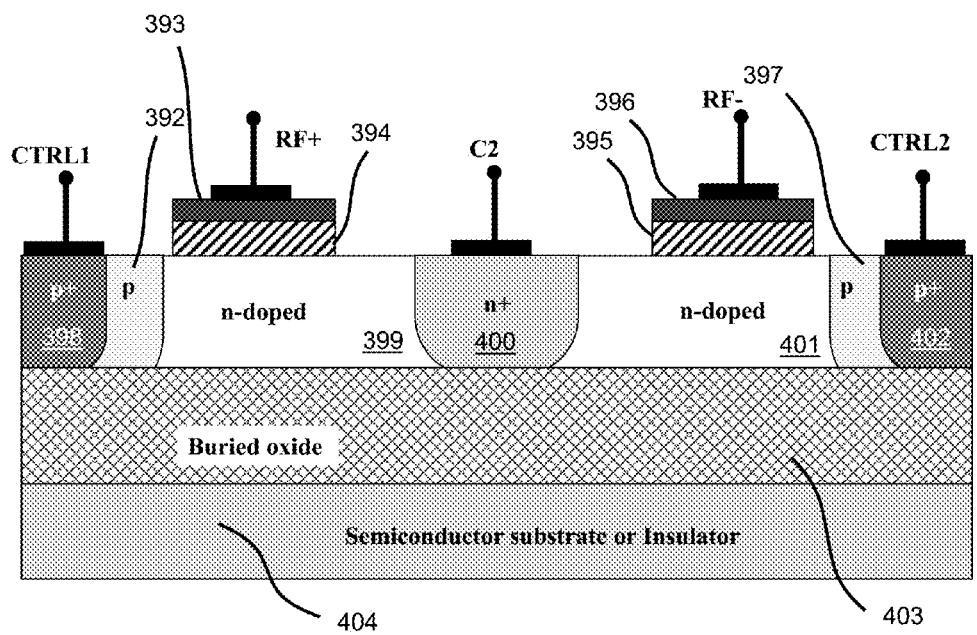
FIG. 50 shows an example of implementation of a 5 terminal differential-series transcap according to the embodiment of FIG. 2, in SOI technology.

In particular, FIG. 50 shows an example of DS Transcap device in SOI process according to a possible implementation of the embodiment of FIG. 2. In this example, the highly doped regions are formed in direct contact with the buried insulator. It is important to notice that depending on the utilized manufacturing process and/or the thickness of the active semiconductor layer, the control and/or C2 regions can be formed in different ways, including sink implantations and other techniques to extend them to the buried oxide if desired.
AZ FIG. 51

Figure 51:
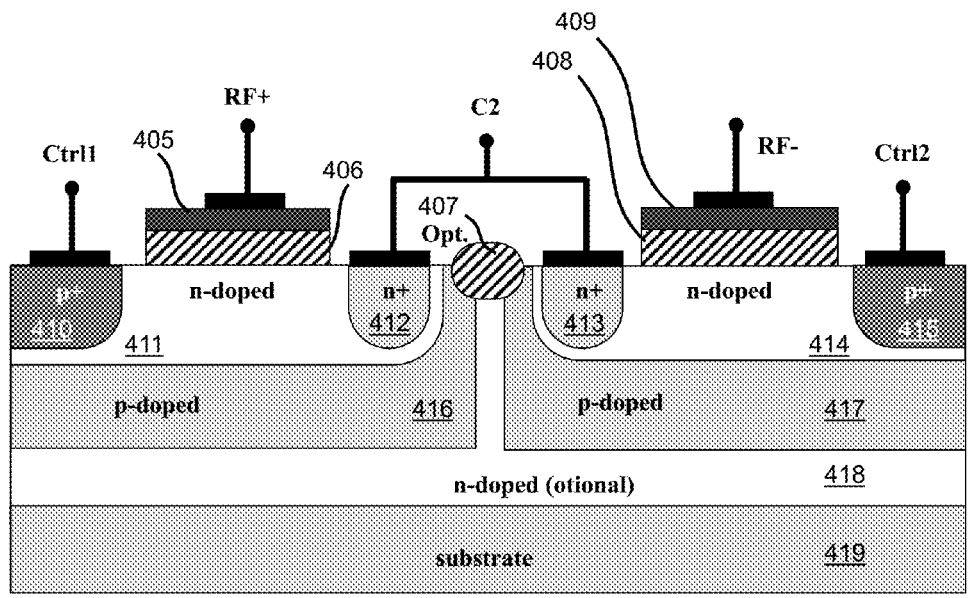
FIG. 51 shows an example of implementation of a 5 terminal differential-series transcap according to the embodiment of FIG. 2, in CMOS/BiCMOS.

FIG. 51 shows an example of DS transcap device realized in CMOS/BiCMOS bulk technology according to a possible implementation of the embodiment of FIG. 2. This embodiments presents a set of optional regions that can be added or omitted from the structure based on the characteristics of the utilized process, the characteristics of the application, and if the transcap device is utilized as a discrete device or if multiple components must be integrated in the same die. Each of these layers/regions can be shorted directly or through a high impedance path (e.g. through a high value resistor) to ground, or to a supply, or to a control voltage, or to a voltage greater or equal to the maximum RF signal value, or lower or equal the minimum RF signal value, or any other semiconductor region or terminal of the device depending from the chosen implementation and the type of substrate (n-doped, p-doped or intrinsic and/or epitaxial). In general, if desired, others n-doped or p-doped or intrinsic layers/regions (including heavily doped buried layers/regions) can be also added to the structures. Any doping profile or concentration can be utilized for the different semiconductor regions/layers composing the device.
BA FIG. 52

Figure 52:
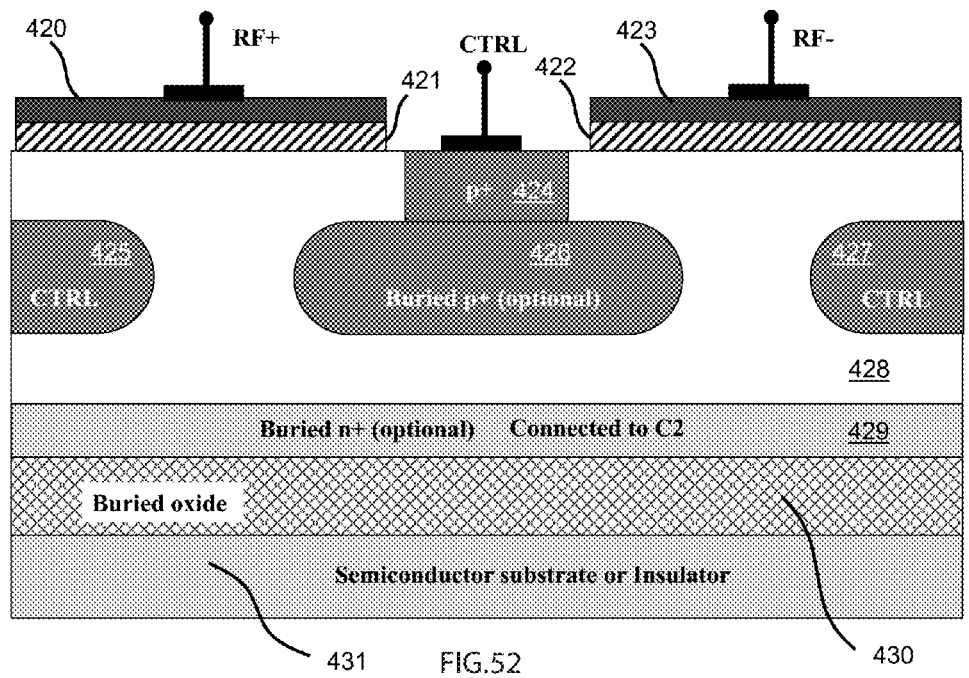
FIG. 52 shows an example of implementation of a 5 terminal differential-series transcap according to the embodiment of FIG. 28, in SOI technology.

FIG. 52 illustrates an example of implementation of a DS transcap device in SOI technology according to a possible implementation of the embodiment of FIG. 28.
BB FIG. 53

Figure 53:
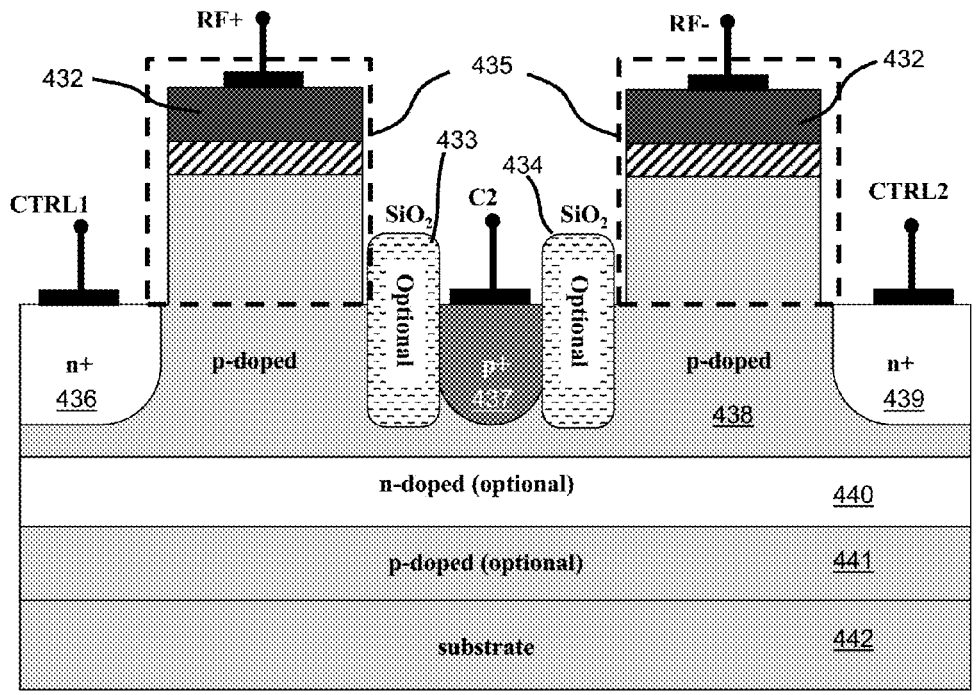
FIG. 53 shows an example of implementation of a 5 terminal differential-series transcap according to the embodiment of FIG. 29, in CMOS/BiCMOS technology.

FIG. 53 illustrates an example of implementation of a DS transcap device in CMOS/BiCMOS bulk technology according to a possible implementation of the embodiment of FIG. 29 (also in this case similar observations to the ones made for the embodiment of FIG. 51 remain valid).
BC FIG. 54

Figure 54:
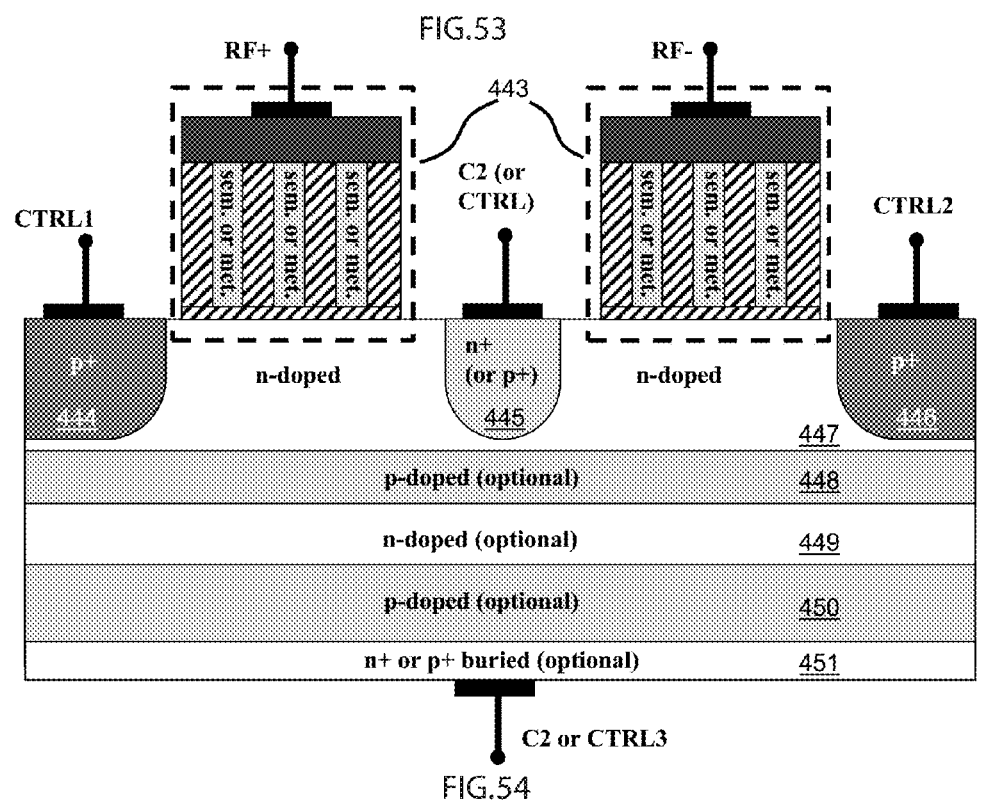
FIG. 54 shows an example of implementation of a 5 terminal differential-series transcap according to the embodiment of FIG. 32 or 33, in discrete process technology.

FIG. 54 illustrates a possible implementation in discrete process technology of the series approach by using the building block of FIG. 32 (also in this case the observations made for the embodiment of FIG. 51 remain valid).
BD FIG. 55

Figure 55:
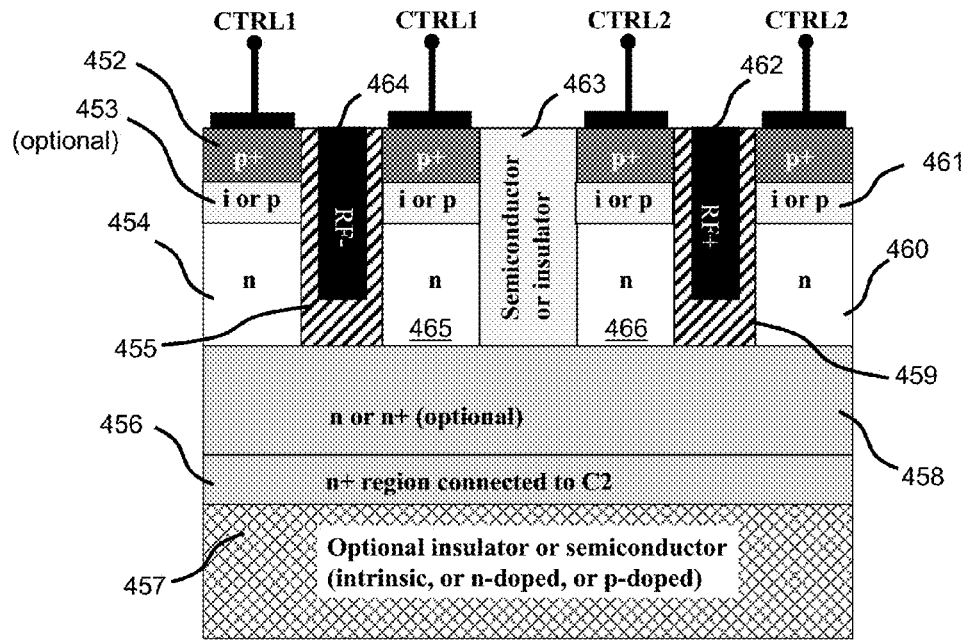
FIG. 55 shows an example of implementation of a 5 terminal differential-series transcap according to the embodiment of FIG. 34.

FIG. 55 illustrates another possible implementation of the series approach by using building blocks resembling the one of FIG. 34 in trench technology.

It is important to notice that the differential-series configuration can be utilized with all the transcap structures herein described and their variants, by connecting two of them back-to-back in series. In general, the ratio of the capacitance values between the two transcap structures composing the differential-series configuration can be made equal to or different from the unity. Furthermore, the differential-series configuration can be obtained also by connecting in series two transcap devices of opposite polarity, i.e. a transcap device and its dual version obtained by reversing all the doping types (p-doped regions are replaced with n-doped ones and vice-versa).

For all the embodiments herein discussed, each semiconductor layer/region can be biased in many different ways in order to guarantee the correct operation of the device. In particular, if n-well, and/or deep n-well, and/or p-well, and/or deep p-well, and/or buried implants are used to isolate the transcap device from other devices, a possible bias configuration is to connect the p-well (and/or deep p-well and/or p+ buried) through an high impedance path (e.g. a high value resistor) to ground and the n-well (and/or deep n-well and/or n+ buried) to the supply voltage, once again through an high impedance path (e.g. a high value resistor). If desired, in order to improve the device isolation, a diode can be placed in parallel to the resistor HRN biasing the n-well (and/or deep n-well and/or n+ buried) or the HRN resistor itself can be replaced with a diode, so as to limit the minimum voltage of the n-well (and/or deep n-well and/or n+ buried) to the supply voltage. Another possibility is to add a diode in parallel to the HRP resistor biasing the p-well (and/or deep p-well and/or p+ buried) instead of adding it in parallel to HRN (or use two diodes, one to bias the n-doped isolation region and one to bias the p-doped isolation region), by connecting the anode of the diode to the p-well (and/or deep p-well and/or p+ buried) and the cathode to ground. An optional capacitor can also be added between the n-well (and/or deep n-well and/or n+ buried) and the p-well (and/or deep p-well and/or p+ buried) if needed, so as to guarantee that the n-well potential follows the potential of the p-well (or vice-versa).
BE FIG. 56

Figure 56:
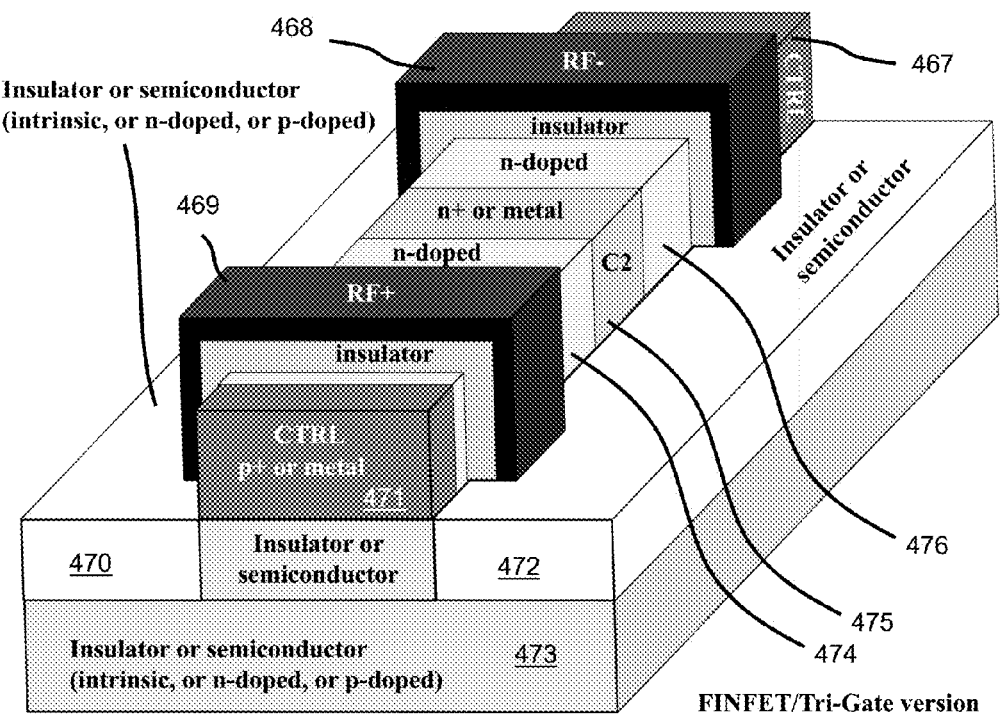
FIG. 56 shows an example of implementation of a 5 terminal differential-series transcap according in FINFET/Tri-Gate technology.

FIG. 56 depicts a tridimensional view of a possible implementation in FINFET/Tri-Gate process technology of the series approach by using two transcap structures resembling the one of FIG. 1. In this embodiment, as in any other embodiment herein described, each one of the heavily doped regions n+ and p+(i.e. regions 475, 467 and 471) can be formed self-aligned with one of the MOS capacitors or it can be spaced apart from its edge. Furthermore, as in any other embodiment herein described, several optional regions may be added. For example, a p-doped (or intrinsic, or near-intrinsic or n-doped) region can be added between each p+ region (467 and 471) and the adjacent n-doped region in order to improve the breakdown voltage of the pn junction (or in general to alter the CV characteristic of the device), decreasing, at the same time, the parasitic capacitance between the C1 and CTRL terminals. All the embodiment herein described can be easily modified to implement the transcap device in any multi-gate configuration, including gate-all-around and double-gate configurations. For example, a possible implementation of the embodiment of FIG. 1 in double-gate technology can be obtained by simply replacing region 7 with a MOS system, i.e. a thin buried oxide with an extra C1 terminal (or RF− terminal, in which case the C1 region 2 can be used as RF+ terminal) under the buried oxide (the added lower C1 region can have an extension greater, smaller or equal with respect to the C1 region 2); a similar techniques can be applied to the embodiment of FIGS. 4 and 6 (or to many other embodiments herein discussed) to obtain an implementation of the transcap device in a multi-gate configuration.

The two optional isolation regions 470 and 472 may or may not be present, or they can be limited so as to isolate only the RF terminals from region 473, when the latter one is made of semiconductor. The tridimensional structure (extending above region 473) where the device is formed can be a semiconductor FIN or it may have any cross-section shape. If desired, the layout of the tridimensional structure extending above region 473 can also be T-shaped or cross-shaped, so as the n+ region 475 forms a T connection or a cross with the n-regions 474 and 476 (in these two cases, the n+ region 475 can be also divided in two regions and/or the two n-regions can be unified in a single region).

BF FIG. 57

Figure 57:
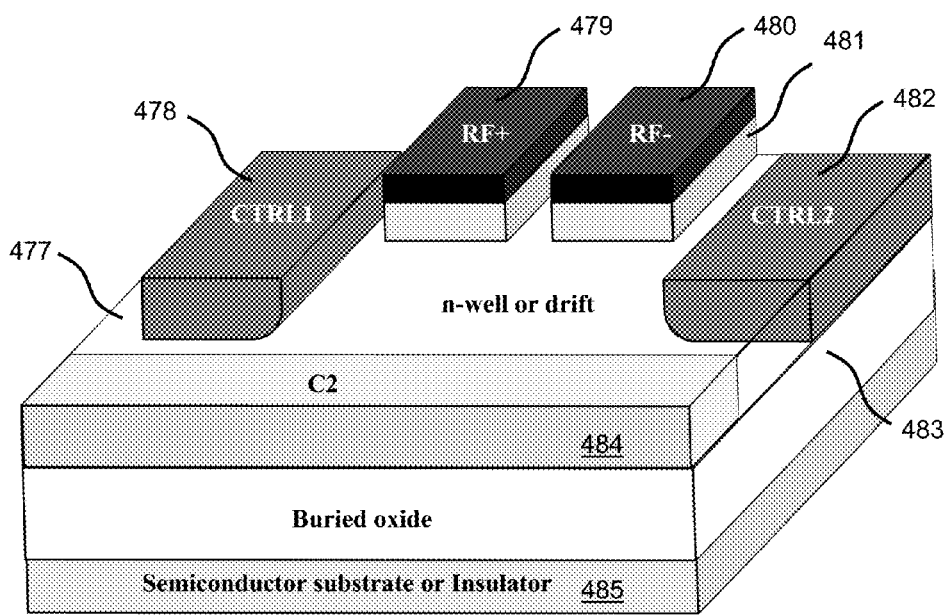
FIG. 57 depicts a possible variant of the embodiment of FIG. 50, obtained by placing the C2 region in the direction perpendicular to the cross section of FIG. 50 instead of being interposed between the two RF terminals.

Independently from the technology or embodiment used to implement the differential transcap device, many possible configurations can be derived from each structure by rearranging the different regions forming the device. For example, FIG. 57 shows a possible variant of the embodiment of FIG. 50, obtained by placing the C2 region in the direction perpendicular to the cross section of FIG. 50 instead of being interposed between the two RF terminals.

BG FIG. 58

Figure 58:
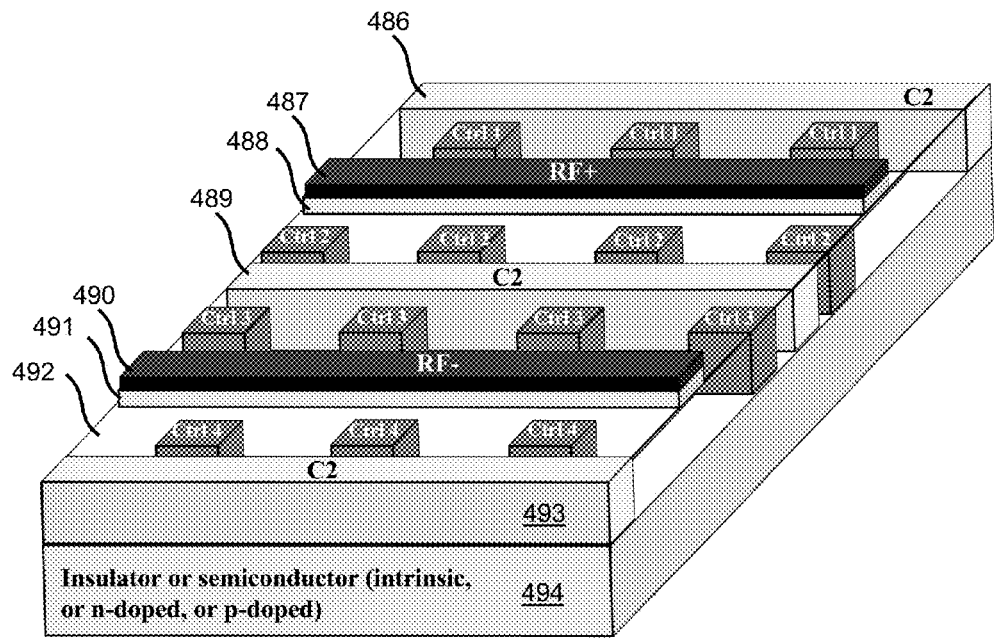
FIG. 58 shows an example of how to connect in parallel multiple structures transcap according to the embodiment of FIG. 46.

Multiple structures as the one discussed above, can be connected in parallel so as to increase the capacitance of the device. An example of structure resulting by connecting in parallel three structures as the one shown in FIG. 46 is reported in FIG. 58.

BH FIG. 59

Figure 59:
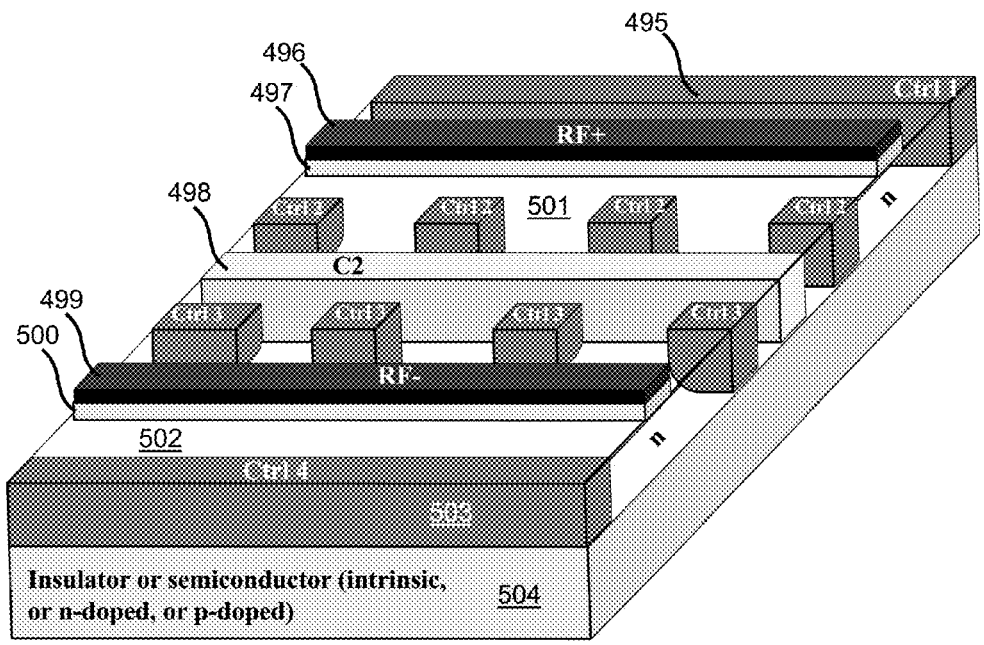
FIG. 59 shows an example of how to connect in parallel multiple structures transcap according to the embodiment of FIG. 47.

A further example of structure resulting by connecting in parallel multiple structures is reported in FIG. 59, where the structure of FIG. 47 has been used as building block.

BI FIG. 60

Figure 60:
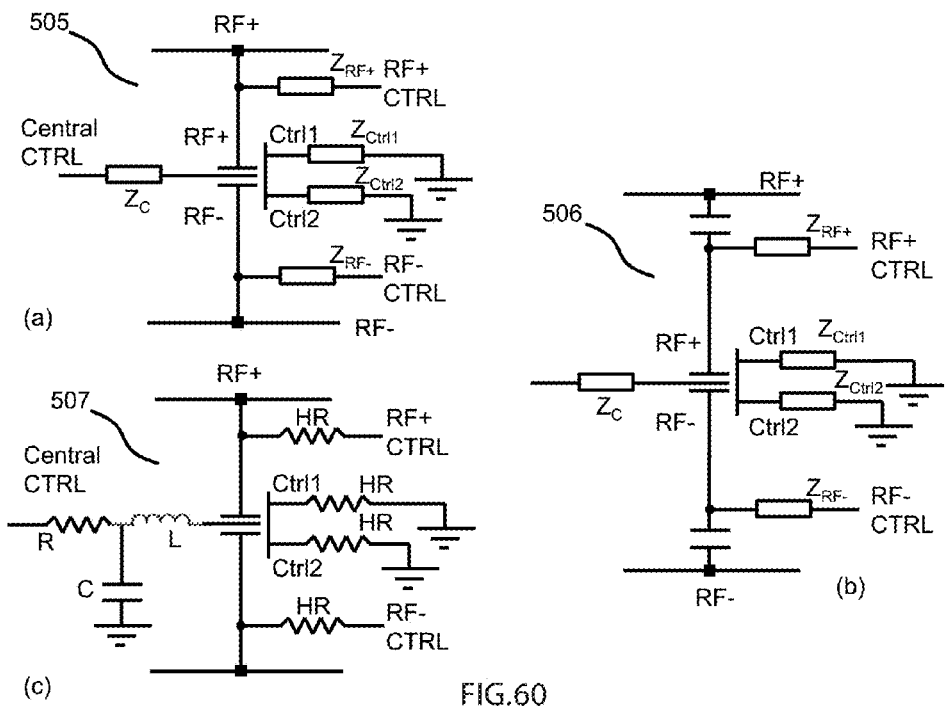
FIG. 60 shows a differential control configuration for the transcap device and the circuital symbol used to identify this particular configuration.

FIG. 60 (a) and FIG. 60 (b) show two possible control configurations that can be used to bias the different terminals of a 5 terminals DS transcap device. As it can be seen, in both configurations, the Ctrl1 and Ctrl2 terminals have been coupled to ground through two impedances $Z_{Ctrl1}$ and $Z_{Ctrl2}$ (e.g. two high value resistors or more complicated networks), and the central control terminal C2 has been used to modulate the device capacitance between RF+ and RF− terminals. In general, the Ctrl1 and Ctrl2 terminals may be coupled through two impedances $Z_{Ctrl1}$ and $Z_{Ctrl2}$ also to one or two control voltages or to one or two voltage sources. Optionally, also the RF terminals can be coupled through two impedances $Z_{RF+}$ and $Z_{RF-}$ (e.g. two high value resistors or more complicated networks) to ground or to a control voltage or to a voltage source so as to optimize the device performance.

If desired, the two control terminals Ctrl1 and Ctrl2 may be also coupled (also directly, i.e. without the impedances $Z_{Ctrl1}$ and $Z_{Ctrl2}$) to the RF+ and RF− terminals, respectively, (when the middle node of the differential series is the C2 electrode of the two transcap devices forming the differential structure) or to the middle node of the DS Transcap (when the middle node of the differential series is the C1 electrode of the two transcap devices forming the differential structure). FIG. 60 (c) shows a possible example of implementation of the control configuration of FIG. 60 (a). For each device terminal, a FET transistor can also be connected in parallel to the impedances used to control the transcap devices in order to speed up the tuning speed of the transcap device (i.e., for example, the FET device is always off except during the transitions of the control voltage). As discussed above, many others configurations can be used to bias the terminals of the device.

Due to the differential nature of a differential-series configuration, the distortion induced by the presence of the parasitic capacitances between the Ctrl1 and Ctrl2 terminals and the RF terminals, is minimized. The RF signal propagates both in the C2 terminal and in the Ctrl1 and Ctrl2 terminals, such as its net effect on "$V_{CTRL}$-$V_{C2}$" is minimized for both transcaps composing the differential-series.

In principle, the Ctrl1 and Ctrl2 terminals can also be shorted together before the high impedance, however this approach can significantly degrade the device tuning range, especially in the case where the capacitance between Ctrl1 and C2 (and/or between Ctrl2 and C2) is comparable to the one between C2 and RF+(and/or between C2 and RF−) as in the case of an SOI process with a thin silicon active layer (in this case, the shortening of the two controls terminals Ctrl1 and Ctrl2 can decrease the tuning range by a factor greater than 2).

BJ FIG. 61

Figure 61:
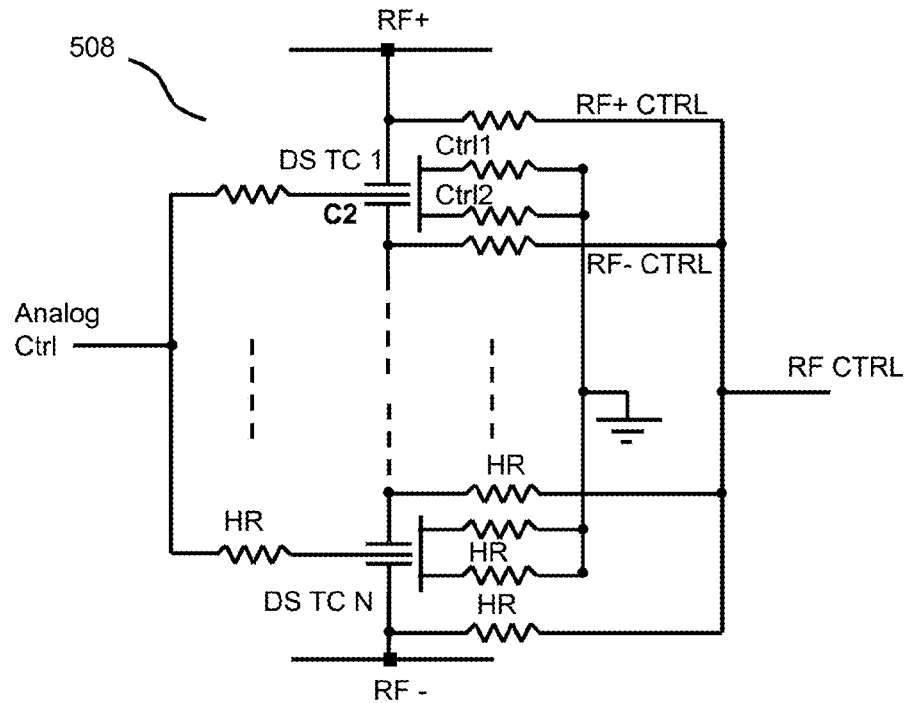
FIG. 61 shows an example of how to connect in series multiple differential-series transcap devices.

As shown in FIG. 61, by using the control configurations of FIG. 60, more structures can be placed in series (by short-circuiting the resistors coupled to the C2 terminals) in order to withstand higher RF voltages. If desired, the RF+CTRL and RF−CTRL terminals (if present) can be all shorted together after the high impedance paths and connected to ground or to a control voltage or to a fixed voltage source (or to a control voltage). If required, equalizing resistors can also be used between the different transcap structures in order to equalize the RF voltage drop on the different structures. Also here, as in any other control configuration herein discussed, one or more of the illustrated HR resistors can be replaced with a generic impedance Zc.

BK FIG. 62

Figure 62:
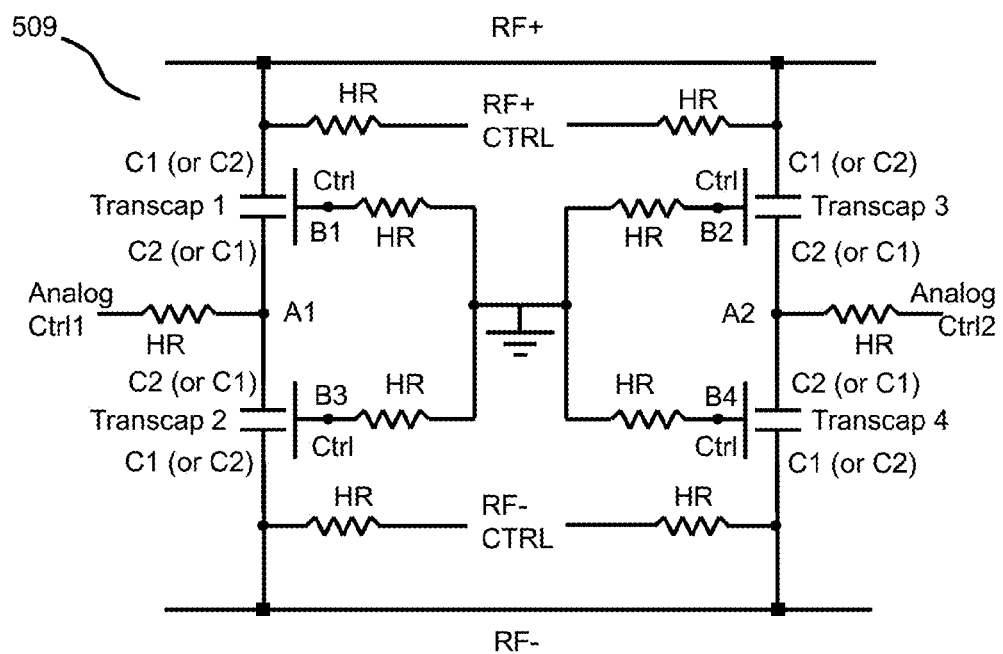
FIG. 62 shows an example of how to connect in parallel multiple differential-series transcap devices.

As shown in FIG. 62, multiple differential-series devices can also be placed in parallel (or anti-parallel). In this case, the dimensions of the 4 transcaps can be optimized in order to optimize the linearity of the system, for example by sizing the $1^{st}$ transcap in order to match the dimensions of the $4^{th}$ one, and by sizing the $2^{nd}$ to match the $3^{rd}$ one so as to obtain an anti-parallel configuration. If desired, the two analog controls can be coupled together in order to simplify the driving circuitry. Furthermore, if desired, it is also possible to connect in parallel two transcap (or DS transcap) devices of opposite polarity, i.e. a transcap (or DS transcap) device and its dual version obtained by reversing all the doping types (p-doped regions are replaced with n-doped ones and vice-versa), or to connect in parallel a differential transcap device with C2 as middle node with a differential transcap device with C1 as middle node. To improve the linearity of the resulting circuit, a capacitors can also be added to couple the two central nodes A1 and A2 (the capacitor is connected on one side to A1 and on the other side to A2) or one or multiple capacitors can be added to couple any combination of the points B1, B2, B3, B4, especially when connecting in parallel a DS transcap and its dual version, or a DS transcap with C2 as middle node with a DS transcap with C1 as middle node.

BL FIG. 63

Figure 63:
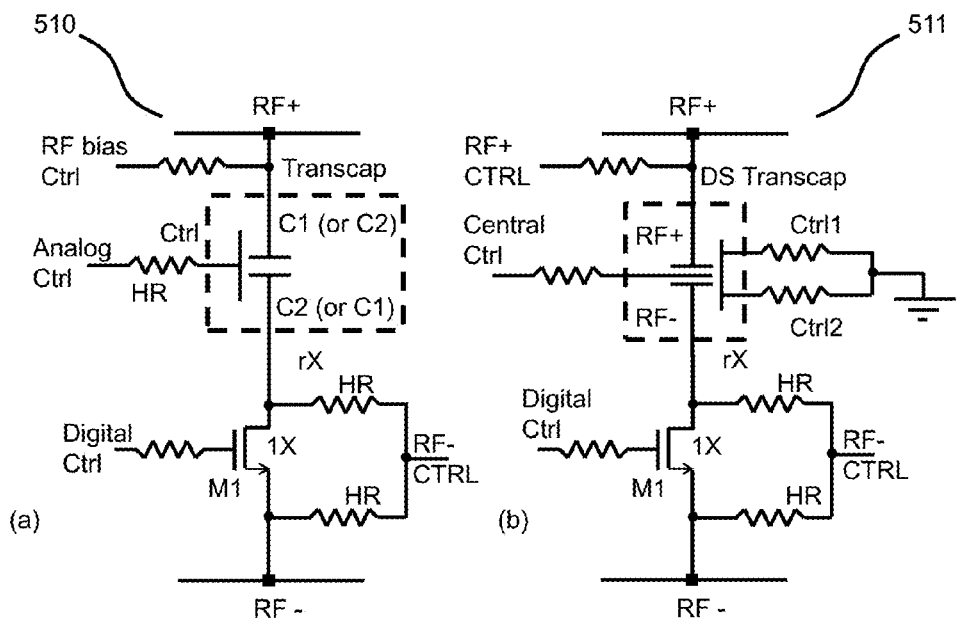
FIG. 63 shows two possible hybrid control configurations for a transcap device and a differential-series transcap device.

FIG. 63 illustrates another interesting control configuration, where a hybrid approach between analog and digital/discrete solution is presented as a switch is placed in series to the described variable capacitor. In this configuration, the size of the transistor M1 must be opportunely chosen in order to maximize the tuning range, maintaining, at the same time, the possibility of choosing, in a continuous fashion, all the possible capacitance values in the selected tuning range.

The modus operandi of this configuration is quite simple. Referring to FIG. 63 (a), the minimum capacitance value (seen from the RF signal) is obtained when the transistor M1 is turned off, and the analog control terminal of the transcap device is biased at high negative voltages so as to minimize the capacitance value between C1 and C2. The maximum capacitance value, instead, is obtained when M1 is turned-on and the analog control voltage is set to zero. The intermediate capacitance values can be obtained by turning-on or off M1, and by varying the analog control voltage fed to the analog control terminal. Similar considerations hold true also for the configuration of FIG. 63 (b), where a DS transcap has been placed in series to a MOS device.

The transistor M1 can be any kind of bulk or SOI transistor (enhancement or depletion mode), including MOSFETs, JFETs, Multi-gate FETs (including FINFETs, Tri-Gate FETs and Gate-All-Around FETs), vertical MOSs, Hetereostructure FETs, BJTs, or Tunnel FETs. Furthermore, the transistor M1 may be replaced with a multiplicity of transistors (connected in series or in parallel to each other). In this case, by properly choosing the ratio between the different components of the network, it is possible to increase the tuning range of the network. Obviously, also multiple transcap and/or DS transcap devices can be connected in series between them and in series with one or multiple transistors. If desired, M1 may also be replaced with a p-channel transistor. The control terminals connected to the source and drain of M1 are optional: they can be shorted together through two impedances as shown for example in FIG. 63, or they may be separately biased, or one of them can be omitted (the latter being of particular interest in the case where M1 is a depletion mode device).

BM FIG. 64

Figure 64:
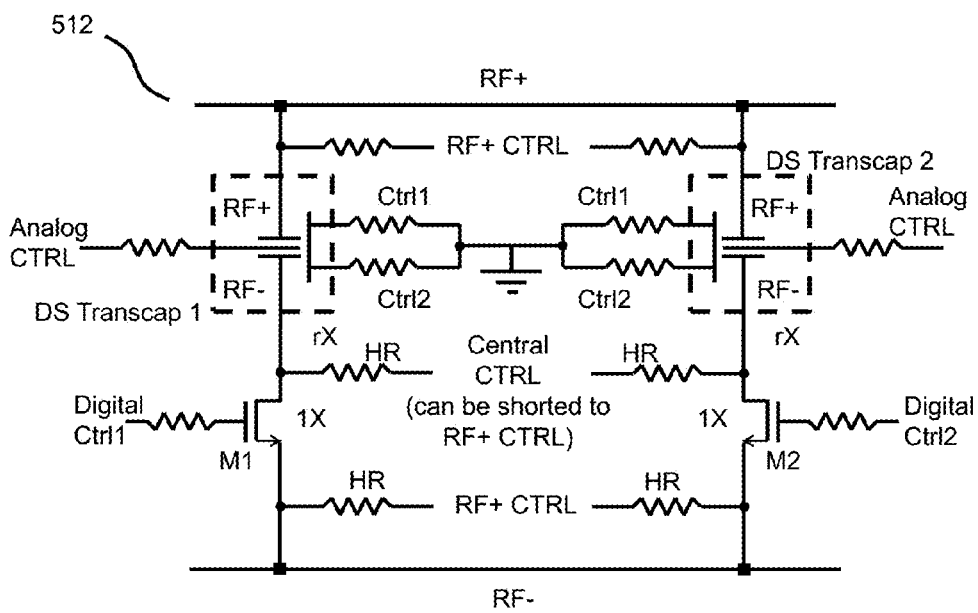
FIG. 64 shows the parallel of two hybrid controlled DS transcap devices.

FIG. 64 illustrates another interesting configuration, where two of the previous networks have been connected in parallel. In this configuration, the devices belonging to the second branch of the parallel (DS transcap 2 and M2) must be opportunely sized in order to increase as much as possible the capacitance tuning range, maintaining at the same time the possibility of choosing in analog fashion all the possible capacitance values in the selected tuning range.

The operation of this configuration is similar to the one of the network shown in FIG. 63. The minimum capacitance value (seen from the RF signal) is obtained when both transistors M1 and M2 are turned off, and the analog control terminals of the two DS transcap devices (which are short-circuited through two high impedances in order to simplify the overall control circuitry) are biased at high positive voltages so as to minimize the capacitance values of DS Transcap 1 and DS Transcap 2. The maximum capacitance value, instead, is obtained when both transistor M1 and M2 are turned-on and the analog control voltage is set to zero. The intermediate capacitance values can be obtained tuning-on only M1, only M2, both or none of them, and varying the analog control voltage.

If the dimensions of the two transistors M1 and M2 and the size of DS Transcap 1 and DS Transcap 2 are opportunely chosen, for example such as M2 and DS Transcap 2 are both r times bigger than M1 and DS Transcap 1, respectively, all the intermediate capacitance values can be chosen in an analog fashion way.

It is important to notice that, if desired, the two analog controls (and, in general each control terminal) of the two transcap devices can be separated and driven independently. Furthermore, more capacitive branches can be coupled in parallel using a similar configuration. In FIG. 62-64, the body of the transistor M1 (and/or M2) if present, can be connected directly or through a high impedance path to a control voltage or to ground (if M1 and/or M2 are n-channel transistors), or to a supply voltage (if a p-channel transistor, instead of a n-channel one, is used in series to the transcap device). In FIGS. 63 and 64, each transistor terminal can be coupled directly or through a high impedance path to ground, to a supply voltage or to a control voltage depending to the final application.

In all the configurations described above, the capacitance between the control terminal of each transcap device and the C2 terminal can be increased in order to improve the linearity of the overall network. Alternatively, external or integrated capacitors can also be added in order to increase the C2-CTRL capacitances. In particular with the differential series approach, external or integrated capacitors can be added between the two control terminals or between each control terminal and the central node of the series, in order to improve the linearity of the system. Furthermore, all these configurations are suitable for both shunt and series tuning capacitor configurations, with minimal modifications (if any).

Linearity (and minimization of distortion) is an important parameter for variable capacitors in certain applications. Depending on the frequency of operation of the specific application and on the tuning bandwidth of the component (which in its turn depends on the type of impedance utilized to drive the control terminals) it may be possible to counter the non-linearity of the variable capacitor by applying an appropriate signal, derived from a pre-distortion circuit, to the control terminals of the transcap, so that depending on the signal applied to the main terminals of the capacitor the distortion is minimized by using one or more control voltages which are also signal dependent.

Although the present invention has been described above with particularity, this was merely to teach one of ordinary skill in the art how to make and use the invention. Many additional modifications will fall within the scope of the invention. Thus, the scope of the invention is defined by the claims which immediately follow.

What is claimed is:

1. A semiconductor variable capacitor comprising:
   a first equivalent capacitance plate;
   a second equivalent capacitance plate;
   at least one control region;
   wherein a capacitance value between said first and said second equivalent capacitance plate of said semiconductor variable capacitor is varied by varying a control voltage;
   wherein said control region is formed in physical contact with a semiconductor region;
   wherein said control region forms a rectifying junction with said semiconductor region, and
   wherein the variation of said control voltage causes a variation of a voltage drop across said rectifying junction.

2. The semiconductor variable capacitor of claim 1, further comprising:
   a highly conductive region directly coupled to said semiconductor region;
   a barrier region covering at least a portion of a surface of said semiconductor region;
   wherein said semiconductor region form said first equivalent capacitance plate of said semiconductor variable capacitor;
   wherein said second equivalent capacitance plate covers at least a portion of a surface of said barrier region;
   wherein said barrier region is made of a material belonging to the group comprising dielectric and semiconductor materials, and
   wherein said barrier region is located between said highly conductive region and said control region.

3. The semiconductor variable capacitor of claim 1, further comprising:
   a highly conductive region directly coupled to said semiconductor region;
   a barrier region covering at least a portion of a surface of said semiconductor region;
   wherein said semiconductor region form said first equivalent capacitance plate of said semiconductor variable capacitor;
   wherein said second equivalent capacitance plate covers at least a portion of a surface of said barrier region;
   wherein said barrier region is made of a material belonging to the group comprising dielectric and semiconductor materials, and wherein said control region is located between said highly conductive region and said barrier region.

4. The semiconductor variable capacitor of claim 1, wherein said control region is a first control region, further comprising:
   a highly conductive region directly coupled to said semiconductor region;
   a barrier region covering at least a portion of a surface of said semiconductor region;
   a second control region;
      wherein said semiconductor region form said first equivalent capacitance plate of said semiconductor variable capacitor;
      wherein said second equivalent capacitance plate covers at least a portion of a surface of said barrier region;
      wherein said barrier region is made of a material belonging to the group comprising dielectric and semiconductor materials, and
      wherein said barrier region is located between said first control region and said second control region.

5. The semiconductor variable capacitor of claim 1, wherein said control region is a first control region, further comprising:
   a highly conductive region directly coupled to said semiconductor region;
   a barrier region covering at least a portion of a surface of said semiconductor region;
   a second control region;
      wherein said semiconductor region form said first equivalent capacitance plate of said semiconductor variable capacitor;
      wherein said second equivalent capacitance plate covers at least a portion of a surface of said barrier region;
      wherein said barrier region is made of a material belonging to the group comprising dielectric and semiconductor materials, and
      wherein said first and second control regions are located between said barrier region and said highly conductive region.

6. The semiconductor variable capacitor of claim 1, wherein said control region is a first control region, further comprising:
   a highly conductive region directly coupled to said semiconductor region;
   a barrier region covering at least a portion of a surface of said semiconductor region;
   a second and a third control region;
      wherein said semiconductor region form said first equivalent capacitance plate of said semiconductor variable capacitor;
      wherein said second equivalent capacitance plate covers at least a portion of a surface of said barrier region;
      wherein said barrier region is made of a material belonging to the group comprising dielectric and semiconductor materials;
      wherein said first and second control regions are located between said highly conductive region and said barrier region;
      wherein said barrier region is located between said highly conductive region and said third control region, and
      wherein said first and second control regions are located so as, when said control voltage overcomes a threshold voltage value, said highly conductive region is electrically isolated from a portion of said semiconductor region in physical contact with said barrier region.

7. The semiconductor variable capacitor of claim 1, further comprising:
   a highly conductive region directly coupled to said semiconductor region;
   a barrier region covering at least a portion of a surface of said semiconductor region;
      wherein said semiconductor region form said first equivalent capacitance plate of said semiconductor variable capacitor;
      wherein said second equivalent capacitance plate covers at least a portion of a surface of said barrier region;
      wherein said barrier region is made of a material belonging to the group comprising dielectric and semiconductor materials, and
      wherein said control region surrounds, at least partially, said barrier region.

8. The semiconductor variable capacitor of claim 1, further comprising:
   a highly conductive region directly coupled to said semiconductor region;
   a barrier region covering at least a portion of a surface of said semiconductor region;
      wherein said semiconductor region form said first equivalent capacitance plate of said semiconductor variable capacitor;
      wherein said second equivalent capacitance plate covers at least a portion of a surface of said barrier region;
      wherein said barrier region is made of a material belonging to the group comprising dielectric and semiconductor materials, and
      wherein said control region and said highly conductive region are located laterally and on the same side with respect to said barrier region.

9. The semiconductor variable capacitor of claim 1, further comprising:
   a highly conductive region directly coupled to said semiconductor region;
   a barrier region covering at least a portion of a surface of said semiconductor region;
      wherein said semiconductor region form said first equivalent capacitance plate of said semiconductor variable capacitor;
      wherein said second equivalent capacitance plate covers at least a portion of a surface of said barrier region;
      wherein said barrier region is made of a material belonging to the group comprising dielectric and semiconductor materials, and
      wherein said surface of said semiconductor region covered by said barrier region is located above said control region.

10. A semiconductor variable capacitor comprising at least a first semiconductor variable capacitor according to claim 1 and a second semiconductor variable capacitor according to claim 1,
   wherein said second semiconductor variable capacitor is formed symmetrically with respect to said first semiconductor variable capacitor, by mirroring said first semiconductor variable capacitor, and
   wherein said first semiconductor variable capacitor is coupled to said second semiconductor variable capacitor.

11. The semiconductor variable capacitor of claim 1, further comprising:
   a highly conductive region directly coupled to said semiconductor region;
   a barrier region covering at least a portion of a surface of said semiconductor region;

wherein said control region, said barrier region and said highly conductive region are located so as the capacitance value between said first and second equivalent capacitance plate of said semiconductor variable capacitor can be varied by using at least one technique belonging to the group consisting of:
- modulating a depletion of at least a portion of said semiconductor region so as to modify the effective area of at least one between said first and second equivalent capacitance plate;
- modulating a depletion of at least a first portion of said semiconductor region so as, when said control voltage overcomes a threshold voltage value, said highly conductive region is electrically isolated from a second portion of said semiconductor region in physical contact with said barrier region, and
- modulating a depletion of at least a portion of said semiconductor region to control the coupling of one or more capacitor elements with at least one of said first and second equivalent capacitance plate.

12. The semiconductor variable capacitor of claim 1, further comprising:
a highly conductive region directly coupled to said semiconductor region;
a barrier region covering at least a portion of a surface of said semiconductor region;
wherein said control region, said barrier region and said highly conductive region are located so as the capacitance value between said first and second capacitance plates of said semiconductor variable capacitor can be varied by using at least two techniques belonging to the group consisting of:
- modulating a depletion of at least a portion of said semiconductor region so as to modify the effective area of at least one between said first and second equivalent capacitance plate;
- modulating a depletion of at least a first portion of said semiconductor region so as, when said control voltage overcomes a threshold voltage value, said highly conductive region is electrically isolated from a second portion of said semiconductor region in physical contact with said barrier region, and
- modulating a depletion of at least a portion of said semiconductor region to control the coupling of one or more capacitor elements with at least one of said first and second equivalent capacitance plate;
- modulating a carrier population at an interface between said barrier region and at least one of said first and second equivalent capacitance plate, and
- modulating a depletion of at least a portion of said semiconductor region so as to vary a junction capacitance value between said control region and at least one of said first and second equivalent capacitance plate.

13. A circuit comprising a semiconductor variable capacitor according to claim 1, wherein said control voltage of said semiconductor variable capacitor is used to vary an impedance value in said circuit.

14. A plurality of semiconductor variable capacitors according to claim 1, wherein said semiconductor variable capacitors are coupled together and stacked to form a high capacitance value variable capacitor.

15. The semiconductor variable capacitor of claim 1, further comprising a barrier region covering at least a portion of a surface of said semiconductor region;
wherein said semiconductor region form said first equivalent capacitance plate of said semiconductor variable capacitor;
wherein said second equivalent capacitance plate covers at least a portion of a surface of said barrier region, and
wherein at least a portion of said semiconductor region is formed in a semiconductor fin extending above a primary planar surface of a substrate layer.

16. A method to vary a capacitance value between a first equivalent capacitance plate and a second equivalent capacitance plate of a semiconductor variable capacitor, the method comprising:
applying a control voltage between said first equivalent capacitance plate and at least one between a control region and said second equivalent capacitance plate;
wherein said control region is formed in physical contact with a semiconductor region;
wherein the capacitance value between said first and said second equivalent capacitance plates of said semiconductor variable capacitor is varied by varying said control voltage;
wherein said control region forms a rectifying junction with said semiconductor region, and
wherein the variation of said control voltage causes a variation of a voltage drop across said rectifying junction.

17. The method of claim 16,
wherein said semiconductor variable capacitor is comprising at least a barrier region formed at least partially between said first and said second equivalent capacitance plate,
wherein said barrier region is made of a material belonging to the group comprising dielectric and semiconductor materials, and
wherein the capacitance value between said first and said second equivalent capacitance plate is varied by depleting or enhancing at least a portion of said semiconductor region, so as to modulate the effective area of said first equivalent capacitance plate.

18. The method of claim 16,
wherein said semiconductor variable capacitor further comprises:
at least a barrier region formed at least partially between said first and said second equivalent capacitance plate, and
a highly conductive region directly coupled to said semiconductor region;
wherein, when said control voltage overcomes a threshold voltage value, the depletion of a first portion of said semiconductor region electrically isolates said highly conductive region from a second portion of said semiconductor region in physical contact with said barrier region.

19. The method of claim 16, wherein said semiconductor variable capacitor comprises a multiplicity of capacitor elements, and wherein the modulation of a depletion of at least a portion of said semiconductor region modulates the coupling of at least one of said capacitor elements with at least one of said first and second equivalent capacitance plates.

20. The method of claim 16,
wherein said semiconductor variable capacitor further comprises:
a highly conductive region directly coupled to said semiconductor region;
a barrier region covering at least a portion of a surface of said semiconductor region;

wherein said capacitance value is varied by using a technique belonging to the group comprising:

modulating a depletion of at least a portion of said semiconductor region so as to modify an effective area of at least one between said first and second equivalent capacitance plate;

modulating a depletion of at least a first portion of said semiconductor region so as, when said control voltage overcomes a threshold voltage value, said highly conductive region is electrically isolated from a second portion of said semiconductor region in physical contact with said barrier region, and modulating a depletion of at least a portion of said semiconductor region to control the coupling of one or more capacitor elements with at least one of said first and second equivalent capacitance plate.

21. The method of claim 16, wherein said semiconductor variable capacitor further comprises:

a highly conductive region directly coupled to said semiconductor region;

a barrier region covering at least a portion of a surface of said semiconductor region;

wherein said capacitance value is varied by using a combination of at least two techniques belonging to the group comprising:

modulating a depletion of at least a portion of said semiconductor region so as to modify the effective area of at least one between said first and second equivalent capacitance plate;

modulating a depletion of at least a first portion of said semiconductor region so as, when said control voltage overcomes a threshold voltage value, said highly conductive region is electrically isolated from a second portion of said semiconductor region in physical contact with said barrier region, and modulating a depletion of at least said first portion of said semiconductor region to control the coupling of one or more capacitor elements with at least one of said first and second equivalent capacitance plate;

modulating a carrier population at an interface between said barrier region and at least one of said first and second equivalent capacitance plate, and modulating a depletion region of at least a portion of said semiconductor region so as to vary a junction capacitance value between said control region and at least one of said first and second equivalent capacitance plate.

22. The method of claim 16, wherein said control voltage is comprising a signal generated by a pre-distortion circuit in order to optimize the linearity of said semiconductor variable capacitor.

23. A method to vary the capacitance between a first equivalent capacitance plate and a second equivalent capacitance plate of a semiconductor variable capacitor, the method comprising:

applying a first control voltage between a first control region and one between said first and second equivalent capacitance plate;

applying a second control voltage between a second control region and one between said first and second equivalent capacitance plate;

wherein said first and second control regions are formed in physical contact with a semiconductor region;

wherein the capacitance value between said first and said second equivalent capacitance plate of said semiconductor variable capacitor is varied by varying at least one of said first and second control voltage;

wherein each of said first and said second control regions forms a rectifying junction with said semiconductor region, and whereby the use of said first and said second control voltage optimizes the electrical parameters belonging to the group consisting of quality factor, linearity, tuning range, control voltage range, tuning speed of said semiconductor variable capacitor.

* * * * *